(12) United States Patent
Yoshida et al.

(10) Patent No.: US 10,792,712 B2
(45) Date of Patent: Oct. 6, 2020

(54) SUBSTRATE PROCESSING METHOD AND SUBSTRATE PROCESSING APPARATUS

(71) Applicants: SCREEN Holdings Co., Ltd., Kyoto (JP); Merck Patent GmbH, Darmstadt (DE)

(72) Inventors: Yukifumi Yoshida, Kyoto (JP); Manabu Okutani, Kyoto (JP); Shuichi Yasuda, Kyoto (JP); Yasunori Kanematsu, Kyoto (JP); Dai Ueda, Kyoto (JP); Song Zhang, Kyoto (JP); Tatsuro Nagahara, Kakegawa (JP); Takafumi Kinuta, Kakegawa (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 16/426,115

(22) Filed: May 30, 2019

(65) Prior Publication Data
US 2019/0366394 A1 Dec. 5, 2019

(30) Foreign Application Priority Data

May 31, 2018 (JP) .................................. 2018-105630
Dec. 14, 2018 (JP) .................................. 2018-234734

(51) Int. Cl.
*B08B 7/00* (2006.01)
*B08B 3/04* (2006.01)
(Continued)

(52) U.S. Cl.
CPC ............ *B08B 7/0014* (2013.01); *B08B 3/041* (2013.01); *B08B 3/08* (2013.01); *B08B 3/10* (2013.01);
(Continued)

(58) Field of Classification Search
CPC combination set(s) only.
See application file for complete search history.

(56) References Cited

U.S. PATENT DOCUMENTS

| 2003/0000547 A1* | 1/2003 | Carpenter | B08B 7/0014 |
| | | | 134/1.3 |
| 2012/0052601 A1* | 3/2012 | Chumakov | G01N 1/04 |
| | | | 438/14 |

(Continued)

FOREIGN PATENT DOCUMENTS

| JP | 2014-107313 A | 6/2014 |
| JP | 2014-123704 A | 7/2014 |

(Continued)

OTHER PUBLICATIONS

Extended European Search Report dated Oct. 23, 2019 in connection with corresponding European Patent Application No. 19176191.5.

*Primary Examiner* — Erin F Bergner
(74) *Attorney, Agent, or Firm* — Ostrolenk Faber LLP

(57) ABSTRACT

A substrate processing method includes a processing liquid supplying step of supplying a processing liquid having a solute and a solvent to a front surface of a substrate, a processing film forming step of forming on the front surface of the substrate a processing film which holds a removal object present on the front surface of the substrate by solidifying or curing the processing liquid supplied to the front surface of the substrate, and a peeling step of peeling the processing film from the front surface of the substrate together with the removal object by supplying a peeling liquid to the front surface of the substrate, and the peeling step includes a penetrating hole forming step of forming a penetrating hole on the processing film by dissolving partially the processing film in the peeling liquid.

17 Claims, 17 Drawing Sheets

(51) Int. Cl.
*B08B 3/08* (2006.01)
*B08B 3/10* (2006.01)
*C11D 3/20* (2006.01)
*C11D 3/37* (2006.01)

(52) U.S. Cl.
CPC .......... *C11D 3/2058* (2013.01); *C11D 3/3703* (2013.01)

(56) References Cited

U.S. PATENT DOCUMENTS

| | | | |
|---|---|---|---|
| 2014/0041685 A1 | 2/2014 | Kaneko et al. | 134/4 |
| 2014/0144464 A1 | 5/2014 | Kaneko et al. | 134/4 |
| 2014/0144465 A1 | 5/2014 | Kaneko et al. | 134/4 |
| 2015/0064910 A1 | 3/2015 | Kaneko et al. | 438/694 |
| 2015/0064911 A1 | 3/2015 | Kaneko et al. | 438/694 |
| 2015/0128994 A1 | 5/2015 | Kaneko et al. | |
| 2015/0128995 A1 | 5/2015 | Kaneko et al. | |
| 2016/0035561 A1 | 2/2016 | Aibara et al. | |
| 2016/0035564 A1 | 2/2016 | Aibara et al. | |
| 2017/0095842 A1 | 4/2017 | Tanaka | |

FOREIGN PATENT DOCUMENTS

| | | |
|---|---|---|
| JP | 2014-140085 A | 7/2014 |
| JP | 2015-046442 A | 3/2015 |
| JP | 2015-046449 A | 3/2015 |
| JP | 2015-062259 A | 4/2015 |
| JP | 2015-065396 A | 4/2015 |
| JP | 2015-095583 A | 5/2015 |
| JP | 2015-149410 A | 8/2015 |
| JP | 2016-034006 A | 3/2016 |

\* cited by examiner

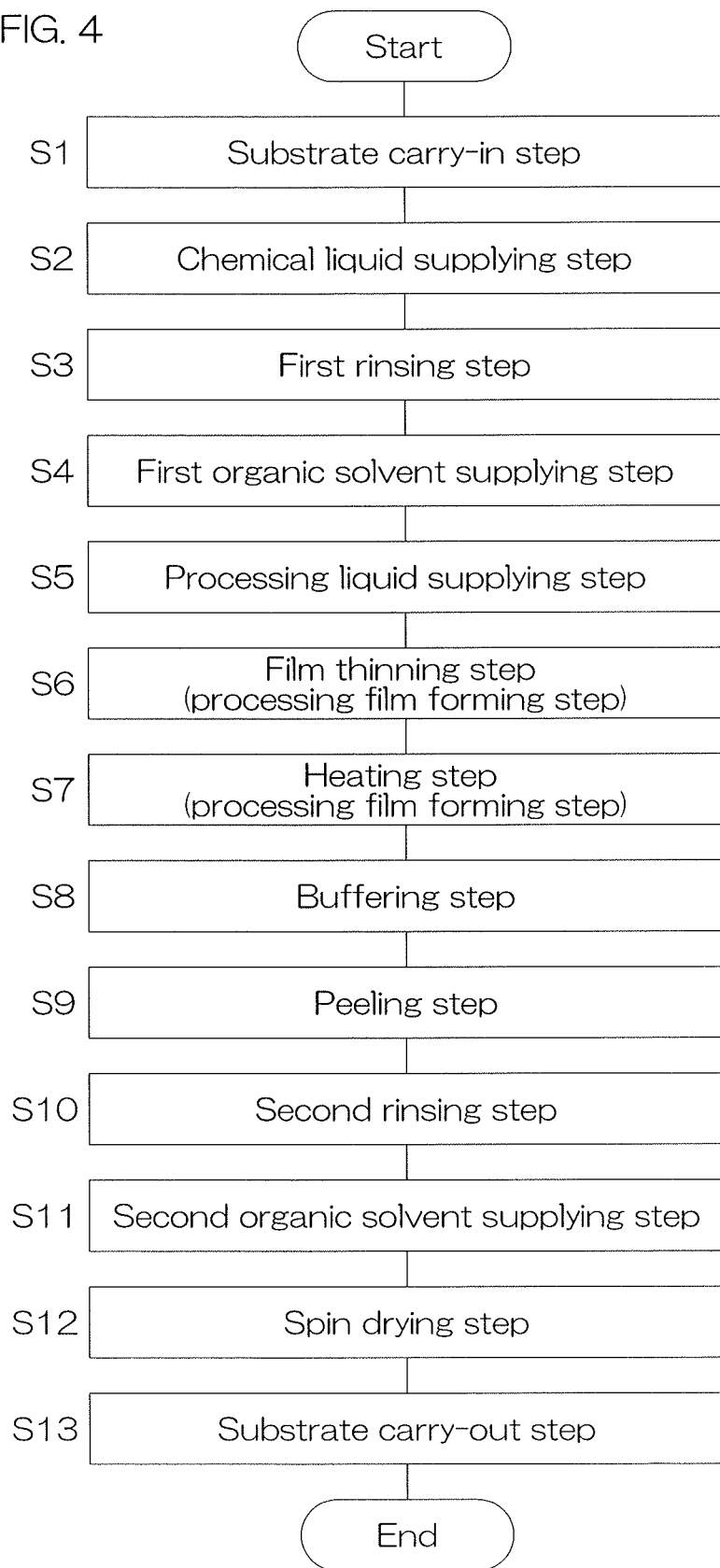

SUBSTRATE PROCESSING METHOD AND SUBSTRATE PROCESSING APPARATUS

CROSS REFERENCE TO RELATED APPLICATIONS

The present application claims priority based on Japanese Patent Application No. 2018-105630 filed on May 31, 2018 and Japanese Patent Application No. 2018-234734 filed on Dec. 14, 2018, and the entire contents of which are incorporated herein by reference.

BACKGROUND OF THE INVENTION

1. Field of the Invention

The present application relates to a substrate processing method and a substrate processing apparatus for processing substrates. Examples of substrates to be processed include substrates, such as semiconductor wafers, substrates for liquid crystal display devices, substrates for FPDs (flat panel displays) such as organic EL (electroluminescence) display devices, etc., substrates for optical disks, substrates for magnetic disks, substrates for magneto-optical disks, substrates for photomasks, ceramic substrates, substrates for solar cells, etc.

2. Description of the Related Art

In a manufacturing process of semiconductor devices, a cleaning step is executed in order to remove various types of contaminants attached on a substrate, a residue of a processing liquid or a resist, etc., used in a prior step and various particles, etc., (they may be hereinafter referred to collectively as "removal object").

In the cleaning step, in general, a cleaning liquid such as deionized water (DIW), etc., is supplied to a substrate, thereby removing a removal object by physical actions of the cleaning liquid, or a chemical liquid which chemically reacts with the removal object is supplied to a substrate, thereby chemically removing the removal object.

However, with progress being made in making a pattern with projections and recesses formed on a substrate finer and more complex, it is not easy to remove a removal object by using a cleaning liquid or a chemical liquid, while damage to the pattern with projections and recesses is suppressed.

Thus, a method has been proposed where a processing liquid, containing a solute and a solvent having volatility, is supplied to an upper surface of a substrate, the processing liquid is solidified or cured to form a processing film and, thereafter, the processing film is dissolved and removed (refer to United States Patent Application Publication No. 2014/041685 and United States Patent Application Publication No. 2015/128994).

With the method described above, when the processing liquid is solidified or cured to form a processing film, a removal object is pulled away from a substrate. Then, the removal object which has been pulled away therefrom is held in the processing film.

Next, a dissolution processing liquid is supplied to the upper surface of the substrate. Thereby, since the processing film is dissolved on the substrate and removed, the removal object is removed from the upper surface of the substrate, together with a dissolved matter of the processing film (refer to United States Patent Application Publication No. 2014/041685).

Alternatively, there is also a case in which a peeling processing liquid is supplied to an upper surface of a substrate. Thereby, the processing film is peeled from the upper surface of the substrate. Then, the dissolution processing liquid is supplied, by which the processing film is dissolved on the substrate (refer to United States Patent Application Publication No. 2015/128994).

SUMMARY OF THE INVENTION

However, both with the method disclosed in United States Patent Application Publication No. 2014/041685 and the method disclosed in United States Patent Application Publication No. 2015/128994, a processing film is dissolved on a substrate and, therefore, a removal object may fall off from the processing film on the substrate and the thus fallen removal object may be reattached to the substrate. Thus, there is a risk that the removal object may not be efficiently removed from the substrate.

Thus, an object of the present invention is to provide a substrate processing method and a substrate processing apparatus by which a removal object present on a front surface of a substrate can be efficiently removed.

A preferred embodiment of the present invention provides a substrate processing method including a processing liquid supplying step of supplying a processing liquid which has a solute and a solvent to a front surface of a substrate, a processing film forming step of solidifying or curing the processing liquid supplied to the front surface of the substrate to form on the front surface of the substrate, a processing film which holds a removal object present on the front surface of the substrate, and a peeling step of supplying a peeling liquid to the front surface of the substrate to peel the processing film from the front surface of the substrate together with the removal object, in which the peeling step includes a penetrating hole forming step of dissolving partially the processing film in the peeling liquid to form a penetrating hole on the processing film.

With the present method, the processing liquid supplied to the front surface of the substrate is solidified or cured to form a processing film which holds a removal object. Thereafter, the peeling liquid is supplied to the front surface of the substrate to partially dissolve the processing film, thereby forming a penetrating hole on the processing film. The penetrating hole is formed on the processing film, so that the peeling liquid can easily reach the vicinity of the front surface of the substrate. Therefore, the peeling liquid can be made to act on an interface between the processing film and the substrate, thus making it possible to efficiently peel the processing film from the front surface of the substrate. On the other hand, although the processing film is partially dissolved by the peeling liquid for forming the penetrating hole, a remaining portion thereof is kept in a solid state. As a result, it is possible to efficiently remove the removal object from the front surface of the substrate together with the processing film.

In the preferred embodiment of the present invention, the peeling step includes a peeling liquid entry step of entering the peeling liquid between the processing film and the front surface of the substrate via the penetrating hole. Therefore, the peeling liquid can be made to act on an interface between the processing film and the substrate, thus making it possible to peel more efficiently the processing film from the front surface of the substrate.

In the preferred embodiment of the present invention, the solute of the processing liquid has a first component and a second component which is lower in solubility in the peeling liquid than the first component. Then, the processing film forming step includes a step of forming the processing film which has a first solid formed by the first component and a second solid formed by the second component. Then, the penetrating hole forming step includes a step of forming the penetrating hole on the processing film by dissolving the first solid in the peeling liquid.

With the present method, the first component is higher in solubility in the peeling liquid than the second component. Therefore, the first solid formed by the first component is more easily dissolved in the peeling liquid than the second solid formed by the second component.

Therefore, while the peeling liquid is used to dissolve the first solid thus making it possible to reliably form the penetrating hole, the second solid can be maintained in a solid state without dissolving the second solid in the peeling liquid. Therefore, in a state where the removal object is held by the second solid, the peeling liquid can be made to act on an interface between the second solid and the substrate. As a result, while the processing film from the front surface of the substrate is peeled smoothly, it is possible to efficiently remove the removal object from the front surface of the substrate together with the processing film.

In the preferred embodiment of the present invention, the contained amount of the second component in the processing liquid is larger than the contained amount of the first component in the processing liquid. With the present method, a portion of the processing film which is dissolved by the peeling liquid can be reduced as compared with a configuration in which the contained amount of the second component in the processing liquid is smaller than the contained amount of the first component in the processing liquid. Therefore, it is possible to reduce a removal object detached from the processing film in association with partial dissolution of the processing film. Thus, the removal object can be substantially removed from the front surface of the substrate together with the processing film and, therefore, the removal object can be efficiently eliminated outside the substrate, while reattachment of the removal object to the substrate is suppressed.

In the preferred embodiment of the present invention, the contained amount of the second component in the processing liquid is smaller than the contained amount of the first component in the processing liquid. With the present method, a portion of the processing film which is dissolved by the peeling liquid can be increased as compared with a configuration in which the contained amount of the second component in the processing liquid is larger than the contained amount of the first component in the processing liquid. Therefore, the processing film can be split into relatively small film fragments. The processing film is split into relatively small film fragments, so that the film fragments are likely to be lifted by being subjected to a force resulting from a flow of the peeling liquid and are easily removed outside a substrate by the flow of the peeling liquid. It is, thus, possible to efficiently remove the removal object from the substrate together with the processing film.

In the preferred embodiment of the present invention, the solute also has a third component which is higher in degree of solubility in the peeling liquid than the second component and lower in degree of solubility in the peeling liquid than the first component. Then, the processing film forming step includes a step of forming the processing film which has a third solid formed by the third component at least at a portion adjacent to the front surface of the substrate.

With the present method, the third component is higher in degree of solubility in the peeling liquid than the second component and lower in degree of solubility in the peeling liquid than the first component. Therefore, the third solid formed by the third component is more easily dissolved in the peeling liquid than the second solid formed by the second component and less likely to be dissolved in the peeling liquid than the first solid formed by the first component.

Therefore, the peeling liquid is used to dissolve the first solid, thus making it possible to reliably form a penetrating hole. Then, the peeling liquid, which has entered in the vicinity of the front surface of the substrate via the penetrating hole, can dissolve the third solid positioned at a portion of the processing film adjacent to the front surface of the substrate. The third solid can be more easily dissolved in the peeling liquid than the second solid, so that the processing film is peeled more easily by the peeling liquid than a configuration in which no third solid is present at a portion of the processing film adjacent to the front surface of the substrate.

On the other hand, the second solid can be kept in a solid state in the peeling liquid. Therefore, the peeling liquid can be made to act on an interface between the second solid and the substrate, in a state where a removal object is held by the second solid. As a result, while the processing film from the front surface of the substrate is peeled smoothly, it is possible to efficiently remove the removal object from the front surface of the substrate together with the processing film.

In the preferred embodiment of the present invention, the substrate processing method further includes a preprocessing liquid supplying step of supplying to the front surface of the substrate a preprocessing liquid which contains a solute having a third component higher in degree of solubility in the peeling liquid than the second component and lower in degree of solubility in the peeling liquid than the first component before supply of the processing liquid to the front surface of the substrate. Then, the processing film forming step includes a step of forming the processing film which has a third solid formed by the third component at least at a portion adjacent to the front surface of the substrate.

With the present method, the preprocessing liquid is supplied to the front surface of the substrate before supply of the processing liquid. In a state that the preprocessing liquid is present on the front surface of the substrate, the processing liquid is supplied to the front surface of the substrate. Therefore, the preprocessing liquid is mixed with the processing liquid on the substrate to form a processing film which has the first solid, the second solid and the third solid. In this case, since the preprocessing liquid is present earlier on the substrate, the third solid is likely to be formed in the vicinity of the front surface of the substrate. It is, therefore, possible to easily form a processing film which has the third solid at least at a portion adjacent to the front surface of the substrate.

Further, the third component is higher in degree of solubility in the peeling liquid than the second component and lower in degree of solubility in the peeling liquid than the first component. Therefore, the third solid formed by the third component is more easily dissolved by the peeling liquid than the second solid formed by the second component and less likely to be dissolved in the peeling liquid than the first solid formed by the first component.

Therefore, the peeling liquid is used to dissolve the first solid, thus making it possible to reliably form a penetrating hole. Then, it is possible to dissolve the third solid positioned at a portion of the processing film adjacent to the front surface of the substrate by the peeling liquid which has entered in the vicinity of the front surface of the substrate via the penetrating hole. The third solid is more easily dissolved in the peeling liquid than the second solid, so that the processing film can be peeled more easily by the peeling liquid than a configuration in which no third solid is present at a portion of the processing film adjacent to the front surface of the substrate.

On the other hand, the second solid can be kept in a solid state in the peeling liquid. Therefore, the peeling liquid can be made to act on an interface between the second solid and the substrate, in a state in which a removal object is held by the second solid. As a result, it is possible to efficiently remove the removal object from the front surface of the substrate together with the processing film, while the processing film is smoothly peeled from the front surface of the substrate.

In the preferred embodiment of the present invention, the substrate processing method further includes a preprocessing liquid supplying step of supplying to the front surface of the substrate a preprocessing liquid which contains a solute having a third component higher in degree of solubility in the peeling liquid than the second component and lower in degree of solubility in the peeling liquid than the first component before supply of the processing liquid to the front surface of the substrate, and a preprocessing film forming step of solidifying or curing the preprocessing liquid before supply of the processing liquid to the front surface of the substrate to form on the front surface of the substrate a preprocessing film which is formed by the third component. Then, the peeling step includes a step of supplying the peeling liquid to the front surface of the substrate to peel the processing film and the preprocessing film from the front surface of the substrate together with the removal object.

With the present method, before supply of the processing liquid, the preprocessing liquid is supplied to the front surface of the substrate and the preprocessing liquid is solidified or cured. Therefore, in a state that the preprocessing film has been formed on the front surface of the substrate, the processing liquid is supplied to the front surface of the substrate to form the processing film. Therefore, it is possible to easily form the preprocessing film formed by the third component at a portion adjacent to the front surface of the substrate.

Further, the third component is higher in degree of solubility in the peeling liquid than the second component and lower in degree of solubility in the peeling liquid than the first component. Therefore, the preprocessing film formed by the third component is more easily dissolved in the peeling liquid than the second solid formed by the second component and less likely to be dissolved in the peeling liquid than the first solid formed by the first component.

Therefore, the peeling liquid is used to dissolve the first solid, thus making it possible to reliably form a penetrating hole. Then, it is possible to dissolve the third solid positioned at a portion of the processing film adjacent to the front surface of the substrate by the peeling liquid which has entered in the vicinity of the front surface of the substrate via the penetrating hole. The third solid is more easily dissolved in the peeling liquid than the second solid, so that the processing film can be more easily peeled by the peeling liquid than a configuration in which no third solid is present at a portion of the processing film adjacent to the front surface of the substrate.

On the other hand, the second solid can be kept in a solid state in the peeling liquid. Therefore, the peeling liquid can be made to act on an interface between the second solid and the substrate, in a state where a removal object is held by the second solid. As a result, it is possible to smoothly peel the processing film from the front surface of the substrate and also efficiently remove the removal object from the front surface of the substrate together with the processing film.

In the preferred embodiment of the present invention, the second component contains at least any one of novolac, polyhydroxystyrene, polystyrene, a polyacrylic acid derivative, a polymaleic acid derivative, polycarbonate, a polyvinyl alcohol derivative, a polmethacrylic acid derivative and a copolymer of a combination thereof.

In the preferred embodiment of the present invention, the first component is a crack promoting component, and the crack promoting component contains hydrocarbon, and a hydroxy group and/or a carbonyl group.

In the preferred embodiment of the present invention, the first component is expressed at least by any one of the following (B-1), (B-2) and (B-3).

(B-1) is a compound which contains 1 to 6 of constituent units expressed by Chemical Formula 1 given below and in which each of the constituent units is bonded by a linking group $L_1$.

[Chemical Formula 1]

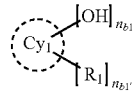

Here, $L_1$ is selected at least from a single bond and any one of $C_{1\sim6}$ alkylenes, $Cy_1$ is a hydrocarbon ring of $C_{5\sim30}$, $R_1$ is each independently $C_{1\sim5}$ alkyl, $n_{b1}$ is 1, 2 or 3, and $n_{b1'}$ is 0, 1, 2, 3 or 4.

(B-2) is a compound expressed by Chemical Formula 2 given below.

[Chemical Formula 2]

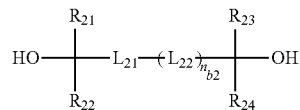

Here, $R_{21}$, $R_{22}$, $R_{23}$ and $R_{24}$ are each independently hydrogen or $C_{1\sim5}$ alkyl, $L_{21}$ and $L_{22}$ are each independently $C_{1\sim20}$ alkylene, $C_{1\sim20}$ cycloalkylene, $C_{2\sim4}$ alkenylene, $C_{2\sim4}$ alkynylene or $C_{6\sim20}$ arylene. These groups may be substituted by $C_{1\sim5}$ alkyl or hydroxyl, and $n_{b2}$ is 0, 1 or 2.

(B-3) is a polymer which contains a constituent unit expressed by Chemical Formula 3 given below and has the weight average molecular weight (Mw) of 500 to 10,000.

[Chemical Formula 3]

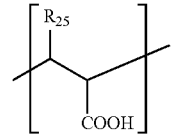

$R_{25}$ is —H, —$CH_3$ or —COOH.

In the preferred embodiment of the present invention, the solubility of the second component in 5.0 mass % ammonia water is less than 100 ppm and the solubility of the first component in 5.0 mass % ammonia water is 100 ppm or more.

In the preferred embodiment of the present invention, as compared with an entire mass of the processing liquid, the mass of the second component is 0.1 to 50 mass %.

In the preferred embodiment of the present invention, the second component is 150 to 500,000 in weight average molecular weight (Mw).

In the preferred embodiment of the present invention, the first component and the second component are a synthetic resin.

In the preferred embodiment of the present invention, the processing liquid supplying step includes a liquid film forming step of forming a liquid film of the processing liquid on the front surface of the substrate which is held horizontally. Then, the substrate processing method further includes a film thinning step of rotating the substrate around a vertical axis which passes through a central portion of the substrate to eliminate the processing liquid from the front surface of the substrate and to thin the liquid film.

With the present method, since the liquid film of the processing liquid on the substrate has been thinned, the processing liquid is solidified or cured to form a thinned processing film. Therefore, in the peeling step, a distance (film thickness) in which the peeling liquid penetrates through the processing film can be made short. As a result, since the peeling liquid smoothly enters between the processing film and the front surface of the substrate, the processing film can be smoothly peeled, thereby efficiently removing a removal object outside the substrate.

In the preferred embodiment of the present invention, the processing film forming step includes a step of forming the processing film on which the solvent remains in the interior of the processing film. Therefore, the peeling liquid can be made to conform with the processing film more easily in the subsequent peeling step than a case in which no solvent remains in the interior of the processing film. Therefore, there are easily formed penetrating holes which are distributed uniformly on the front surface of the processing film. As a result, the peeling liquid reaches an interface between the processing film and the front surface of the substrate at every site of the processing film, thus making it possible to smoothly peel the processing film.

In the preferred embodiment of the present invention, the processing film forming step includes a solvent evaporating step of evaporating the solvent from the processing liquid supplied to the front surface of the substrate. With the present method, the solvent is evaporated, thus making it possible to promote formation of the processing film. Therefore, time necessary for forming the processing film can be reduced.

Another preferred embodiment of the present invention is to provide a substrate processing apparatus which includes a processing liquid supplying unit which supplies a processing liquid which has a solute and a solvent to a front surface of a substrate, a solid forming unit which solidifies or cures the processing liquid, a peeling liquid supplying unit which supplies a peeling liquid to the front surface of the substrate, and a controller which controls the processing liquid supplying unit, the solid forming unit and the peeling liquid supplying unit.

Then, the controller is programmed to execute a processing liquid supplying step of supplying the processing liquid to the front surface of the substrate from the processing liquid supplying unit, a processing film forming step of solidifying or curing the processing liquid supplied to the front surface of the substrate by the solid forming unit to form on the front surface of the substrate a processing film which holds a removal object present on the front surface of the substrate, and a peeling step of supplying the peeling liquid to the front surface of the substrate from the peeling liquid supplying unit to peel the processing film and also to execute in the peeling step a penetrating hole forming step of partially dissolving the processing film in the peeling liquid to form a penetrating hole on the processing film.

According to the above-described configuration, the processing liquid supplied to the front surface of the substrate is solidified or cured to form the processing film which holds a removal object. Thereafter, the peeling liquid is supplied to the front surface of the substrate to partially dissolve the processing film and to form a penetrating hole on the processing film. The penetrating hole is formed on the processing film, so that the peeling liquid can easily reach near the front surface of the substrate. Therefore, the peeling liquid can be made to act on an interface between the processing film and the substrate, thus making it possible to efficiently peel the processing film from the front surface of the substrate. On the other hand, although the processing film is partially dissolved by the peeling liquid in order to form the penetrating hole, a remaining portion thereof is kept in a solid state. As a result, it is possible to efficiently remove the removal object from the front surface of the substrate together with the processing film.

In another preferred embodiment of the present invention, the controller is programmed to enter the peeling liquid between the processing film and the front surface of the substrate via the penetrating hole in the peeling step. Therefore, the peeling liquid can be made to act on an interface between the processing film and the substrate, thus making it possible to more efficiently peel the processing film from the front surface of the substrate.

In the preferred embodiment of the present invention, the solute of the processing liquid has a first component and a second component which is lower in solubility in the peeling liquid than the first component. The controller is programmed to form in the processing film forming step the processing film which contains a first solid formed by the first component and a second solid formed by the second component and also to form the penetrating hole on the first solid in the penetrating hole forming step.

According to the above-described configuration, the first component is higher in solubility in the peeling liquid than the second component. Therefore, the first solid formed by the first component is more easily dissolved in the peeling liquid than the second solid formed by the second component. Therefore, while the peeling liquid is used to dissolve the first solid, thus making it possible to reliably form the penetrating hole, the second solid can be maintained in a solid state without dissolving the second solid in the peeling liquid. Therefore, in a state where a removal object is held by the second solid, the peeling liquid can be made to act on an interface between the second solid and the substrate. As a result, while the processing film from the front surface of the substrate is peeled smoothly, it is possible to efficiently remove the removal object from the front surface of the substrate together with the processing film.

In another preferred embodiment of the present invention, the contained amount of the second component in the processing liquid is larger than the contained amount of the first component in the processing liquid. According to the above-described configuration, a portion which is dissolved by the peeling liquid in the processing film can be reduced as compared with a configuration in which the contained amount of the second component in the processing liquid is smaller than the contained amount of the first component in the processing liquid. Therefore, it is possible to reduce a removal object which is detached from the processing film in association with partial dissolution of the processing film. Thus, the removal object can be substantially removed from the front surface of the substrate together with the processing film, and, therefore, the removal object can be efficiently eliminated outside the substrate, while reattachment of the removal object to the substrate is suppressed.

In another preferred embodiment of the present invention, the contained amount of the second component in the processing liquid is smaller than the contained amount of the first component in the processing liquid. According to the above-described configuration, a portion which is dissolved by the peeling liquid in the processing film can be increased as compared with a configuration in which the contained amount of the second component in the processing liquid is larger than the contained amount of the first component in the processing liquid. Therefore, the processing film can be split into relatively small film fragments. Since the processing film is split into relatively small film fragments, the film fragments are likely to be lifted by being subjected to a force resulting from a flow of the peeling liquid and easily removed outside the substrate by the flow of the peeling liquid. Therefore, it is possible to efficiently remove a removal object from the substrate together with the processing film.

In another preferred embodiment of the present invention, the solute also has a third component which is higher in degree of solubility in the peeling liquid than the second component and lower in degree of solubility in the peeling liquid than the first component. Then, the controller is programmed to solidify or cure the processing liquid supplied to the front surface of the substrate by the solid forming unit, thereby forming the processing film which has a third solid formed by the third component at least at a portion adjacent to the front surface of the substrate.

According to the above-described configuration, the third component is higher in degree of solubility in the peeling liquid than the second component and lower in degree of solubility in the peeling liquid than the first component. Therefore, the third solid formed by the third component is more easily dissolved in the peeling liquid than the second solid formed by the second component and less likely to be dissolved in the peeling liquid than the first solid formed by the first component.

Therefore, the peeling liquid is used to dissolve the first solid, thus making it possible to reliably form a penetrating hole. Then, it is possible to dissolve the third solid positioned at a portion of the processing film adjacent to the front surface of the substrate by the peeling liquid which has entered in the vicinity of the front surface of the substrate via the penetrating hole. The third solid is more easily dissolved in the peeling liquid than the second solid, so that the processing film can be peeled more easily by the peeling liquid than a configuration in which no third solid is present at a portion of the processing film adjacent to the front surface of the substrate.

On the other hand, the second solid can be kept in a solid state in the peeling liquid. Therefore, in a state where a removal object is held by the second solid, the peeling liquid can be made to act on an interface between the second solid and the substrate. As a result, it is possible to smoothly peel the processing film from the front surface of the substrate and also efficiently remove the removal object from the front surface of the substrate together with the processing film.

In another preferred embodiment of the present invention, the substrate processing apparatus further includes a preprocessing liquid supplying unit which supplies to the front surface of the substrate a preprocessing liquid which contains a solute having a third component higher in degree of solubility in the peeling liquid than the second component and lower in degree of solubility in the peeling liquid than the first component. The controller is programmed to execute a preprocessing liquid supplying step of supplying the preprocessing liquid to the front surface of the substrate from the preprocessing liquid supplying unit before supply of the processing liquid to the front surface of the substrate and to form, in the processing film forming step, the processing film which has a third solid formed by the third component at least at a portion adjacent to the front surface of the substrate.

According to the above-described configuration, the preprocessing liquid is supplied to the front surface of the substrate before supply of the processing liquid. In a state where the preprocessing liquid is present on the front surface of the substrate, the processing liquid is supplied to the front surface of the substrate. Therefore, the preprocessing liquid is mixed with the processing liquid on the substrate to form a processing film which has a first solid, a second solid and a third solid. In this case, since the preprocessing liquid is present earlier on the substrate, the third solid can be easily formed in the vicinity of the front surface of the substrate. It is, therefore, possible to easily form the processing film having the third solid at least at a portion adjacent to the front surface of the substrate.

Further, the third component is higher in degree of solubility in the peeling liquid than the second component and lower in degree of solubility in the peeling liquid than the first component. Therefore, the third solid formed by the third component is more easily dissolved in the peeling liquid than the second solid formed by the second component and less likely to be dissolved in the peeling liquid than the first solid formed by the first component.

Therefore, the peeling liquid is used to dissolve the first solid, thus making it possible to reliably form a penetrating hole. Then, it is possible to dissolve the third solid positioned at a portion of the processing film adjacent to the front surface of the substrate by the peeling liquid which has entered in the vicinity of the front surface of the substrate via the penetrating hole. The third solid is more easily dissolved in the peeling liquid than the second solid, so that the processing film is peeled more easily by the peeling liquid than a configuration in which no third solid is present at a portion of the processing film adjacent to the front surface of the substrate.

On the other hand, the second solid can be kept in a solid state in the peeling liquid. Therefore, the peeling liquid can be made to act on an interface between the second solid and the substrate, in a state in which a removal object is held by the second solid. As a result, it is possible to smoothly peel the processing film from the front surface of the substrate and also efficiently remove the removal object from the front surface of the substrate together with the processing film.

In another preferred embodiment of the present invention, the substrate processing apparatus further includes a preprocessing liquid supplying unit which supplies to the front surface of the substrate a preprocessing liquid which contains a solute having a third component higher in degree of solubility in the peeling liquid than the second component and lower in degree of solubility in the peeling liquid than the first component. Then, the controller is programmed to further execute a preprocessing liquid supplying step of supplying the preprocessing liquid to the front surface of the substrate from the preprocessing liquid supplying unit before supply of the processing liquid to the front surface of the substrate and a preprocessing film forming step of forming on the front surface of the substrate a preprocessing film formed by the third component by solidifying or curing the preprocessing liquid by the solid forming unit before supply of the processing liquid to the front surface of the substrate, and also programmed to supply a peeling liquid to the front surface of the substrate from the peeling liquid supplying unit in the peeling step to peel the processing film and the preprocessing film from the front surface of the substrate together with the removal object.

According to the above-described configuration, before supply of the processing liquid to the front surface of the substrate, the preprocessing liquid is supplied and solidified or cured. Therefore, in a state where the preprocessing film has been formed on the front surface of the substrate, the processing liquid is supplied to the front surface of the substrate to form the processing film. Therefore, it is possible to easily form the preprocessing film formed by the third component at a portion adjacent to the front surface of the substrate.

Further, the third component is higher in degree of solubility in the peeling liquid than the second component and lower in degree of solubility in the peeling liquid than the first component. Therefore, the preprocessing film formed by the third component is more easily dissolved in the peeling liquid than the second solid formed by the second component and less likely to be dissolved in the peeling liquid than the first solid formed by the first component.

Therefore, the peeling liquid is used to dissolve the first solid, thus making it possible to reliably form a penetrating hole. Then, it is possible to dissolve the third solid positioned at a portion of the processing film adjacent to the front surface of the substrate by the peeling liquid which has entered in the vicinity of the front surface of the substrate via the penetrating hole. The third solid is more easily dissolved in the peeling liquid than the second solid, so that the processing film is peeled more easily by the peeling liquid than a configuration in which no third solid is present at a portion of the processing film adjacent to the front surface of the substrate.

On the other hand, the second solid can be kept in a solid state in the peeling liquid. Therefore, while a removal object is held by the second solid, the peeling liquid can be made to act on an interface between the second solid and the substrate. As a result, while the processing film from the front surface of the substrate is peeled smoothly, it is possible to efficiently remove the removal object from the front surface of the substrate together with the processing film.

In another preferred embodiment of the present invention, the second component contains at least any one of novolac, polyhydroxystyrene, polystyrene, a polyacrylic acid derivative, a polymaleic acid derivative, polycarbonate, a polyvinyl alcohol derivative, a polmethacrylic acid derivative and a copolymer of a combination thereof.

In another preferred embodiment of the present invention, the first component is a crack promoting component, and the crack promoting component contains hydrocarbon, and a hydroxy group and/or a carbonyl group.

In another preferred embodiment of the present invention, the first component is expressed at least by any one of (B-1), (B-2) and (B-3) given below.

(B-1) is a compound which contains 1 to 6 of constituent units expressed by Chemical Formula 4 and in which each of the constituent units is bonded by a linking group $L_1$.

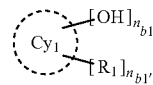

[Chemical Formula 4]

Here, $L_1$ is selected at least from a single bond and any one of $C_{1\sim6}$ alkylenes, $Cy_1$ is a hydrocarbon ring of $C_{5\sim30}$, $R_1$ is each independently $C_{1\sim5}$ alkyl, $n_{b1}$ is 1, 2 or 3, and $n_{b1'}$ is 0, 1, 2, 3 or 4.

(B-2) is a compound which is expressed by Chemical Formula 5.

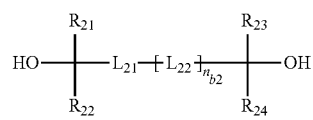

[Chemical Formula 5]

Here, $R_{21}$, $R_{22}$, $R_{23}$ and $R_{24}$ are each independently hydrogen or $C_{1\sim5}$ alkyl, $L_{21}$ and $L_{22}$ are each independently $C_{1\sim20}$ alkylene, $C_{1\sim20}$ cycloalkylene, $C_{2\sim4}$ alkenylene, $C_{2\sim4}$ alkynylene or $C_{6\sim20}$ arylene. These groups may be substituted by $C_{1\sim5}$ alkyl or hydroxyl, and $n_{b2}$ is 0, 1 or 2.

(B-3) is a polymer which contains a constituent unit expressed by Chemical Formula 6 and has the weight average molecular weight (Mw) of 500 to 10,000.

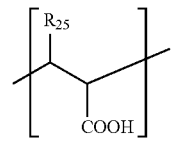

[Chemical Formula 6]

$R_{25}$ is —H, —$CH_3$ or —COOH.

In another preferred embodiment of the present invention, the solubility of the second component in 5.0 mass % ammonia water is less than 100 ppm, and the solubility of the first component in 5.0 mass % ammonia water is 100 ppm or more.

In another preferred embodiment of the present invention, as compared with an entire mass of the processing liquid, the mass of the second component is 0.1 to 50 mass %.

In another preferred embodiment of the present invention, the second component is 150 to 500,000 in weight average molecular weight (Mw).

In another preferred embodiment of the present invention, the first component and the second component are a synthetic resin.

In another preferred embodiment of the present invention, the substrate processing apparatus further includes a substrate holding unit which holds the substrate horizontally. Then, the solid forming unit includes a substrate rotating unit which rotates the substrate around a vertical axis which passes through a central portion of the substrate. Then, the controller is programmed to execute a liquid film forming step of forming in the processing liquid supplying step a liquid film of the processing liquid on the front surface of the substrate held by the substrate holding unit and a film thinning step of rotating in the processing film forming step the substrate in which the liquid film is formed on the front surface thereof by the substrate rotating unit to eliminate the processing liquid from the front surface of the substrate and to thin the liquid film.

According to the above-described configuration, since the liquid film of the processing liquid on the substrate has been thinned, the processing liquid is solidified or cured to form a thinned processing film. Therefore, a distance (film thickness) in which the peeling liquid penetrates through the processing film in the peeling step can be made short. Since the peeling liquid smoothly enters between the processing film and the front surface of the substrate, the processing film can be smoothly peeled, thereby efficiently removing a removal object outside the substrate.

In another preferred embodiment of the present invention, the controller is programmed to allow the solvent to remain in the interior of the processing film when the processing film is formed by the solid forming unit. Therefore, the peeling liquid is made to conform with the processing film more easily in the subsequent peeling step than a case in which no solvent remains in the interior of the processing film. Therefore, there are easily formed penetrating holes which are distributed uniformly on the front surface of the processing film. As a result, the peeling liquid reaches an interface between the processing film and the front surface of the substrate at every site of the processing film, thus making it possible to smoothly peel the processing film.

In another preferred embodiment of the present invention, the solid forming unit includes an evaporation promoting unit which promotes evaporation of a liquid on the substrate. Then, the controller is programmed to execute a solvent evaporating step of evaporating the solvent from the processing liquid supplied to the front surface of the substrate by the evaporation promoting unit in the processing film forming step. According to the above-described configuration, the solvent is evaporated, thus making it possible to promote the formation of the processing film. Therefore, time necessary for forming the processing film can be reduced. The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 is a flowchart for describing one example of substrate processing by the substrate processing apparatus.

DETAILED DESCRIPTION OF THE PREFERRED EMBODIMENTS

First Preferred Embodiment

Figure 1:
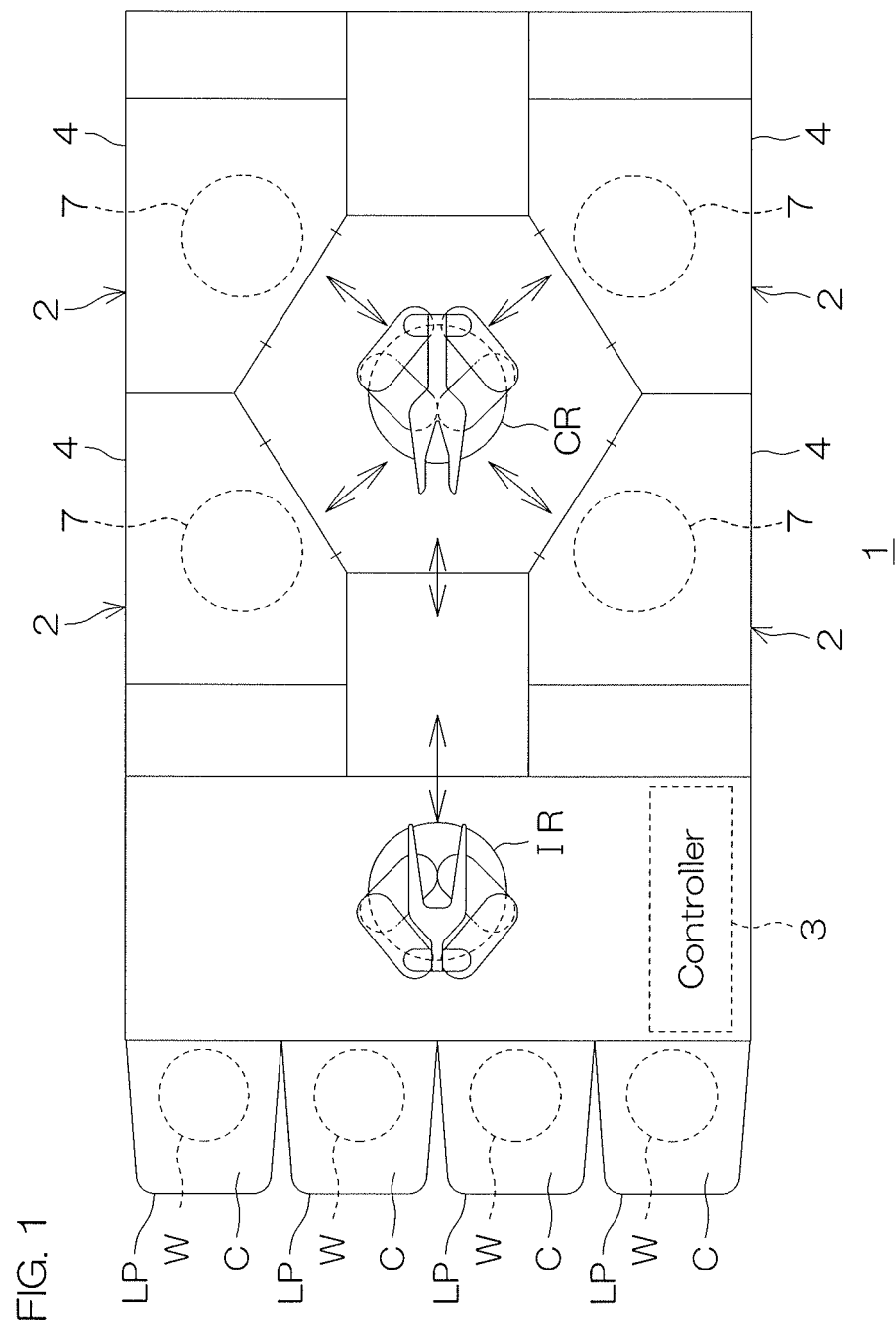
FIG. 1 is a schematic plan view which shows a layout of a substrate processing apparatus according to a first preferred embodiment of the present invention.

FIG. 1 is a schematic plan view which shows a layout of a substrate processing apparatus 1 according to the first preferred embodiment of the present invention.

The substrate processing apparatus 1 is a single substrate processing type apparatus that processes a substrate W such as a silicon wafer, etc., one at a time. In the present preferred embodiment, the substrate W is a disk-shaped substrate.

The substrate processing apparatus 1 includes a plurality of processing units 2 for processing a substrate W with a fluid, load ports LP on which are placed carriers C that house a plurality of the substrates W to be processed by the processing units 2, transfer robots IR and CR which transfer the substrates W between the load ports LP and the processing units 2 and a controller 3 which controls the substrate processing apparatus 1.

The transfer robot IR transfers the substrates W between the carriers C and the transfer robot CR. The transfer robot CR transfers the substrates W between the transfer robot IR and the processing units 2. The plurality of processing units 2 have, for example, the same configuration. Although the details will be described later, a processing fluid which is supplied to the substrate W inside the processing unit 2 includes a chemical liquid, a rinse liquid, a processing liquid, a peeling liquid, a heating medium, an inert gas, etc.

Each of the processing units 2 is provided with a chamber 4 and a processing cup 7 which is disposed in the interior of the chamber 4 and executes processing to the substrate W inside the processing cup 7. On the chamber 4, there is formed an inlet/outlet (not shown) for carrying in and carrying out substrates W by the transfer robot CR. The chamber 4 is provided with a shutter unit (not shown) for opening/closing the inlet/outlet.

Figure 2:
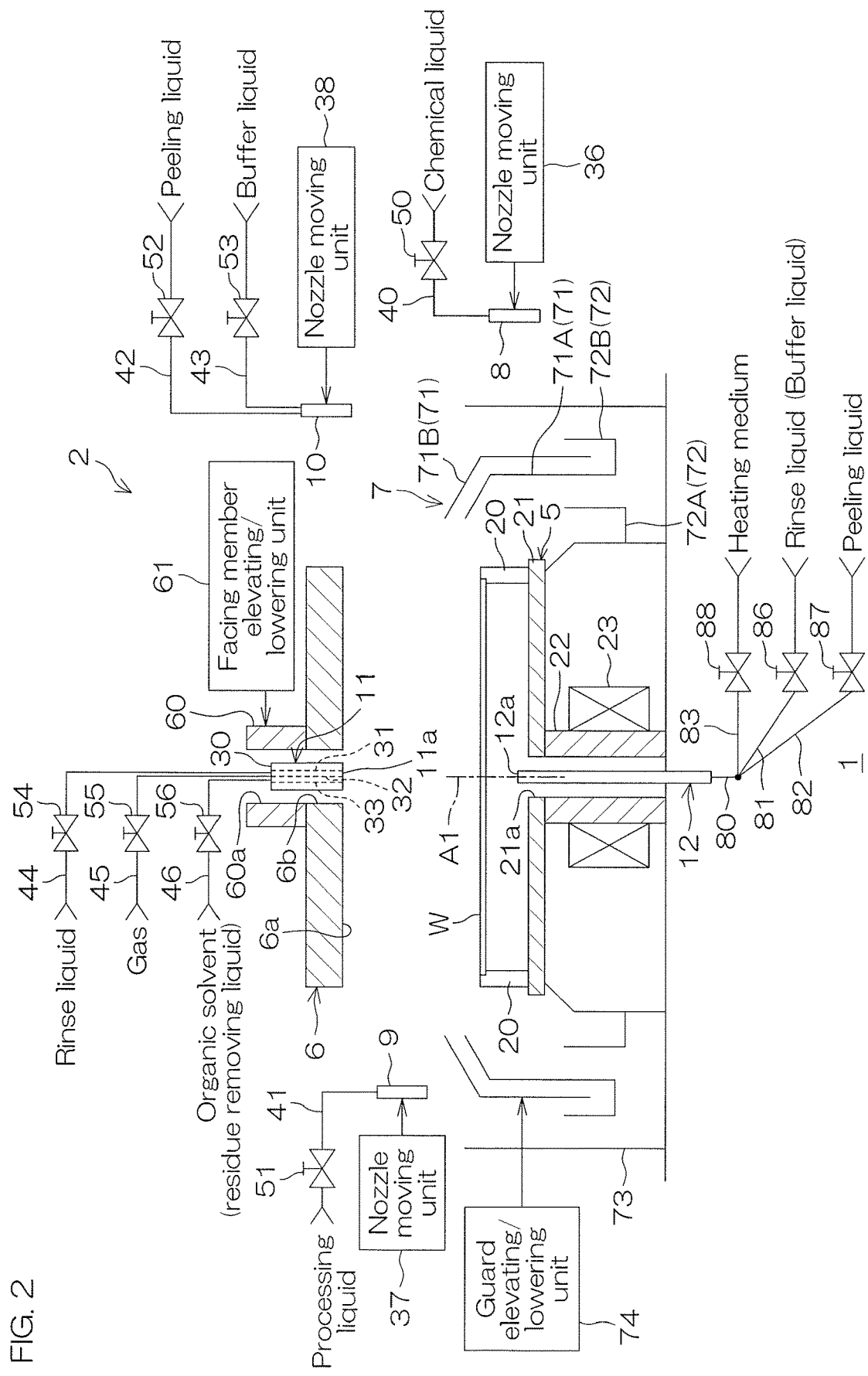
FIG. 2 is a schematic partial sectional view which shows a brief configuration of a processing unit included in the substrate processing apparatus.

FIG. 2 is a schematic view for describing an arrangement example of the processing unit 2. The processing unit 2 includes a spin chuck 5, a facing member 6, a processing cup 7, a first moving nozzle 8, a second moving nozzle 9, a third moving nozzle 10, a central nozzle 11 and a lower surface nozzle 12.

The spin chuck 5 rotates a substrate W around a rotational axis A1 (around a vertical axis), while holding the substrate W horizontally. The rotational axis A1 is a vertical axis which passes through a central portion of the substrate W. The spin chuck 5 includes a plurality of chuck pins 20, a spin base 21, a rotating shaft 22 and a spin motor 23.

The spin base 21 is formed in a disk shape oriented along a horizontal direction. A plurality of chuck pins 20 which grip a peripheral edge of the substrate W are disposed on an upper surface of the spin base 21 at interval in a circumferential direction of the spin base 21. A substrate holding unit which holds the substrate W horizontally are configured with the spin base 21 and the plurality of chuck pins 20. The substrate holding unit is also called a substrate holder.

The rotating shaft 22 extends in a vertical direction along the rotational axis A1. An upper end portion of the rotating shaft 22 is coupled to a lower surface center of the spin base 21. The spin motor 23 applies a rotating force to the rotating shaft 22. The rotating shaft 22 is rotated by the spin motor 23, so that the spin base 21 is rotated. Thereby, a substrate W is rotated around the rotational axis A1. The spin motor 23 is an example of the substrate rotating unit which rotates a substrate W around the rotational axis A1.

The facing member 6 faces a substrate W held by the spin chuck 5 from above. The facing member 6 is formed in a disk shape having substantially the same diameter as or a diameter larger than that of the substrate W. The facing member 6 has a facing surface 6a which faces an upper surface (surface on the upper side) of the substrate W. The facing surface 6a is disposed substantially along a horizontal surface above from the spin chuck 5.

A hollow shaft 60 is fixed to the facing member 6 at an opposite side to the facing surface 6a. A communicating hole 6b which penetrates vertically through the facing member 6 and is in communication with an internal space 60a of the hollow shaft 60 is formed at a portion of the facing member 6 overlapping with the rotational axis A1 in a plan view.

The facing member 6 blocks an atmosphere inside a space between the facing surface 6a and the upper surface of the substrate W from an atmosphere outside the space. The facing member 6 is thus also called a blocking plate.

The processing unit 2 further includes a facing member elevating/lowering unit 61 that drives elevation and lowering of the facing member 6. The facing member elevating/lowering unit 61 is capable of positioning the facing member 6 at any position (height) from a lower position to an upper position. The lower position is a position within a movable range of the facing member 6 at which the facing surface 6a is positioned most proximate to a substrate W. The upper position is a position within the movable range of the facing member 6 at which the facing surface 6a is separated farthest from the substrate W.

The facing member elevating/lowering unit 61 includes, for example, a ball-screw mechanism (not shown) mounted to a supporting member (not shown) that supports the hollow shaft 60 and an electric motor (not shown) that applies a driving force to the ball-screw mechanism. The facing member elevating/lowering unit 61 is also called a facing member lifter (blocking plate lifter).

The processing cup 7 includes a plurality of guards 71 that receive a liquid splashed outside from a substrate W held by the spin chuck 5, a plurality of cups 72 that receive a liquid guided downward by the plurality of guards 71, and a circular-cylindrical outer wall member 73 that surrounds the plurality of guards 71 and the plurality of cups 72.

In the present preferred embodiment, there is shown an example which has two guards 71 (a first guard 71A and a second guard 71B) and two cups 72 (a first cup 72A and a second cup 72B).

Each of the first cup 72A and the second cup 72B has an annular groove shape which is opened upward.

The first guard 71A is disposed so as to surround the spin base 21. The second guard 71B is disposed so as to surround the spin base 21 outer side in a rotational radius direction of a substrate W from the first guard 71A.

Each of the first guard 71A and the second guard 71B is formed substantially in a circular cylindrical shape, and an upper end portion of each of the guards 71 is inclined inward toward the spin base 21.

The first cup 72A receives a liquid guided downward by the first guard 71A. The second cup 72B is formed integrally with the first guard 71A and receives a liquid guided downward by the second guard 71B.

The processing unit 2 includes a guard elevating/lowering unit 74 which elevates and lowers separately the first guard 71A and the second guard 71B. The guard elevating/lowering unit 74 elevates and lowers the first guard 71A between a lower position and an upper position. The guard elevating/lowering unit 74 elevates and lowers the second guard 71B between a lower position and an upper position.

When the first guard 71A and the second guard 71B are both positioned at the upper position, a liquid splashed from a substrate W is received by the first guard 71A. When the first guard 71A is positioned at the lower position and the second guard 71B is positioned at the upper position, a liquid splashed from a substrate W is received by the second guard 71B.

The guard elevating/lowering unit 74 includes, for example, a first ball-screw mechanism (not shown) coupled to the first guard 71A, a first motor (not shown) which applies a driving force to the first ball screw mechanism, a second ball-screw mechanism (not shown) coupled to the second guard 71B, and a second motor (not shown) which applies a driving force to the second ball-screw mechanism. The guard elevating/lowering unit 74 is also called a guard lifter.

The first moving nozzle 8 is an example of the chemical liquid supplying unit which supplies (discharges) a chemical liquid to an upper surface of a substrate W held by the spin chuck 5.

The first moving nozzle 8 is moved by the first nozzle moving unit 36 in a horizontal direction and in a vertical direction. The first moving nozzle 8 is capable of moving between a center position and a home position (retreat position). When positioned at the center position, the first moving nozzle 8 faces a rotation center of an upper surface on a substrate W. The rotation center of the upper surface of the substrate W is a position of intersection of the rotational axis A1 on the upper surface of the substrate W.

When positioned at the home position, the first moving nozzle 8 does not face the upper surface of the substrate W and is positioned outside the processing cup 7 in a plan view. The first moving nozzle 8 moves in the vertical direction and is thereby capable of moving close to the upper surface of the substrate W and retreating upward from the upper surface of the substrate W.

The first nozzle moving unit 36 includes, for example, a pivoting shaft (not shown) along the vertical direction, an arm (not shown) which is coupled to the pivoting shaft and extends horizontally and a pivoting shaft driving unit (not shown) which elevates, lowers and pivots the pivoting shaft.

The pivoting shaft driving unit pivots the pivoting shaft around a vertical pivoting axis, thereby swinging the arm. The pivoting shaft driving unit elevates and lowers the pivoting shaft along the vertical direction, thereby moving the arm up and down. The first moving nozzle 8 is fixed to the arm. The first moving nozzle 8 moves in the horizontal direction and in the vertical direction, depending on swinging and elevation/lowering of the arm.

The first moving nozzle 8 is connected to a chemical liquid piping 40 which guides a chemical liquid. When a chemical liquid valve 50 interposed in the chemical liquid piping 40 is opened, the chemical liquid is continuously discharged downward from the first moving nozzle 8.

The chemical liquid discharged from the first moving nozzle 8 is a liquid which contains at least any one of, for example, sulfuric acid, acetic acid, nitric acid, hydrochloric acid, hydrofluoric acid, ammonia water, hydrogen peroxide water, an organic acid (for example, citric acid and oxalic acid), an organic alkali (for example, TMAH: tetramethylammonium hydroxide, etc.), a surfactant, and a corrosion inhibitor. As examples of the chemical liquid of their mixture, SPM solution (sulfuric acid/hydrogen peroxide mixture), SC1 solution (ammonia-hydrogen peroxide mixture), etc., can be cited.

The second moving nozzle 9 is an example of the processing liquid supplying unit which supplies (discharges) a processing liquid to an upper surface of a substrate W held by the spin chuck 5.

The second moving nozzle 9 is moved by the second nozzle moving unit 37 in the horizontal direction and in the vertical direction. The second moving nozzle 9 is capable of moving between a center position and a home position (retreat position). When positioned at the center position, the second moving nozzle 9 faces the rotation center of the upper surface of the substrate W.

When positioned at the home position, the second moving nozzle 9 does not face the upper surface of the substrate W and is positioned outside the processing cup 7 in a plan view. The second moving nozzle 9 moves in the vertical direction and is thereby capable of moving close to the upper surface of the substrate W and retreating upward from the upper surface of the substrate W.

The second nozzle moving unit 37 has the same configuration as the first nozzle moving unit 36. That is, the second nozzle moving unit 37 includes, for example, a pivoting shaft (not shown) oriented along the vertical direction, an arm (not shown) which is coupled to the pivoting shaft and the second moving nozzle 9 and extends horizontally, and a pivoting shaft driving unit (not shown) that elevates, lowers and pivots the pivoting shaft.

The second moving nozzle 9 is connected to a processing liquid piping 41 that guides a processing liquid. When a processing liquid valve 51 interposed in the processing liquid piping 41 is opened, the processing liquid is continuously discharged downward from the second moving nozzle 9.

The processing liquid discharged from the second moving nozzle 9 contains a solute and a solvent. The processing liquid is solidified or cured at least by partial volatilization of the solvent. The processing liquid is solidified or cured on a substrate W to form a processing film which holds a removal object such as particles present on the substrate W.

Here, "solidification" refers, for example, to hardening of the solute due to forces acting between molecules or between atoms, etc., in association with volatilization (evaporation) of the solvent. "Curing" refers, for example, to hardening of the solute due to a chemical change such as polymerization and crosslinking. "Solidification or curing" thus expresses "hardening" of the solute due to various causes.

The first component and the second component are contained in the solute in the processing liquid discharged from the second moving nozzle 9. A quantity (contained amount) of the first component contained in the processing liquid is smaller than a quantity (contained amount) of the second component contained in the processing liquid.

The first component and the second component are, for example, synthetic resins which are mutually different in properties. The solvent contained in the processing liquid discharged from the second moving nozzle 9 may be any liquid which will dissolve the first component and the second component.

As examples of the synthetic resin used as the solute, acrylic resins, phenol resins, epoxy resins, melamine resins, urea resins, unsaturated polyester resins, alkyd resins, polyurethane, polyimide, polyethylene, polypropylene, polyvinyl chloride, polystyrene, polyvinyl acetate, polytetrafluoroethylene, acrylonitrile-butadiene-styrene resins, acrylonitrile-styrene resins, polyamide, polyacetal, polycarbonate, polyvinyl alcohol, modified polyphenylene ether, polybutylene terephthalate, polyethylene terephthalate, polyphenylene sulfide, polysulfone, polyether ether ketone, polyamide-imide, etc., can be cited.

As solvents which will dissolve the synthetic resin, IPA, PGEE (propylene glycolmonoethyl ether), PGMEA (propylene glycol monomethyl ether 2-acetate), EL (ethyl lactate), etc., can be cited.

The third moving nozzle 10 is an example of the peeling liquid supplying unit which supplies (discharges) a peeling liquid to an upper surface of a substrate W held by the spin chuck 5. In the present preferred embodiment, the third moving nozzle 10 is also an example of the buffer liquid supplying unit which supplies (discharges) a buffer liquid to an upper surface of a substrate W held by the spin chuck 5.

The third moving nozzle 10 is moved by the third nozzle moving unit 38 in the horizontal direction and in the vertical direction. The third moving nozzle 10 is capable of moving between a center position and a home position (retreat position).

When positioned at the center position, the third moving nozzle 10 faces the rotation center of the upper surface of the substrate W. When positioned at the home position, the third moving nozzle 10 does not face the upper surface of the substrate W and is positioned outside the processing cup 7 in a plan view. The third moving nozzle 10 moves in the vertical direction and is thereby capable of moving close to the upper surface of the substrate W and retreating upward from the upper surface of the substrate W.

The third nozzle moving unit 38 has the same configuration as the first nozzle moving unit 36. That is, the third nozzle moving unit 38 includes, for example, a pivoting shaft (not shown) oriented along the vertical direction, an arm (not shown) which is coupled to the pivoting shaft and the third moving nozzle 10 and extends horizontally and a pivoting shaft driving unit (not shown) which elevates, lowers and pivots the pivoting shaft.

The third moving nozzle 10 is connected to an upper peeling liquid piping 42 which guides a peeling liquid to the third moving nozzle 10. When an upper peeling liquid valve 52 interposed in the upper peeling liquid piping 42 is opened, the peeling liquid is continuously discharged downward from a discharge port of the third moving nozzle 10.

The third moving nozzle 10 is also connected to an upper buffer liquid piping 43 which guides a buffer liquid to the third moving nozzle 10. When an upper buffer liquid valve 53 interposed in the upper buffer liquid piping 43 is opened, the buffer liquid is continuously discharged downward from the discharge port of the third moving nozzle 10.

The peeling liquid is a liquid for peeling a processing film on the substrate W from the upper surface of the substrate W.

As the peeling liquid, there is used a liquid that will dissolve more easily the first component contained in the solute of the processing liquid than the second component contained in the solute of the processing liquid. In other words, as the peeling liquid, there is used a liquid in which the solubility (degree of solubility) of the first component in the peeling liquid is higher than the solubility (degree of solubility) of the second component in the peeling liquid. The peeling liquid is preferably a liquid which has compatibility (mixable) with the solvent contained in the processing liquid.

The peeling liquid is, for example a water-based peeling liquid. As examples of the water-based peeling liquid, DIW, carbonated water, electrolyzed ion water, hydrogen water, ozone water, aqueous hydrochloric acid solution of dilute concentrations (for example, approximately 10 ppm to 100 ppm), aqueous alkaline solution, etc., can be cited. As examples of the aqueous alkaline solution, SC1 solution, aqueous ammonia solution, aqueous solution of a quaternary ammonium hydroxide such as TMAH, aqueous choline solution, etc., can be cited.

A buffer liquid is a liquid for buffering peeling actions of a peeling liquid on a processing film. The buffer liquid is supplied to the processing film before supply of the peeling liquid, thus making it possible to avoid actions of the peeling liquid with high concentrations on a part of the processing film. Thereby, the buffer liquid is supplied to the processing film before supply of the peeling liquid, so that the peeling liquid can be allowed to evenly act on the entire processing film.

As examples of the buffer liquid, DIW, carbonated water, electrolyzed ion water, aqueous hydrochloric acid solution of dilute concentrations (for example, approximately 10 ppm to 100 ppm), ammonia water of dilute concentrations (for example, approximately 1 ppm to 100 ppm), reduced water (hydrogen water), etc., can be cited.

The central nozzle 11 is housed in the internal space 60a of the hollow shaft 60 of the facing member 6. A discharge port 11a formed at the leading end of the central nozzle 11 faces a central region on an upper surface of a substrate W from above. The central region on the upper surface of the substrate W is a region which includes a rotation center of the substrate W on the upper surface of the substrate W.

The central nozzle 11 includes a plurality of tubes (a first tube 31, a second tube 32 and a third tube 33) which discharge a fluid downward and a tubular casing 30 which surrounds the plurality of tubes. The plurality of tubes and the casing 30 extend in an up/down direction oriented along the rotational axis A1. The discharge port 11a of the central nozzle 11 also serves as a discharge port of the first tube 31, also serves as a discharge port of the second tube 32 and also serves as a discharge port of the third tube 33.

The first tube 31 is an example of a rinse liquid supplying unit which supplies a rinse liquid to an upper surface of a substrate W. The second tube 32 is an example of a gas supplying unit which supplies a gas between an upper surface of a substrate W and the facing surface 6a of the facing member 6. The third tube 33 is an example of an organic solvent supplying unit which supplies an organic solvent such as IPA to an upper surface of a substrate W.

The first tube 31 is connected to an upper rinse liquid piping 44 which guides a rinse liquid to the first tube 31. When an upper rinse liquid valve 54 interposed in the upper rinse liquid piping 44 is opened, the rinse liquid is continuously discharged to the central region on the upper surface of the substrate W from the first tube 31 (central nozzle 11).

As examples of the rinse liquid, DIW, carbonated water, electrolyzed ion water, aqueous hydrochloric acid solution of dilute concentrations (for example, approximately 1 ppm to 100 ppm), ammonia water of dilute concentrations (for example, approximately 1 ppm to 100 ppm), reduced water (hydrogen water), etc., can be cited. That is, as the rinse liquid, there can be used a liquid similar to the buffer liquid. The rinse liquid is a liquid similar to the buffer liquid and, therefore, the first tube 31 is also an example of the buffer liquid supplying unit.

The second tube 32 is connected to a gas piping 45 which guides a gas to the second tube 32. When a gas valve 55 interposed in the gas piping 45 is opened, a gas is continuously discharged downward from the second tube 32 (central nozzle 11).

The gas discharged from the second tube 32 is an inert gas, for example, nitrogen gas ($N_2$), etc. The gas discharged from the second tube 32 may be air. The inert gas is not restricted to nitrogen gas and is a gas which is inert to an upper surface of a substrate W and a pattern formed on the upper surface of the substrate W. As examples of the inert gas, other than nitrogen gas, noble gas such as argon can be cited.

The third tube 33 is connected to an organic solvent piping 46 which guides an organic solvent to the third tube 33. When an organic solvent valve 56 interposed in the organic solvent piping 46 is opened, the organic solvent is continuously discharged to the central region on the upper surface of the substrate W from the third tube 33 (central nozzle 11).

The organic solvent discharged from the third tube 33 is a residue removing liquid for removing residue remaining on the upper surface of the substrate W after removal of a processing film by a peeling liquid. It is preferable that the organic solvent discharged from the third tube 33 has compatibility with a processing liquid and a rinse liquid.

As examples of the organic solvent discharged from the third tube 33, a liquid which contains at least any one of IPA, HFE (hydrofluoroether), methanol, ethanol, acetone and trans-1,2-dichloroethylene, etc., can be cited.

Further, the organic solvent discharged from the third tube 33 is not necessarily made up of only a single component but may be a liquid which is mixed with other components. The organic solvent discharged from the third tube 33 may be, for example, a liquid mixture of IPA and DIW or may be a liquid mixture of IPA and HFE.

The lower surface nozzle 12 is inserted into a penetrating hole 21a which is opened at an upper surface central portion of the spin base 21. A discharge port 12a of the lower surface nozzle 12 is exposed from an upper surface of the spin base 21. The discharge port 12a of the lower surface nozzle 12 faces a central region on a lower surface of a substrate W from below. The central region on the lower surface of the substrate W is a region which includes the rotation center of the substrate W on the lower surface of the substrate W.

One end of a common piping 80 which commonly guides a rinse liquid, a peeling liquid and a heating medium to the lower surface nozzle 12 is connected to the lower surface nozzle 12. A lower rinse liquid piping 81 which guides the rinse liquid to the common piping 80, a lower peeling liquid piping 82 which guides the peeling liquid to the common piping 80 and a heating medium piping 83 which guides the heating medium to the common piping 80 are connected to the other end of the common piping 80.

When a lower rinse liquid valve 86 interposed in the lower rinse liquid piping 81 is opened, the rinse liquid is continuously discharged to the central region on the lower surface of the substrate W from the lower surface nozzle 12. When a lower peeling liquid valve 87 interposed in the lower peeling liquid piping 82 is opened, the peeling liquid is continuously discharged to the central region on the lower surface of the substrate W from the lower surface nozzle 12. When a heating medium valve 88 interposed in the heating medium piping 83 is opened, the heating medium is continuously discharged to the central region on the lower surface of the substrate W from the lower surface nozzle 12.

The lower surface nozzle 12 is an example of a lower rinse liquid supplying unit which supplies a rinse liquid to a lower surface of a substrate W. The liquid which is used as the rinse liquid can be used as a buffer liquid and, therefore, the lower surface nozzle 12 is also an example of a lower buffer liquid supplying unit.

Further, the lower surface nozzle 12 is an example of a lower peeling liquid supplying unit which supplies a peeling liquid to a lower surface of a substrate W. Further, the lower surface nozzle 12 is an example of a heating medium supplying unit which supplies a heating medium for heating a substrate W to the substrate W. The lower surface nozzle 12 is also a substrate heating unit which heats the substrate W.

The heating medium discharged from the lower surface nozzle 12 is, for example, high temperature DIW (for example, 60° C. to 80° C.), the temperature of which is higher than a room temperature and lower than a boiling point of a solvent contained in a processing liquid. The heating medium discharged from the lower surface nozzle 12 is not restricted to the high temperature DIW but may be a high temperature gas such as high temperature inert gas or high temperature air (for example, 60° C. to 80° C.), the temperature of which is higher than a room temperature and lower than a boiling point of a solvent contained in a processing liquid.

Figure 3:
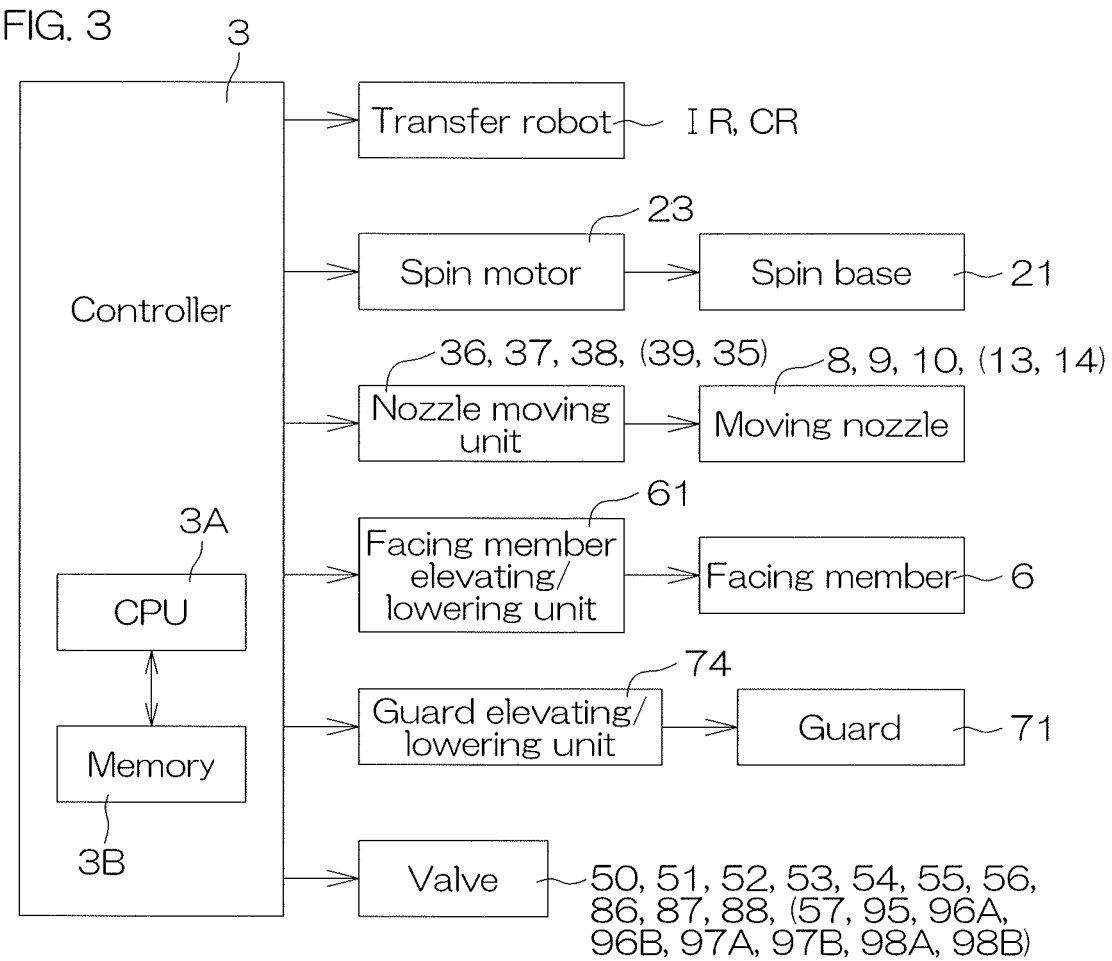
FIG. 3 is a block diagram which shows an electrical configuration of a main portion in the substrate processing apparatus.

FIG. 3 is a block diagram for describing an electrical configuration of a main portion of the substrate processing apparatus 1. The controller 3 includes a microcomputer and controls control objects included in the substrate processing apparatus 1 in accordance with a predetermined control program.

Specifically, the controller 3 includes a processor (CPU) 3A and a memory 3B that stores control programs. The controller 3 is arranged so as to execute various types of control for substrate processing by control programs executed by the processor 3A.

The controller 3 is programmed to control, in particular, the transfer robots IR, CR, the spin motor 23, the first nozzle moving unit 36, the second nozzle moving unit 37, the third nozzle moving unit 38, the facing member elevating/lowering unit 61, the guard elevating/lowering unit 74, the chemical liquid valve 50, the processing liquid valve 51, the upper peeling liquid valve 52, the upper buffer liquid valve 53, the upper rinse liquid valve 54, the gas valve 55, the organic solvent valve 56, the lower rinse liquid valve 86, the lower peeling liquid valve 87 and the heating medium valve 88.

FIG. 4 is a flowchart for describing one example of the substrate processing by the substrate processing apparatus 1. FIG. 4 shows the processing which is realized mainly by execution of a program by the controller 3. FIG. 5A to FIG. 5H are each a schematic view for describing conditions of each step of the substrate processing.

In the substrate processing by the substrate processing apparatus 1, for example, as shown in FIG. 4, a substrate carry-in step (Step S1), a chemical liquid supplying step (Step S2), a first rinsing step (Step S3), a first organic solvent supplying step (Step S4), a processing liquid supplying step (Step S5), a film thinning step (Step S6), a heating step (Step S7), a buffering step (Step S8), a peeling step (Step S9), a second rinsing step (Step S10), a second organic solvent supplying step (Step S1), a spin drying step (Step S12) and a substrate carry-out step (Step S13) are executed in this order.

An unprocessed substrate W is, first, carried from a carrier C into a processing unit 2 by the transfer robots IR, CR (refer to FIG. 1) and transferred to the spin chuck 5 (Step S1). Thereby, the substrate W is held horizontally by the spin chuck 5 (a substrate holding step). The holding of the substrate W by the spin chuck 5 is continued until the spin drying step (Step S12) ends. When the substrate W is carried in, the facing member 6 retreats at the upper position.

Next, after the transfer robot CR has retreated outside the processing unit 2, the chemical liquid supplying step (Step S2) is started. Specifically, the spin motor 23 rotates the spin base 21. Thereby, the substrate W held horizontally is rotated (the substrate rotating step). Then, the guard elevating/lowering unit 74 allows the first guard 71A and the second guard 71B to move to the upper position.

Then, the first nozzle moving unit 36 allows the first moving nozzle 8 to move to a processing position. The processing position of the first moving nozzle 8 is, for example, a central position. The chemical liquid valve 50 is then opened. Thereby, a chemical liquid is supplied (discharged) from the first moving nozzle 8 to a central region on the upper surface of the substrate W in a rotating state. In the chemical liquid supplying step, the substrate W is rotated at a predetermined chemical liquid rotational speed, for example, 800 rpm.

The chemical liquid supplied to the upper surface of the substrate W spreads radially by being subjected to a centrifugal force and extends across the entire upper surface of the substrate W. Thereby, the upper surface of the substrate W is processed by the chemical liquid. Discharge of the chemical liquid from the first moving nozzle 8 continues for a predetermined time, for example, 30 seconds.

Next, the first rinsing step (Step S3) is started. In the first rinsing step, the chemical liquid on the substrate W is washed away with a rinse liquid.

Specifically, the chemical liquid valve 50 is closed. Thereby, supply of the chemical liquid to the substrate W is stopped. Then, the first nozzle moving unit 36 allows the first moving nozzle 8 to move to the home position. Then, the facing member elevating/lowering unit 61 allows the facing member 6 to move to a processing position between the upper position and the lower position. When the facing member 6 is positioned at the processing position, a distance between the upper surface of the substrate W and the facing surface 6a is, for example, 30 mm. In the first rinsing step, the positions of the first guard 71A and the second guard 71B are kept at the upper position.

Then, the upper rinse liquid valve 54 is opened. Thereby, a rinse liquid is supplied (discharged) from the central nozzle 11 toward the central region on the upper surface of the substrate W in the rotating state. Further, the lower rinse liquid valve 86 is opened. Thereby, the rinse liquid is supplied (discharged) from the lower surface nozzle 12 toward the central region on the lower surface of the substrate W in the rotating state. In the first rinsing step, the substrate W is rotated at a predetermined first rinse rotational speed, for example, 800 rpm.

The rinse liquid supplied to the upper surface of the substrate W from the central nozzle 11 spreads radially by being subjected to a centrifugal force and extends across the entire upper surface of the substrate W. Thereby, the chemical liquid on the upper surface of the substrate W is washed away outside the substrate W.

The rinse liquid supplied to the lower surface of the substrate W from the lower surface nozzle 12 spreads radially by being subjected to a centrifugal force and extends across the entire lower surface of the substrate W. Even where the chemical liquid splashed from the substrate W by the chemical liquid supplying step is attached to the lower surface thereof, the chemical liquid attached to the lower surface is washed away with the rinse liquid supplied from the lower surface nozzle 12. Discharge of the rinse liquid from the central nozzle 11 and the lower surface nozzle 12 continues for a predetermined time, for example, 30 seconds.

Next, the first organic solvent supplying step (Step S4) is started. In the first organic solvent supplying step, the rinse liquid on the substrate W is replaced with an organic solvent.

Specifically, the upper rinse liquid valve 54 and the lower rinse liquid valve 86 are closed. Thereby, supply of the rinse liquid to the upper surface and the lower surface of the substrate W is stopped. Then, in a state where the guard elevating/lowering unit 74 keeps the second guard 71B at the upper position, the first guard 71A is moved to the lower position. The facing member 6 is kept at the processing position.

In the first organic solvent supplying step, the substrate W is rotated at a predetermined first organic solvent rotational speed, for example, 300 rpm to 1500 rpm. It is not necessary to rotate the substrate W at a fixed rotational speed in the first organic solvent supplying step. For example, the spin motor 23 may rotate the substrate W at 300 rpm at the start of supplying an organic solvent and may accelerate rotation of the substrate W until the rotational speed of the substrate W reaches 1500 rpm, while the organic solvent to the substrate W is supplied.

Then, the organic solvent valve 56 is opened. Thereby, the organic solvent is supplied (discharged) from the central nozzle 11 toward the central region on the upper surface of the substrate W in the rotating state.

The organic solvent supplied from the central nozzle 11 to the upper surface of the substrate W spreads radially by being subjected to a centrifugal force and extends across the entire upper surface of the substrate W. Thereby, the rinse liquid on the substrate W is replaced with the organic solvent. Discharge of the organic solvent from the central nozzle 11 continues for a predetermined time, for example, 10 seconds.

Next, the processing liquid supplying step (Step S5) is started. Specifically, the organic solvent valve 56 is closed. Thereby, supply of the organic solvent to the substrate W is stopped. Then, the facing member elevating/lowering unit 61 allows the facing member 6 to move to the upper position. Then, the guard elevating/lowering unit 74 allows the first guard 71A to move to the upper position. In the processing liquid supplying step, the substrate W is rotated at a predetermined processing liquid rotational speed, for example, 10 rpm to 1500 rpm.

Figure 5A:
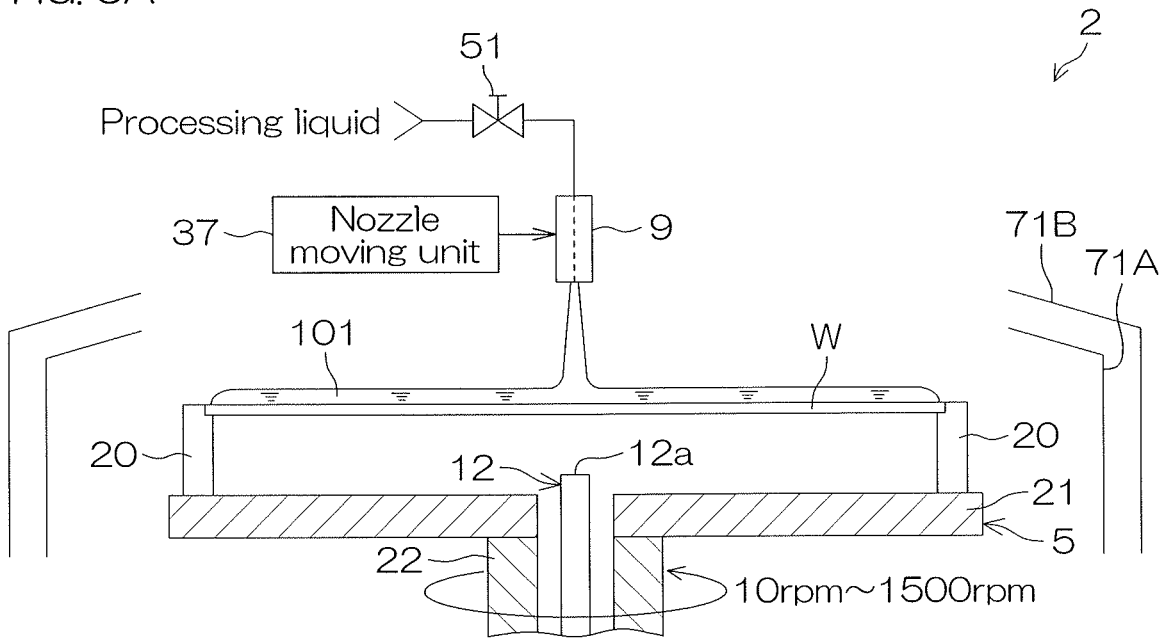
FIG. 5A is a schematic view for describing conditions of a processing liquid supplying step (Step S5) in the substrate processing.

Then, as shown in FIG. 5A, the second nozzle moving unit 37 allows the second moving nozzle 9 to move to the processing position. The processing position of the second moving nozzle 9 is, for example, the central position. Then, the processing liquid valve 51 is opened. Thereby, the processing liquid is supplied (discharged) from the second moving nozzle 9 toward the central region on the upper surface of the substrate W in the rotating state (the processing liquid supplying step, the processing liquid discharging step). Thereby, the organic solvent on the substrate W is replaced with the processing liquid to form a liquid film of the processing liquid on the substrate W (a processing liquid film 101) (the processing liquid film forming step). Supply of the processing liquid from the second moving nozzle 9 continues for a predetermined time, for example, 2 to 4 seconds.

Next, the processing film forming step (Step S6 and Step S7) is executed. In the processing film forming step, the processing liquid on the substrate W is solidified or cured to form a processing film 100 (refer to FIG. 5C) on the upper surface of the substrate W.

In the processing film forming step, the film thinning step (spin off step) (Step S6) is executed. In the film thinning step, the processing liquid valve 51 is first closed. Thereby, supply of the processing liquid to the substrate W is stopped. Then, the second nozzle moving unit 37 moves the second moving nozzle 9 to the home position.

Figure 5B:
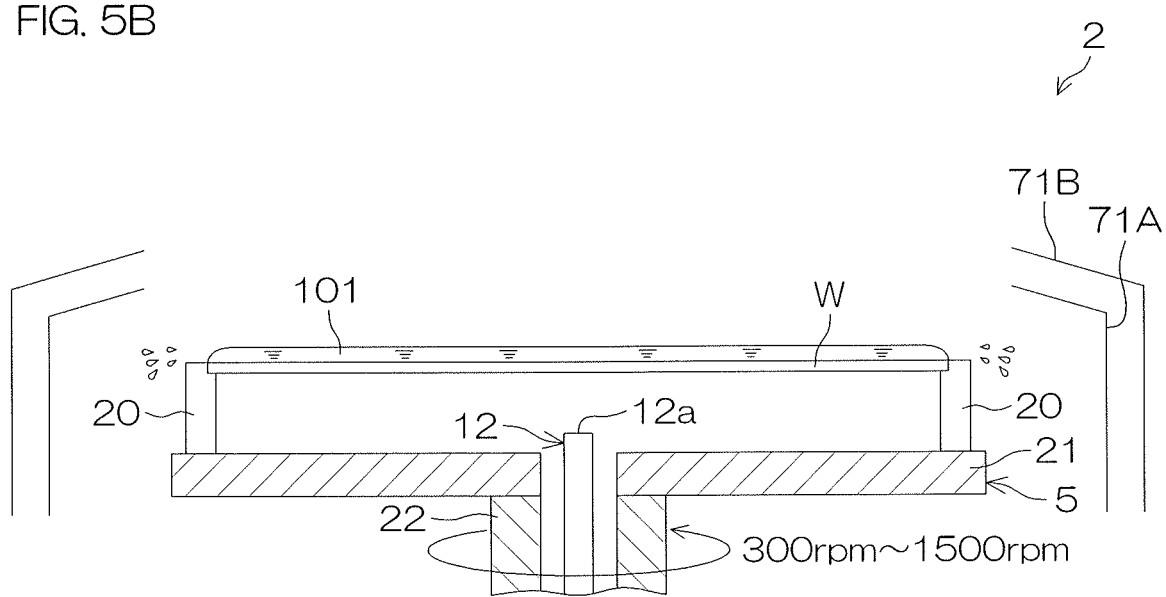
FIG. 5B is a schematic view for describing conditions of a film thinning step (Step S6) in the substrate processing.

As shown in FIG. 5B, in the film thinning step, in a state where supply of the processing liquid to the upper surface of the substrate W is stopped, the processing liquid is partially eliminated from the upper surface of the substrate W due to a centrifugal force such that a thickness of the processing liquid film 101 on the substrate W becomes an appropriate thickness. In the film thinning step, the facing member 6, the first guard 71A and the second guard 71B are kept at the upper position.

In the film thinning step, the spin motor 23 changes a rotational speed of the substrate W to a predetermined film thinning speed. The film thinning speed is, for example, 300 rpm to 1500 rpm. The rotational speed of the substrate W may be kept fixed within a range of 300 rpm to 1500 rpm or may be changed whenever necessary within a range of 300 rpm to 1500 rpm in the middle of the film thinning step. The film thinning step is executed for a predetermined time, for example, 30 seconds.

In the processing film forming step, there is executed the heating step (Step S7) in which the substrate W is heated after the film thinning step. In the heating step, in order to partially volatilize (evaporate) a solvent of the processing liquid on the substrate W, the processing liquid film 101 (refer to FIG. 5B) on the substrate W is heated.

Figure 5C:
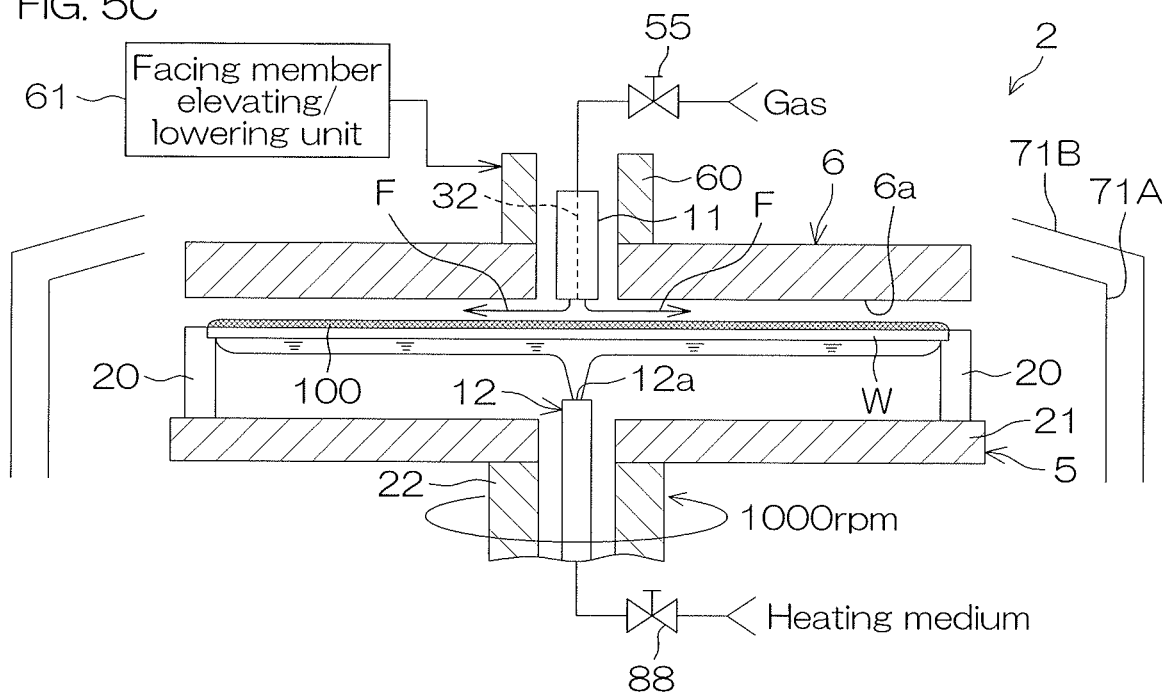
FIG. 5C is a schematic view for describing conditions of a heating step (Step S7) in the substrate processing.

Specifically, as shown in FIG. 5C, the facing member elevating/lowering unit 61 moves the facing member 6 to a proximity position between the upper position and the lower position. The proximity position may be the lower position. The proximity position is such a position that a distance from the upper surface of the substrate W to the facing surface 6a is, for example, 1 mm. In the heating step, the first guard 71A and the second guard 71B are kept at the upper position.

Then, the gas valve 55 is opened. Thereby, a gas is supplied from the central nozzle 11 to a space between the upper surface of the substrate W (the upper surface of the processing liquid film 101) and the facing surface 6a of the facing member 6 (the gas supplying step). Thereby, evaporation of the solvent in the processing liquid film 101 is promoted (the solvent evaporating step, the solvent evaporation promoting step). Therefore, time necessary for forming the processing film 100 can be reduced. The central nozzle 11 functions as an evaporating unit (an evaporation promoting unit) for evaporating the solvent in the processing liquid.

Then, the heating medium valve 88 is opened. Thereby, a heating medium is supplied (discharged) from the lower surface nozzle 12 toward the central region on the lower surface of the substrate W in the rotating state (the heating medium supplying step, the heating medium discharging step). The heating medium supplied from the lower surface nozzle 12 to the lower surface of the substrate W spreads radially by being subjected to a centrifugal force and extends across the entire lower surface of the substrate W. Supply of the heating medium to the substrate W continues for a predetermined time, for example, 60 seconds. In the heating step, the substrate W is rotated at a predetermined heating rotational speed, for example, 1000 rpm.

The heating medium is supplied to the lower surface of the substrate W, so that the processing liquid film 101 on the substrate W is heated via the substrate W. Thereby, evaporation of the solvent in the processing liquid film 101 is promoted (the solvent evaporating step, the solvent evaporation promoting step). Therefore, time necessary for forming the processing film 100 can be reduced. The lower surface nozzle 12 functions as an evaporating unit (an evaporation promoting unit) for evaporating the solvent in the processing liquid.

The film thinning step and the heating step are executed, so that the processing liquid is solidified or cured to form the processing film 100 on the substrate W. As described above, the substrate rotating unit (the spin motor 23), the central nozzle 11 and the lower surface nozzle 12 are included in a solid forming unit which solidifies and cures the processing liquid to form a solid (the processing film 100).

In the heating step, it is preferable that the substrate W is heated such that a temperature of the processing liquid on the substrate W is lower than a boiling point of the solvent. The processing liquid is heated at a temperature lower than a boiling point of the solvent, so that the solvent can be made to remain appropriately in the processing film 100. Thereby, the peeling liquid is made to conform with the processing film 100 more easily in the subsequent peeling step by interaction of the solvent remaining in the processing film 100 with the peeling liquid than a case in which no solvent remains in the processing film 100. Therefore, the processing film 100 is made easily peelable by the peeling liquid.

The heating medium splashed outside the substrate W due to a centrifugal force is received by the first guard 71A. There is a case in which the heating medium received by the first guard 71A may be splashed back from the first guard 71A. However, since the facing member 6 is kept close to the upper surface of the substrate W, the upper surface of the substrate W can be protected from the heating medium splashed back from the first guard 71A. Consequently, since it is possible to suppress attachment of the heating medium to an upper surface of the processing film 100, occurrence of particles resulting from the heating medium splashed back from the first guard 71A can be suppressed.

Further, a gas is supplied from the central nozzle 11 to form a gas stream F which moves from the central region on the upper surface of the substrate W toward a peripheral edge of the upper surface of the substrate W at a space between the facing surface 6a of the facing member 6 and the upper surface of the substrate W. The gas stream F which moves from the central region on the upper surface of the substrate W toward the peripheral edge of the upper surface of the substrate W is formed, so that the heating medium splashed back from the first guard 71A can be pushed back toward the first guard 71A. Consequently, it is possible to further suppress attachment of the heating medium to the upper surface of the processing film 100.

Next, the buffering step (Step S8) is executed. Specifically, the heating medium valve 88 is closed. Thereby, supply of the heating medium to the lower surface of the substrate W is stopped. Then, the gas valve 55 is closed. Thereby, supply of a gas to a space between the facing surface 6a of the facing member 6 and the upper surface of the substrate W is stopped.

Figure 5D:
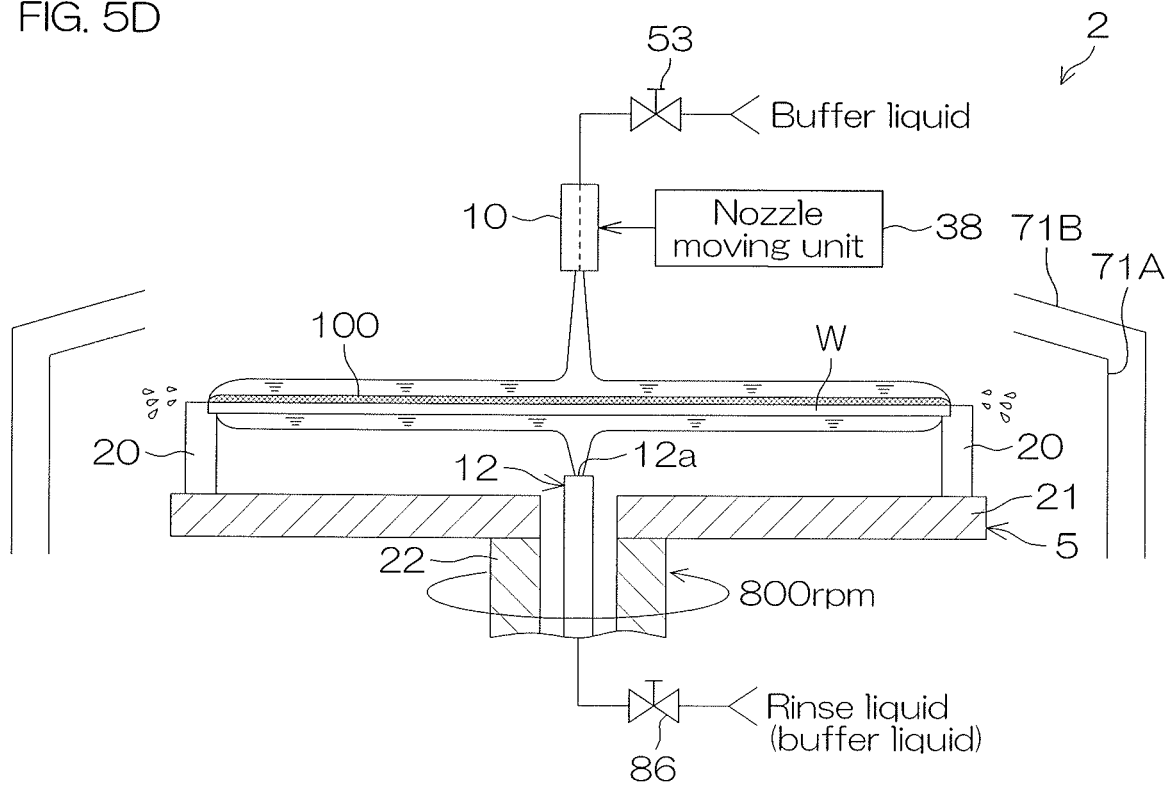
FIG. 5D is a schematic view for describing conditions of a buffering step (Step S8) in the substrate processing.

Then, the facing member elevating/lowering unit 61 moves the facing member 6 to the upper position. Then, as shown in FIG. 5D, the third nozzle moving unit 38 moves the third moving nozzle 10 to a processing position. The processing position of the third moving nozzle 10 is, for example, the central position. In the buffering step, the substrate W is rotated at a predetermined buffering rotational speed, for example, 800 rpm.

Then, the upper buffer liquid valve 53 is opened. Thereby, a buffer liquid is supplied (discharged) from the third moving nozzle 10 toward the central region on the upper surface of the substrate W in the rotating state (the buffer liquid supplying step, the buffer liquid discharging step). The buffer liquid supplied to the upper surface of the substrate W spreads across the entire upper surface of the substrate W due to a centrifugal force. Supply of the buffer liquid to the upper surface of the substrate W continues for a predetermined time, for example, 60 seconds.

In a case where the peeling liquid which is supplied to the substrate W in the next peeling step (Step S9) is high in concentration, in particular, at the start of supplying the peeling liquid, the liquid may act locally on the upper surface of the substrate W. Thus, the buffer liquid is supplied to the upper surface of the substrate W before supply of the peeling liquid, thus making it possible to buffer actions of the peeling liquid on the processing film 100. It is, thereby, possible to avoid acting locally on the peeling liquid on the upper surface of the substrate W. Thus, the peeling liquid can be uniformly applied to the entire upper surface of the substrate W.

Next, the peeling step (Step S9) is executed. In the peeling step, the substrate W is rotated at a predetermined peeling rotational speed, for example, 800 rpm.

Figure 5E:
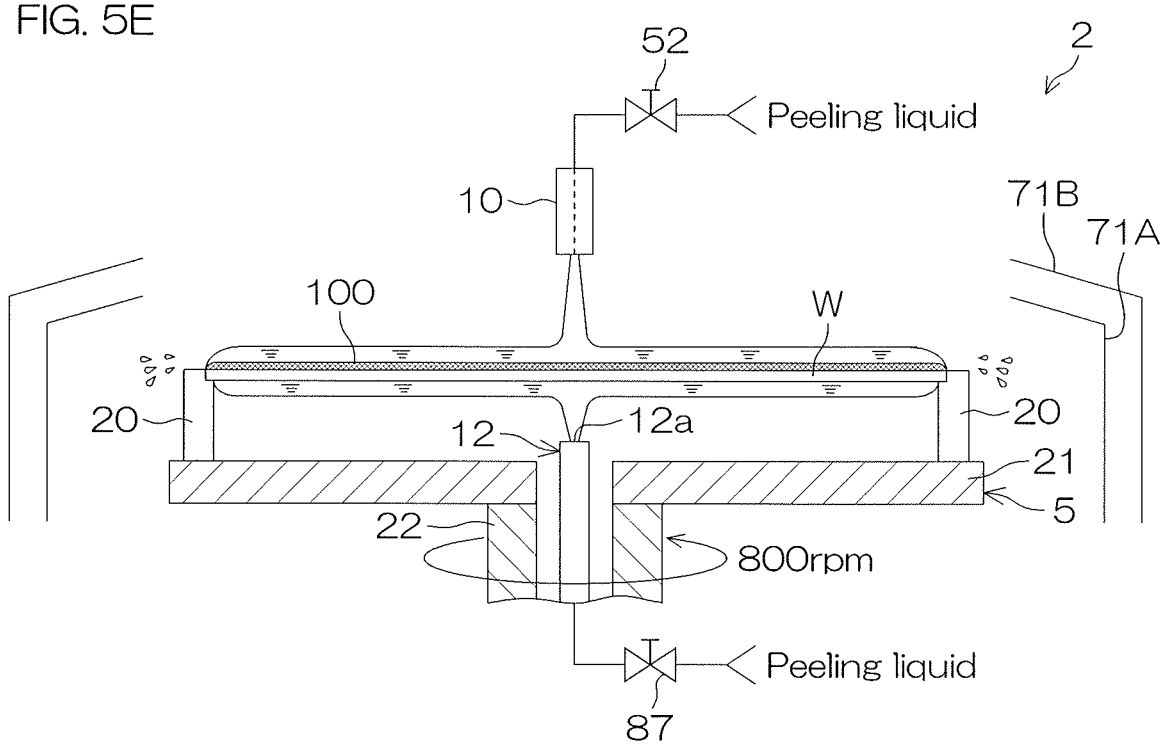
FIG. 5E is a schematic view for describing conditions of a peeling step (Step S9) in the substrate processing.

Then, the upper buffer liquid valve 53 is closed. Thereby, supply of the buffer liquid to the upper surface of the substrate W is stopped. Then, as shown in FIG. 5E, the upper peeling liquid valve 52 is opened. Thereby, the peeling liquid is supplied (discharged) from the third moving nozzle 10 toward the central region on the upper surface of the substrate W in the rotating state (the upper peeling liquid supplying step, the upper peeling liquid discharging step). The peeling liquid supplied to the upper surface of the substrate W spreads across the entire upper surface of the substrate W due to a centrifugal force. Supply of the peeling liquid to the upper surface of the substrate W continues for a predetermined time, for example, 60 seconds.

The peeling liquid is supplied to the upper surface of the substrate W, so that the processing film 100 is peeled from the upper surface of the substrate W. When peeled from the upper surface of the substrate W, the processing film 100 is split into film fragments. Then, the split film fragments of the processing film 100 are subjected to a centrifugal force due to rotation of the substrate W and eliminated outside the substrate W, together with the peeling liquid. Thereby, a removal object is removed from the upper surface of the substrate W together with the processing film 100 (the removing step).

Here, there is a case in which the processing liquid supplied to the upper surface of the substrate W in the processing liquid supplying step (Step S5) shown in FIG. 5A may follow a peripheral edge of the substrate W to reach the lower surface of the substrate W. There is also a case in which the processing liquid splashed from the substrate W may be splashed back from the first guard 71A to attach on the lower surface of the substrate W. Even in these cases, as shown in FIG. 5C, in the heating step (Step S7), a heating medium is supplied to the lower surface of the substrate W. It is, thus, possible to eliminate the processing liquid from the lower surface of the substrate W due to a flow of the heating medium.

There is also a case in which the processing liquid attached to the lower surface of the substrate W may be solidified or cured to form a solid due to the processing liquid supplying step (Step S5). Even in this case, as shown in FIG. 5E, while the peeling liquid is supplied to the upper surface of the substrate W in the peeling step (Step S9), the lower peeling liquid valve 87 is opened to supply (discharge) the peeling liquid from the lower surface nozzle 12 to the lower surface of the substrate W, thus making it possible to peel the solid from the lower surface of the substrate W (the lower peeling liquid supplying step, the lower peeling liquid discharging step).

Further, as shown in FIG. 5D, while the buffer liquid is supplied to the upper surface of the substrate W in the buffering step (Step S8), the lower rinse liquid valve 86 is opened to supply (discharge) the rinse liquid as the buffer liquid from the lower surface nozzle 12 to the lower surface of the substrate W. Thereby, it is possible to buffer peeling actions of the peeling liquid supplied to the lower surface of the substrate W (the lower buffer liquid supplying step, the lower buffer liquid discharging step).

Figure 5F:
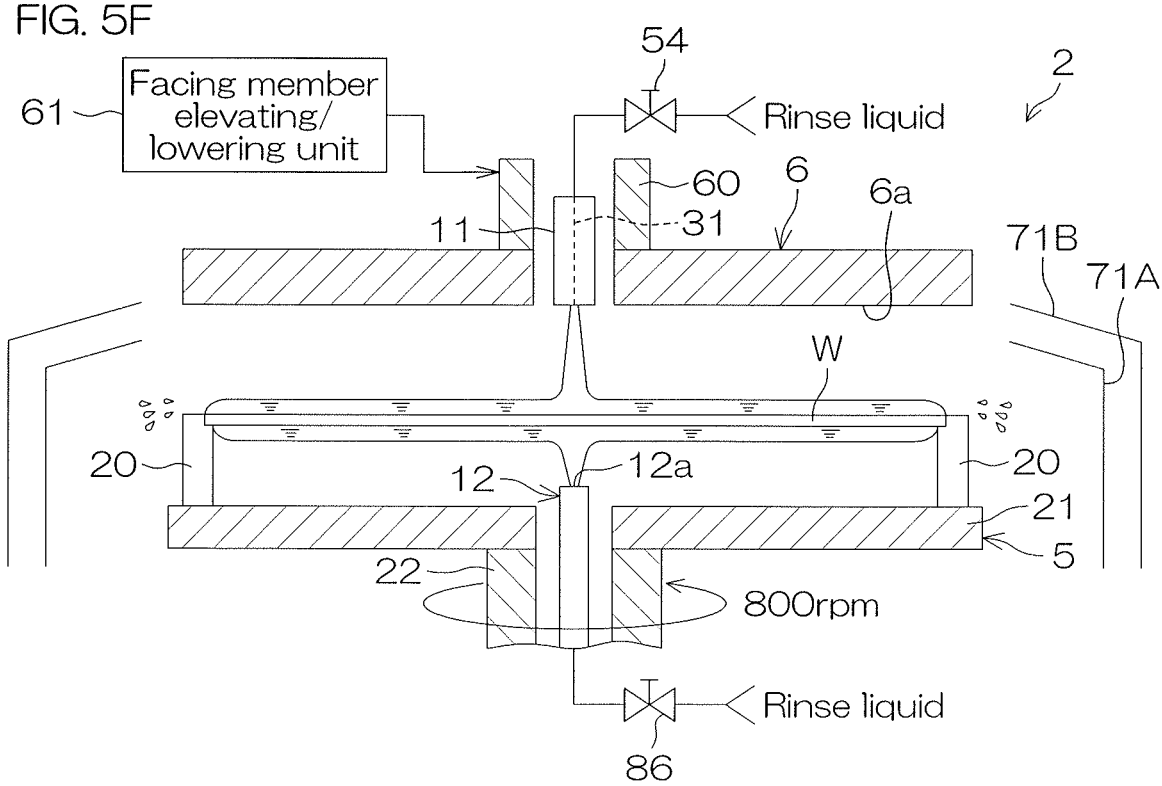
FIG. 5F is a schematic view for describing conditions of a second rinsing step (Step S10) in the substrate processing.

After the peeling step (Step S9), the second rinsing step (Step S10) is executed. Specifically, the upper peeling liquid valve 52 and the lower peeling liquid valve 87 are closed. Thereby, supply of the peeling liquid to the upper surface and the lower surface of the substrate W is stopped. Then, the third nozzle moving unit 38 moves the third moving nozzle 10 to the home position. Then, as shown in FIG. 5F, the facing member elevating/lowering unit 61 moves the facing member 6 to the processing position. In the second rinsing step, the substrate W is rotated for a predetermined second rinse rotational speed, for example, 800 rpm. The first guard 71A and the second guard 71B are kept at the upper position.

Then, the upper rinse liquid valve 54 is opened. Thereby, the rinse liquid is supplied (discharged) from the central nozzle 11 to the central region on the upper surface of the substrate W in the rotating state (the second upper rinse liquid supplying step, the second upper rinse liquid discharging step). The rinse liquid supplied to the upper surface of the substrate W spreads across the entire upper surface of the substrate W due to a centrifugal force. Thereby, the peeling liquid attached to the upper surface of the substrate W is washed away with the rinse liquid.

Then, the lower rinse liquid valve 86 is opened. Thereby, the rinse liquid is supplied (discharged) from the lower surface nozzle 12 toward the central region on the lower surface of the substrate W in the rotating state (the second lower rinse liquid supplying step, the second lower rinse liquid discharging step). Thereby, the peeling liquid attached to the lower surface of the substrate W is washed away with the rinse liquid. Supply of the rinse liquid to the upper surface and the lower surface of the substrate W continues for a predetermined time, for example, 35 seconds.

Figure 5G:
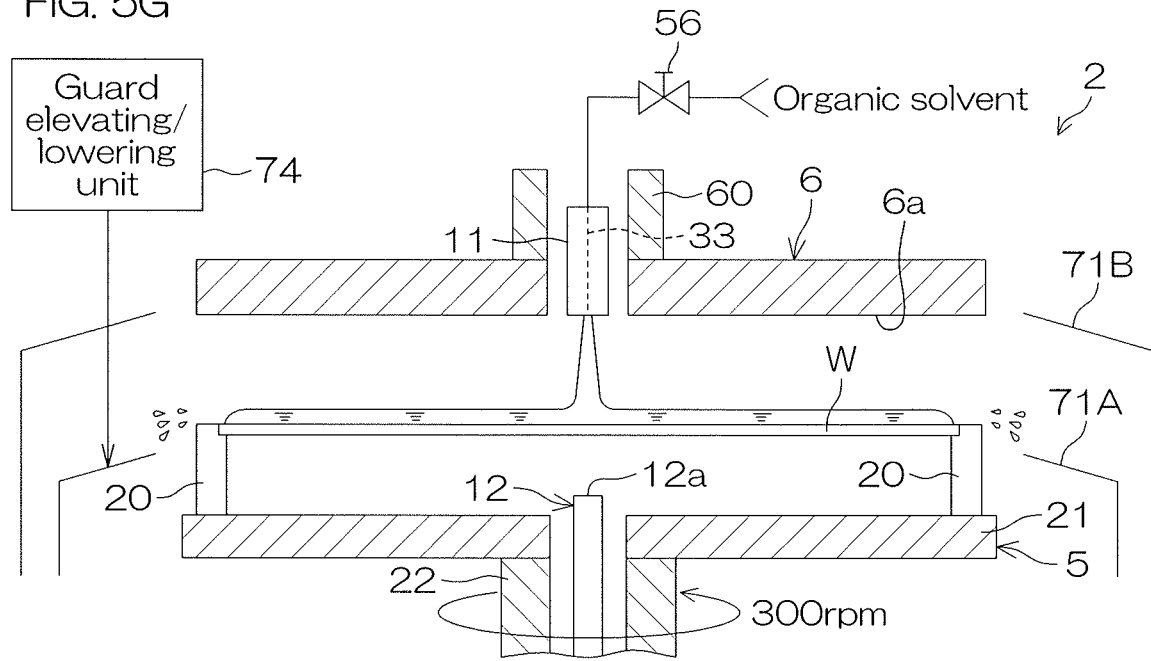
FIG. 5G is a schematic view for describing conditions of a second organic solvent supplying step (Step S11) in the substrate processing.

Next, the second organic solvent supplying step (Step S11) is executed. Specifically, as shown in FIG. 5G, the guard elevating/lowering unit 74 moves the first guard 71A to the lower position. Then, the facing member 6 is kept at the processing position. In the second organic solvent supplying step, the substrate W is rotated at a predetermined second organic solvent rotational speed, for example, 300 rpm.

Then, the upper rinse liquid valve 54 and the lower rinse liquid valve 86 are closed. Thereby, supply of the rinse liquid to the upper surface and the lower surface of the substrate W is stopped. Then, as shown in FIG. 5G, the organic solvent valve 56 is opened. Thereby, the organic solvent is supplied (discharged) from the central nozzle 11 toward the central region on the upper surface of the substrate W in the rotating state (the second organic solvent supplying step, the second organic solvent discharging step, the residue removing liquid supplying step). Supply of the organic solvent to the upper surface of the substrate W continues for a predetermined time, for example, 30 seconds.

The organic solvent supplied to the upper surface of the substrate W spreads radially by being subjected to a centrifugal force and spreads across the entire upper surface of the substrate W. Thereby, the rinse liquid on the upper surface of the substrate W is replaced with the organic solvent. The organic solvent supplied to the upper surface of the substrate W is removed from a peripheral edge of the upper surface of the substrate W after dissolution of residue of the processing film 100 remaining on the upper surface of the substrate W (the residue removing step).

Figure 5H:
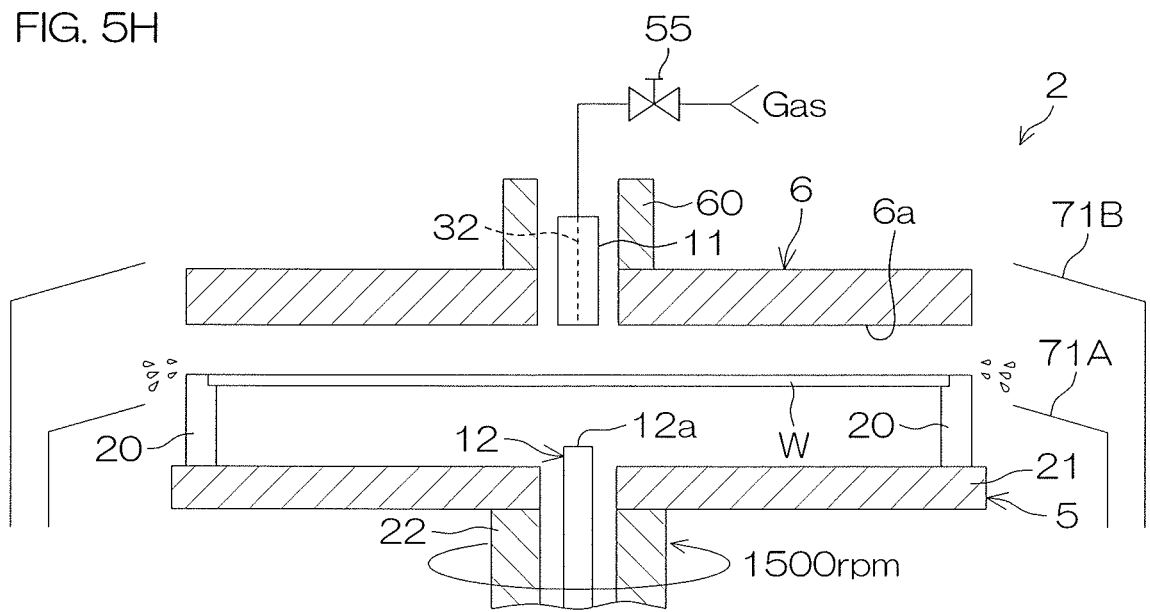
FIG. 5H is a schematic view for describing conditions of a spin drying step (Step S12) in the substrate processing.

Next, the spin drying step (Step S12) is executed. Specifically, the organic solvent valve 56 is closed. Thereby, supply of the organic solvent to the upper surface of the substrate W is stopped. Then, as shown in FIG. 5H, the facing member elevating/lowering unit 61 moves the facing member 6 to a drying position lower than the processing position. When the facing member 6 is positioned at the drying position, a distance between the facing surface 6a of the facing member 6 and the upper surface of the substrate W is, for example, 1.5 mm. Then, the gas valve 55 is opened. Thereby, a gas is supplied to a space between the upper surface of the substrate W and the facing surface 6a of the facing member 6.

Then, the spin motor 23 accelerates rotation of the substrate W to rotate the substrate W at a high speed. The substrate W is rotated at a drying speed, for example, 1500 rpm in the spin drying step. The spin drying step is executed for a predetermined time, for example, 30 seconds. Thereby, a great centrifugal force is applied to the organic solvent on the substrate W, by which the organic solvent on the substrate W is scattered around the substrate W. In the spin drying step, a gas is supplied to a space between the upper surface of the substrate W and the facing surface 6a of the facing member 6 to promote evaporation of the organic solvent.

Then, the spin motor 23 stops rotation of the substrate W. The guard elevating/lowering unit 74 moves the first guard 71A and the second guard 71B to the lower position. The gas valve 55 is closed. Then, the facing member elevating/lowering unit 61 moves the facing member 6 to the upper position.

The transfer robot CR enters into the processing unit 2, lifts up a processed substrate W from the chuck pin 20 of the spin chuck 5 and carries it outside the processing unit 2 (Step S13). The substrate W is transferred from the transfer robot CR to the transfer robot IR and housed in a carrier C by the transfer robot IR.

Figure 6A:
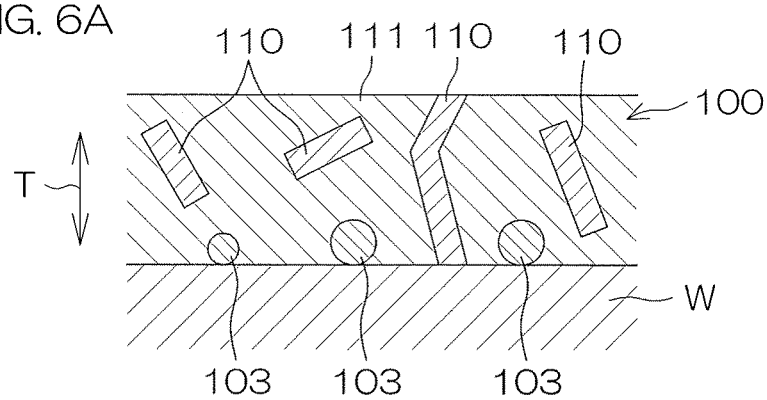
FIG. 6A is a schematic sectional view for describing conditions in the vicinity of a front surface of a substrate after the heating step (Step S7).
Figure 6B:
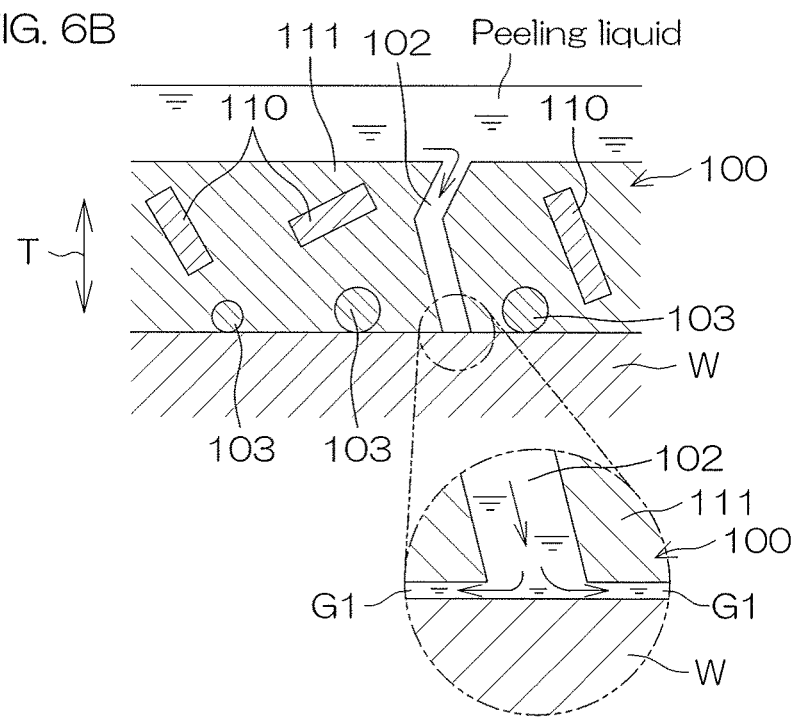
FIG. 6B is a schematic sectional view for describing conditions in the vicinity of the front surface of the substrate while execution of the peeling step (Step S9) is in progress.
Figure 6C:
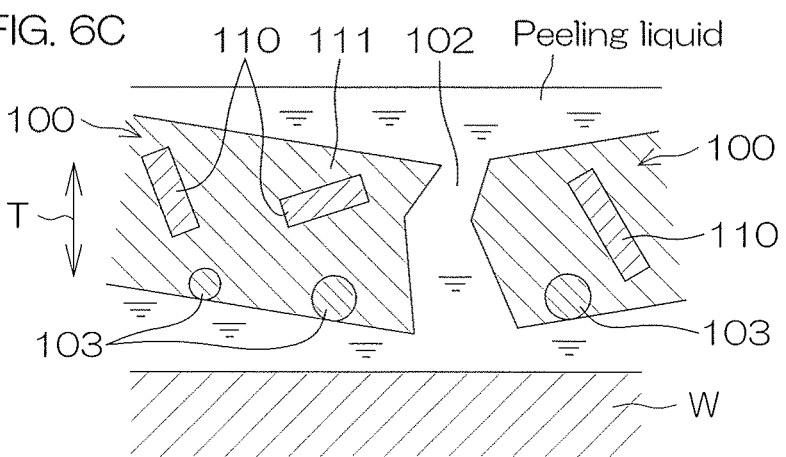
FIG. 6C is a schematic sectional view for describing conditions in the vicinity of the front surface of the substrate while execution of the peeling step (Step S9) is in progress.

Next, with reference to FIG. 6A to FIG. 6C, a description will be given of conditions in which the processing film 100 is peeled from the substrate W. FIG. 6A shows conditions in the vicinity of the upper surface of the substrate W after the heating step (Step S7). FIG. 6B and FIG. 6C show conditions in the vicinity of the upper surface of the substrate W while execution of the peeling step (Step S9) is in progress.

In the heating step, as described previously, the processing liquid film 101 on a substrate W is heated by a heating medium via the substrate W. Thereby, as shown in FIG. 6A, there is formed the processing film 100 which holds a removal object 103 such as particles. In detail, the solvent is at least partially evaporated, so that a first component contained in the solute of the processing liquid forms a first solid 110 and a second component contained in the solute of the processing liquid forms a second solid 111.

Then, with reference to FIG. 6B, the processing film 100 is partially dissolved in the peeling step. When the peeling liquid is supplied to the upper surface of the substrate W, the first solid 110 which is formed by the first component higher in solubility in the peeling liquid than the second component is mainly dissolved. Thereby, a penetrating hole 102 is formed at a portion in which the first solid 110 is locally present in the processing film 100 (the penetrating hole forming step). The penetrating hole 102 is likely to be formed in particular at a portion in which the first solid 110 extends in a thickness direction T of the substrate W (also, a thickness direction of the processing film 100). The penetrating hole 102 is, for example, several nanometers (nm) in diameter in a plan view.

The second solid 111 is also dissolved in the peeling liquid. However, since the second component is lower in solubility in the peeling liquid than the first component, the second solid 111 only in the vicinity of the front surface thereof is slightly dissolved by the peeling liquid. Therefore, the peeling liquid which has reached the vicinity of the upper surface of the substrate W via the penetrating hole 102 slightly dissolves a portion of the second solid 111 which is in the vicinity of the upper surface of the substrate W. Thereby, as shown in an enlarged view of FIG. 6B, while gradually dissolving the second solid 111 in the vicinity of the upper surface of the substrate W, the peeling liquid enters into a gap G1 between the processing film 100 and the upper surface of the substrate W (the peeling liquid entry step).

Then, for example, with a peripheral edge of the penetrating hole 102 given as a starting point, the processing film 100 is split into film fragments, and as shown in FIG. 6C, the film fragments of the processing film 100 are peeled from the substrate W, in a state of holding a removal object 103 (the processing film splitting step, peeling step). Then, in a state of being held by the processing film 100, the removal object 103 is pushed outside the substrate W together with the processing film 100 and removed from the upper surface of the substrate W (the removing step).

There can be found a case in which the peeling liquid hardly dissolves the second solid 111. Even in this case, the peeling liquid enters into the narrow gap G1 between the processing film 100 and the upper surface of the substrate W, by which the processing film 100 is peeled from the substrate W.

According to the first preferred embodiment, the processing liquid supplied to an upper surface of a substrate W is solidified or cured to form the processing film 100 which holds the removal object 103. Thereafter, the peeling liquid is supplied to the upper surface of the substrate W. Thereby, the processing film 100 is partially dissolved to form a penetrating hole 102 on the processing film 100. The penetrating hole 102 is formed on the processing film 100, so that the peeling liquid reaches easily the vicinity of the upper surface of the substrate W. Therefore, the peeling liquid can be made to act on an interface between the processing film 100 and the substrate W, thus making it possible to efficiently peel the processing film 100 from the upper surface of the substrate W. On the other hand, although the processing film 100 is partially dissolved by the peeling liquid for formation of the penetrating hole 102, a remaining portion thereof is kept in a solid state. As a result, it is possible to efficiently remove the removal object 103 from the upper surface of the substrate W together with the processing film 100.

Further, according to the first preferred embodiment, in the peeling step, the peeling liquid enters between the processing film 100 and the upper surface of the substrate W via the penetrating hole 102. Therefore, the peeling liquid can be made to act on an interface between the processing film 100 and the substrate W, thus making it possible to more efficiently peel the processing film 100 from the front surface of the substrate.

Further, according to the first preferred embodiment, the first component is higher in degree of solubility in the peeling liquid than the second component. Therefore, the first solid 110 formed by the first component is more easily dissolved in the peeling liquid than the second solid 111 formed by the second component.

Therefore, while the peeling liquid is used to dissolve the first solid 110 and reliably form the penetrating hole 102, the second solid 111 can be kept in a solid state without dissolution of the second solid 111 in the peeling liquid. Consequently, the peeling liquid can be made to act on an interface between the second solid 111 and the substrate W, in a state where a removal object is held by the second solid 111. As a result, while the second solid 111 is smoothly peeled from the upper surface of the substrate W, it is possible to efficiently remove the removal object 103 from the upper surface of the substrate W, together with the second solid 111.

Further, according to the first preferred embodiment, the contained amount of the second component is larger than the contained amount of the first component in the processing liquid. A portion of the processing film 100 which is dissolved by the peeling liquid can be reduced as compared with a configuration in which the contained amount of the second component in the processing liquid is smaller than the contained amount of the first component in the processing liquid. Therefore, it is possible to reduce the removal object 103 detached from the processing film 100 in association with partial dissolution of the processing film 100. Consequently, most of the removal object 103 can be removed from the upper surface of the substrate W, together with the processing film 100. While reattachment of the removal object 103 to the substrate W is suppressed, it is, thus, possible to efficiently eliminate the removal object 103 outside the substrate W.

Further, a portion of the processing film 100 which is dissolved by the peeling liquid is smaller than a configuration in which the contained amount of the second component in the processing liquid is smaller than the contained amount of the first component in the processing liquid. Therefore, the processing film 100 can be split into relatively large film fragments. Since the processing film 100 is split into relatively large film fragments, the film fragments can be increased in surface area which receives a force from a flow of the peeling liquid. Consequently, the fragments are easily removed outside the substrate W by the flow of the peeling liquid. Therefore, it is possible to efficiently remove the removal object 103 from the substrate W together with the processing film 100.

Further, according to the first preferred embodiment, in the film thinning step, the processing liquid film 101 on the substrate W is thinned. Therefore, in the heating step, the processing liquid is solidified or cured to form the processing film 100 which is thinned is formed. Therefore, in the peeling step, a distance (film thickness) in which the peeling liquid penetrates through the processing film 100 can be made short in the thickness direction T. As a result, the peeling liquid smoothly enters between the processing film 100 and the upper surface of the substrate W, so that the processing film 100 can be smoothly peeled to efficiently remove the removal object 103 outside the substrate W.

Further, according to the first preferred embodiment, there is formed the processing film 100 in which a solvent remains inside. Therefore, the peeling liquid is made to conform with the processing film 100 in the subsequent peeling step more easily than a case in which no solvent remains in the interior of the processing film 100. Consequently, the penetrating holes 102 which are distributed uniformly on the front surface of the processing film 100 are easily formed. As a result, the peeling liquid reaches an interface between the processing film 100 and the upper surface of the substrate W at every site of the processing film 100, thus making it possible to smoothly peel the processing film 100.

In the first preferred embodiment, the first component and the second component are contained in the solute which is contained in the processing liquid discharged from the second moving nozzle 9. However, in addition to the first component and the second component, the third component higher in degree of solubility in the peeling liquid than the second component and lower in degree of solubility than the first component may be contained in the solute contained in the processing liquid discharged from the second moving nozzle 9.

The third component is, for example, the same synthetic resin as the first component and the second component. That is, as the third component and as examples of synthetic resins used as the solute, acrylic resins, phenol resins, epoxy resins, melamine resins, urea resins, unsaturated polyester resins, alkyd resins, polyurethane, polyimide, polyethylene, polypropylene, polyvinyl chloride, polystyrene, polyvinyl acetate, polytetrafluoroethylene, acrylonitrile-butadiene-styrene resins, acrylonitrile-styrene resins, polyamide, polyacetal, polycarbonate, polyvinyl alcohol, modified polyphenylene ether, polybutylene terephthalate, polyethylene terephthalate, polyphenylene sulfide, polysulfone, polyether ether ketone, polyamide-imide, etc., can be used.

Figure 7A:
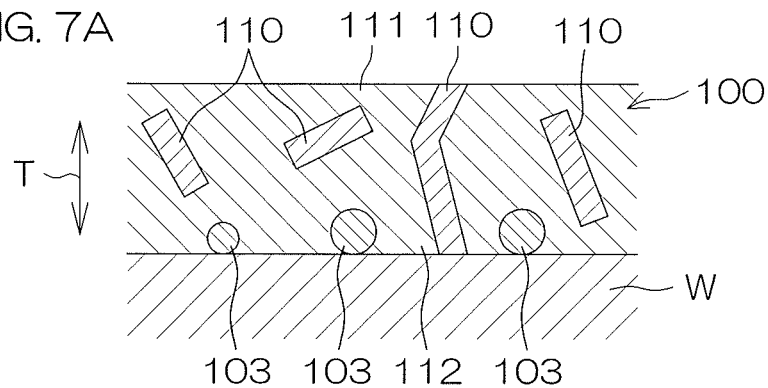
FIG. 7A is a schematic sectional view for describing conditions in the vicinity of a front surface of a substrate after a heating step (Step S7) in substrate processing according to a modification of the first preferred embodiment.

In this case, as shown in FIG. 7A, in addition to the first solid 110 and the second solid 111, a third solid 112 formed by the third component is contained in the processing film 100 formed in the processing film forming step. The third solid 112 is distributed across the entire processing film 100, for example. That is, the third solid 112 is also formed at a portion of the processing film 100 which is adjacent to an upper surface of a substrate W.

The third solid 112 is lower in adhesion to a substrate W than the second solid 111. In other words, interaction of the third solid 112 with an upper surface of a substrate W is weaker than interaction of the second solid 111 with the upper surface of the substrate. That is, the third solid 112 is more easily peelable from the upper surface of the substrate W than the second solid 111.

Figure 7B:
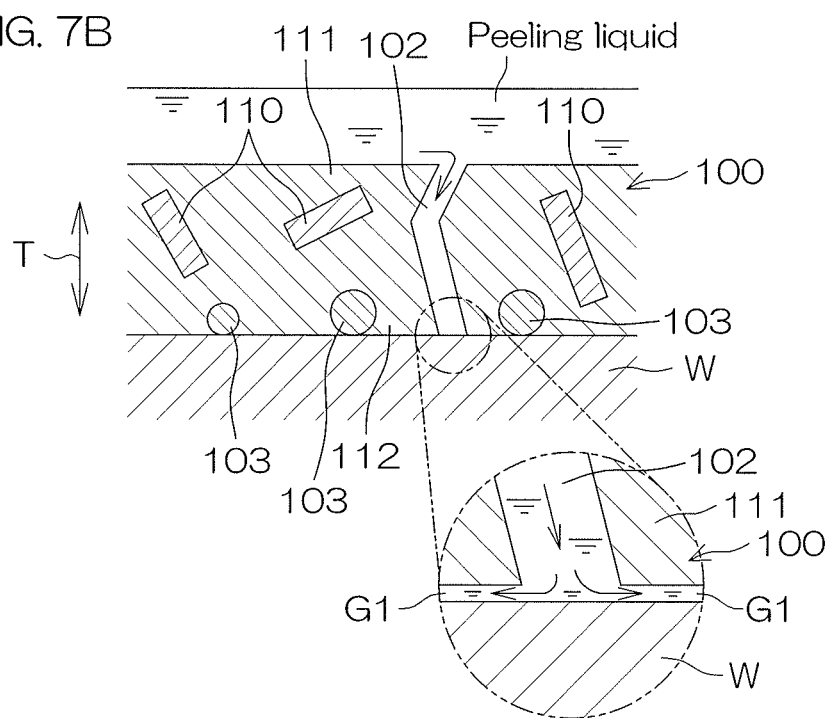
FIG. 7B is a schematic sectional view for describing conditions in the vicinity of the front surface of the substrate while execution of a peeling step (Step S9) is in progress in the substrate processing according to the modification of the first preferred embodiment.

Then, as shown in FIG. 7B, in the peeling step, the first solid 110 is dissolved by the peeling liquid to form a penetrating hole 102. Then, the peeling liquid reaches the vicinity of an upper surface of a substrate W via the penetrating hole 102. As with the first preferred embodiment, a portion of the processing film 100 which is close to the upper surface of the substrate W is dissolved. In detail, as shown in an enlarged view of FIG. 7B, while the peeling liquid gradually dissolves the second solid 111 and the third solid 112 in the vicinity of the upper surface of the substrate W, the peeling liquid enters into the gap G1 between the processing film 100 and the upper surface of the substrate W (the peeling liquid entry step).

Figure 7C:
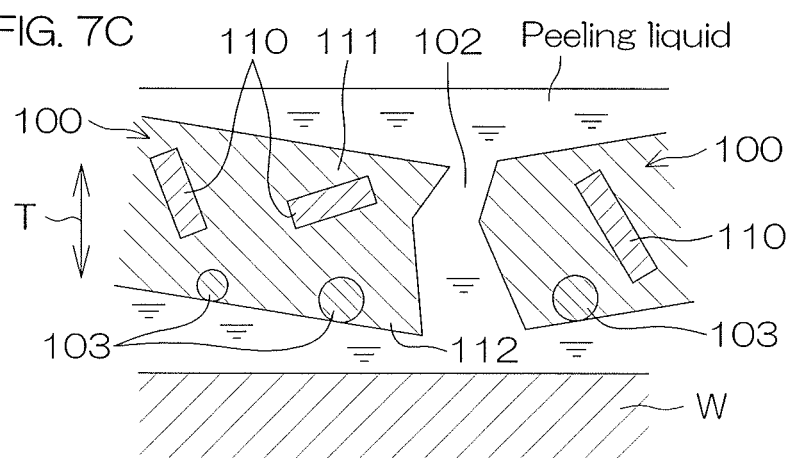
FIG. 7C is a schematic sectional view for describing conditions in the vicinity of the front surface of the substrate while execution of the peeling step (Step S9) is in progress in the substrate processing according to the modification of the first preferred embodiment.

Then, for example, with a peripheral edge of the penetrating hole 102 given as a starting point, the processing film 100 is split into film fragments. As shown in FIG. 7C, the film fragments of the processing film 100 are peeled from a substrate W, while holding the removal object 103 (the processing film splitting step, the peeling step). Then, the removal object 103 is pushed outside the substrate W together with the processing film 100 in a state of being held by the processing film 100 and removed from the upper surface of the substrate W (the removing step).

In this modification, the third component is higher in degree of solubility in the peeling liquid than the second component and lower in degree of solubility in the peeling liquid than the first component. Therefore, the third solid 112 formed by the third component is more easily dissolved in the peeling liquid than the second solid 111 formed by the second component and less likely to be dissolved in the peeling liquid than the first solid 110 formed by the first component.

Therefore, the peeling liquid is used to dissolve the first solid 110, thus making it possible to reliably form the penetrating hole 102. Then, it is possible to dissolve the third solid 112 positioned at a portion of the processing film 100 adjacent to the upper surface of a substrate W by the peeling liquid which has entered in the vicinity of the upper surface of the substrate W via the penetrating hole 102. The third solid 112 is more easily dissolved in the peeling liquid than the second solid 111 and, therefore, the processing film 100 is peeled more easily by the peeling liquid than a configuration in which no third solid 112 is present at a portion of the processing film 100 adjacent to the upper surface of the substrate W.

On the other hand, the second solid 111 can be kept in a solid state in the peeling liquid. Consequently, the peeling liquid can be made to act on an interface between the second solid 111 and the substrate, in a state where the removal object 103 is held by the second solid 111. As a result, while the processing film 100 (the second solid 111) is smoothly peeled from the upper surface of the substrate W, it is possible to efficiently remove the removal object 103 from the upper surface of the substrate W, together with the processing film 100 (the second solid 111).

Second Preferred Embodiment

Figure 8:
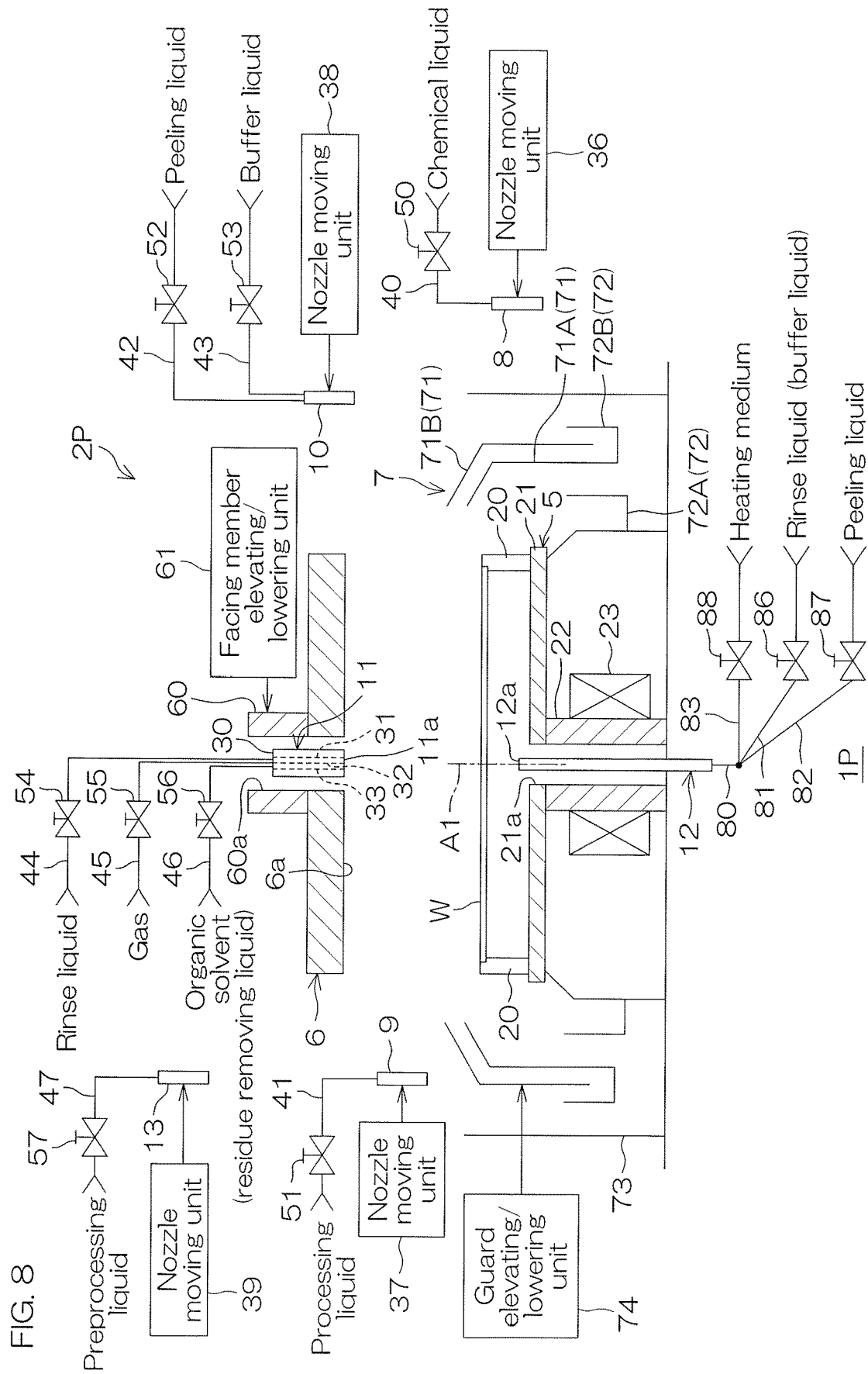
FIG. 8 is a schematic partial sectional view which shows a brief configuration of a processing unit included in a substrate processing apparatus according to a second preferred embodiment.

FIG. 8 is a schematic partial sectional view which shows a brief configuration of a processing unit 2P included in a substrate processing apparatus 1P according to the second preferred embodiment. In FIG. 8, portions which are the same as those so far described will be given the same reference numbers, with a description thereof being omitted (this is also applicable to FIG. 9 to FIG. 10D to be described later).

With reference to FIG. 8, the processing unit 2P is mainly different from the processing unit 2 (refer to FIG. 2) according to the first preferred embodiment in that the processing unit 2P according to the second preferred embodiment includes a fourth moving nozzle 13.

The fourth moving nozzle 13 is an example of a preprocessing liquid supplying unit which supplies (discharges) a preprocessing liquid toward an upper surface of a substrate W held by a spin chuck 5.

The fourth moving nozzle 13 is moved by a fourth nozzle moving unit 39 in a horizontal direction and in a vertical direction. The fourth moving nozzle 13 is able to move between a center position and a home position (a retreat position). When positioned at the center position, the fourth moving nozzle 13 faces a rotation center on the upper surface of the substrate W.

When positioned at the home position, the fourth moving nozzle 13 does not face the upper surface of the substrate W and is positioned outside a processing cup 7 in a plan view. The fourth moving nozzle 13 moves in the vertical direction and is thereby capable of moving close to the upper surface of the substrate W and retreating upward from the upper surface of the substrate W.

The fourth nozzle moving unit 39 has the same configuration as the first nozzle moving unit 36. That is, the fourth nozzle moving unit 39 includes, for example, a pivoting shaft (not shown) oriented along a vertical direction, an arm (not shown) which is coupled to the pivoting shaft and the fourth moving nozzle 13 and extends horizontally and a pivoting shaft driving unit (not shown) which elevates, lowers and pivots the pivoting shaft.

The fourth moving nozzle 13 is connected to a preprocessing liquid piping 47 which guides a preprocessing liquid. When a preprocessing liquid valve 57 interposed in the preprocessing liquid piping 47 is opened, the preprocessing liquid is continuously discharged downward from the fourth moving nozzle 13.

The preprocessing liquid discharged from the fourth moving nozzle 13 contains a solute and a solvent. A third component higher in degree of solubility in a peeling liquid than a second component and lower in degree of solubility than a first component is contained in the solute contained in the preprocessing liquid discharged from the fourth moving nozzle 13. As described previously, the third component is, for example, a synthetic resin similar to the first component and the second component. The preprocessing liquid is solidified or cured by at least partial volatilization of the solvent. The preprocessing liquid is solidified or cured on a substrate W to form a preprocessing film which holds a removal object present on the substrate W.

The solvent contained in the preprocessing liquid discharged from the fourth moving nozzle 13 may be any liquid which will dissolve the third component. As examples of the solvent which will dissolve a synthetic resin as the third component, IPA, PGEE, PGMEA, EL, etc., can be cited.

The preprocessing liquid valve 57 and the fourth nozzle moving unit 39 are controlled by a controller 3 (refer to FIG. 3).

Figure 9:
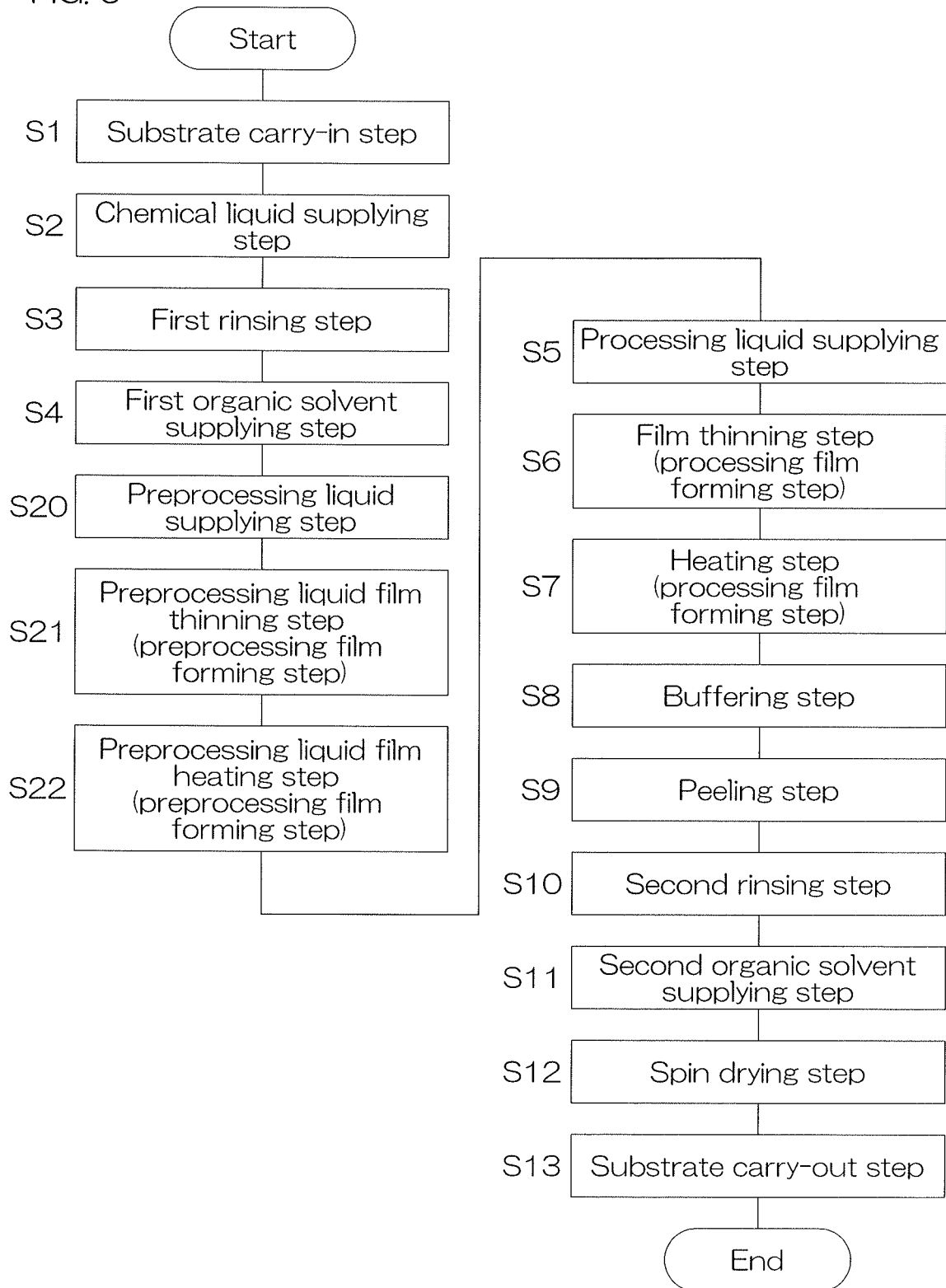
FIG. 9 is a flowchart for describing one example of substrate processing by a processing unit according to the second preferred embodiment.

FIG. 9 is a flowchart for describing one example of substrate processing by the substrate processing apparatus 1P according to the second preferred embodiment. In the substrate processing by the substrate processing apparatus 1P according to the second preferred embodiment, unlike the substrate processing by the substrate processing apparatus 1 according to the first preferred embodiment, a preprocessing liquid supplying step (Step S20) and a preprocessing film forming step (Step S21 and Step S22) are executed. FIG. 10A to FIG. 10D are each a schematic view for describing some steps in the substrate processing by the substrate processing apparatus 1P according to the second preferred embodiment.

In detail, in the substrate processing by the substrate processing apparatus 1P, for example, as shown in FIG. 9, a substrate carry-in step (Step S1), a chemical liquid supplying step (Step S2), a first rinsing step (Step S3), a first organic solvent supplying step (Step S4), a preprocessing liquid supplying step (Step S20), a preprocessing liquid film thinning step (Step S21), a preprocessing liquid film heating step (Step S22), a processing liquid supplying step (Step S5), a film thinning step (Step S6), a heating step (Step S7), a buffering step (Step S8), a peeling step (Step S9), a second rinsing step (Step S10), a second organic solvent supplying step (Step S11), a spin drying step (Step S12) and a substrate carry-out step (Step S13) are executed in this order.

In more detail, steps up to the first organic solvent supplying step (Step S4) are executed as with the substrate processing by the substrate processing apparatus 1 according to the first preferred embodiment. Then, in the substrate processing by the substrate processing apparatus 1P, the preprocessing liquid supplying step (Step S20) is executed after the first organic solvent supplying step (Step S4).

Specifically, in the preprocessing liquid supplying step (Step S20), an organic solvent valve 56, which has been opened in the first organic solvent supplying step (Step S4), is closed. Thereby, supply of an organic solvent to a substrate W is stopped. Then, a facing member elevating/lowering unit 61 moves a facing member 6 to the upper position. Then, a guard elevating/lowering unit 74 moves a first guard 71A to the upper position. In the preprocessing liquid supplying step, the substrate W is rotated at a predetermined preprocessing rotational speed, for example, 10 rpm to 1500 rpm.

Figure 10A:
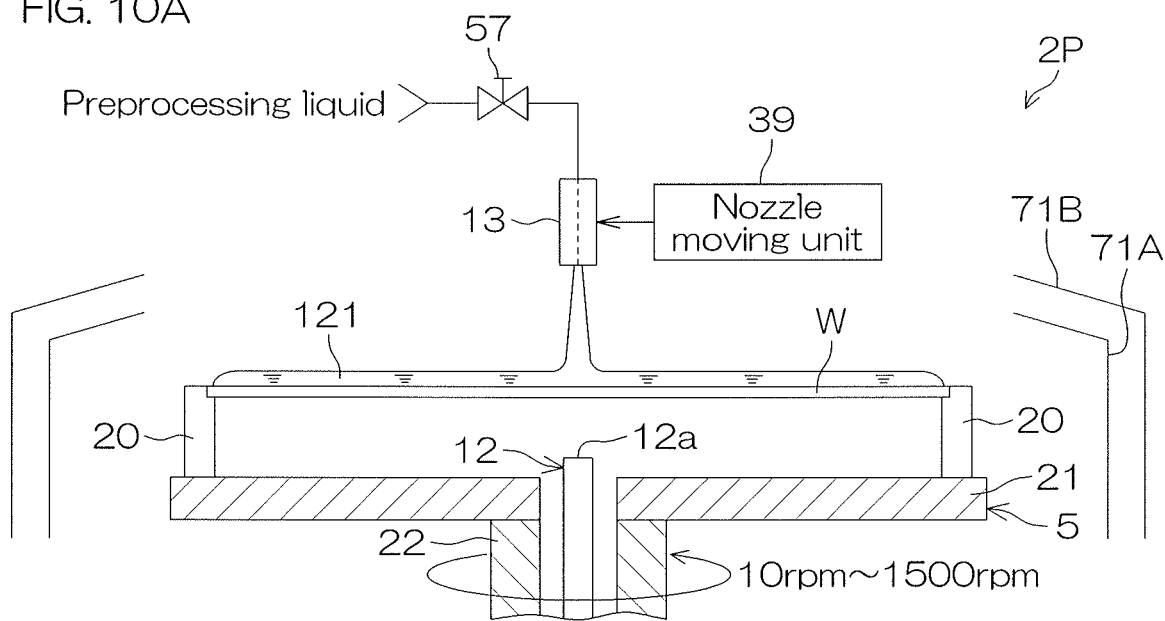
FIG. 10A is a schematic view for describing conditions of a preprocessing liquid supplying step (Step S20) in substrate processing by the substrate processing apparatus according to the second preferred embodiment.

Then, as shown in FIG. 10A, the fourth nozzle moving unit 39 moves the fourth moving nozzle 13 to a processing position. The processing position of the fourth moving nozzle 13 is, for example, a central position. Then, the preprocessing liquid valve 57 is opened. Thereby, a preprocessing liquid is supplied (discharged) from the fourth moving nozzle 13 toward a central region on the upper surface of the substrate W in a rotating state (the preprocessing liquid supplying step, the preprocessing liquid discharging step). Thereby, the organic solvent on the substrate W is replaced with the preprocessing liquid to form a liquid film (a preprocessing liquid film 121) of the preprocessing liquid on the substrate W (the preprocessing liquid film forming step).

Next, the preprocessing film forming step (Step S21 and Step S22) is executed. In the preprocessing film forming step, the preprocessing liquid on the substrate W is solidified or cured to form a preprocessing film 120 (refer to FIG. 10C) on the upper surface of the substrate W.

Figure 10B:
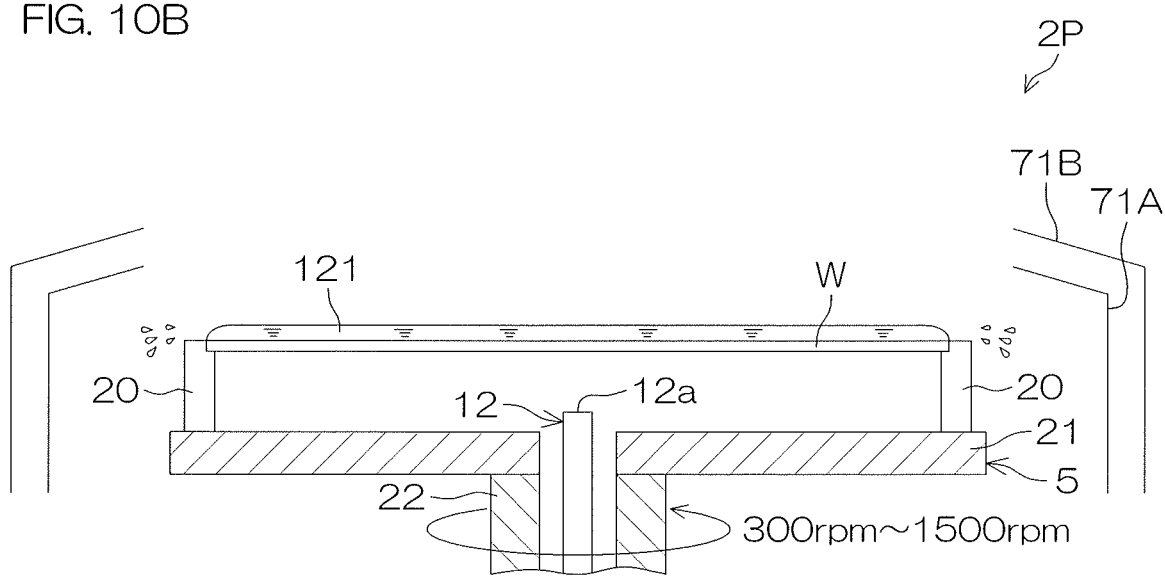
FIG. 10B is a schematic view for describing conditions of thinning a preprocessing liquid film (Step S21) in the substrate processing by the substrate processing apparatus according to the second preferred embodiment.

In the preprocessing film forming step, the preprocessing liquid film thinning step (the preprocessing liquid spin off step) (Step S6) is executed. In the preprocessing liquid film thinning step, the preprocessing liquid valve 57 is first closed. Thereby, supply of the processing liquid to the substrate W is stopped. Then, the fourth moving nozzle 13 is moved to a home position by the fourth nozzle moving unit 39. As shown in FIG. 10B, in the preprocessing liquid film thinning step, in a state where supply of the preprocessing liquid to the upper surface of the substrate W is stopped, the preprocessing liquid is partially eliminated from the upper surface of the substrate W due to a centrifugal force such that a thickness of the liquid film of the preprocessing liquid becomes an appropriate thickness. In the preprocessing liquid film thinning step, the facing member 6, the first guard 71A and the second guard 71B are kept at the upper position.

In the preprocessing liquid film thinning step, a spin motor 23 changes a rotational speed of the substrate W to a predetermined preprocessing liquid film thinning speed. The preprocessing liquid film thinning speed is, for example, 300 rpm to 1500 rpm. The rotational speed of the substrate W may be kept fixed within a range of 300 rpm to 1500 rpm or may be changed whenever necessary within a range of 300 rpm to 1500 rpm in the middle of the preprocessing liquid film thinning step.

In the preprocessing film forming step, the preprocessing liquid film heating step (Step S22) which heats the substrate W is executed after the preprocessing liquid film thinning step. In the preprocessing liquid film heating step, in order to partially volatilize a solvent of the preprocessing liquid on the substrate W, the preprocessing liquid film 121 on the substrate W is heated.

Figure 10C:
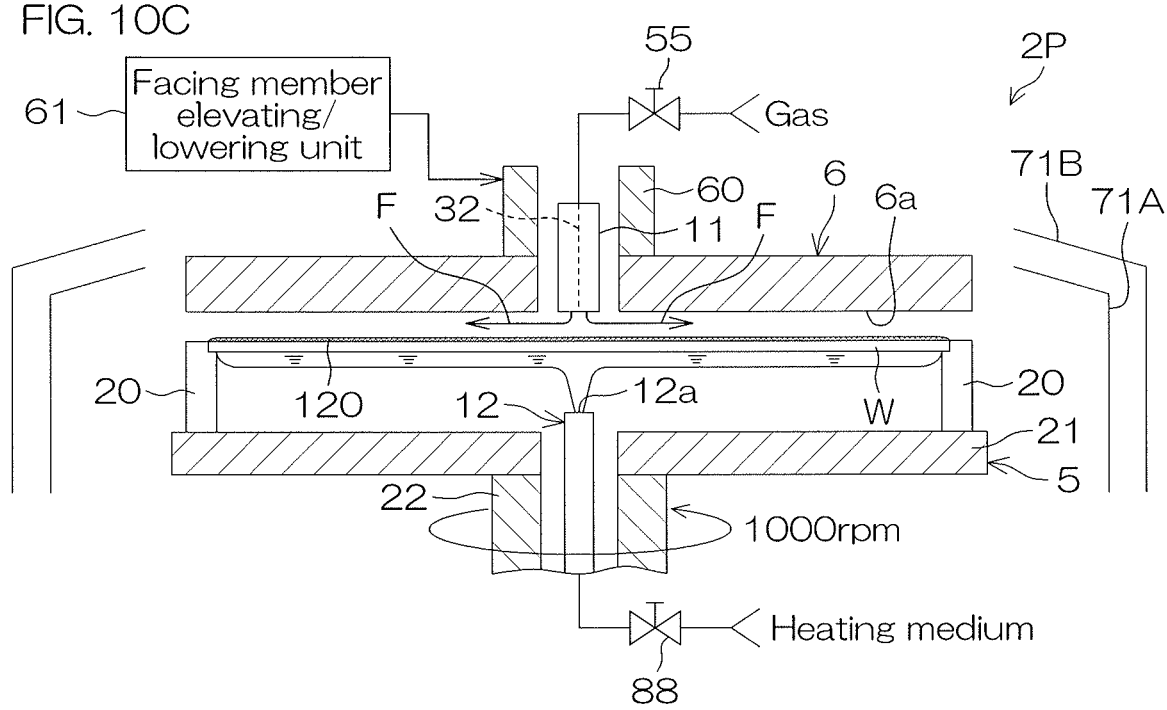
FIG. 10C is a schematic view for describing conditions of a preprocessing liquid film heating step (Step S22) in the substrate processing by the substrate processing apparatus according to the second preferred embodiment.

Specifically, as shown in FIG. 10C, the facing member elevating/lowering unit 61 moves the facing member 6 to a proximity position between the upper position and the lower position. In the heating step, the first guard 71A and the second guard 71B are kept at the upper position. Then, a gas valve 55 is opened. Thereby, a gas is supplied to a space between the upper surface (the upper surface of the preprocessing liquid film 121) of the substrate W and a facing surface 6a of a facing member 6 (the gas supplying step).

A gas is supplied from a central nozzle 11 to form a gas stream F which moves from a central region on the upper surface of the substrate W toward a peripheral edge of the upper surface of the substrate W at a space between the facing surface 6a of the facing member 6 and the upper surface of the substrate W. The gas stream F which moves from the central region on the upper surface of the substrate W toward a peripheral edge of the upper surface of the substrate W is formed, so that a heating medium splashed back from the first guard 71A can be pushed back toward the first guard 71A. Consequently, it is possible to further suppress attachment of the heating medium to an upper surface of the preprocessing film 120.

Then, a heating medium valve 88 is opened. Thereby, a heating medium is supplied (discharged) from the lower surface nozzle 12 to the central region on the lower surface of the substrate W in the rotating state (the heating medium supplying step, the heating medium discharging step). The heating medium supplied from the lower surface nozzle 12 to the lower surface of the substrate W extends across the entire lower surface of the substrate W due to a centrifugal force. In the preprocessing liquid film heating step, the substrate W is rotated at a predetermined preprocessing film heating speed, for example, 1000 rpm.

The heating medium is supplied to the lower surface of the substrate W, so that the preprocessing liquid film 121 on the substrate W is heated via the substrate W. Thereby, evaporation of the solvent in the preprocessing liquid film 121 is promoted (the solvent evaporating step, the solvent evaporation promoting step). Therefore, time necessary for forming the preprocessing film 120 can be reduced.

Figure 10D:
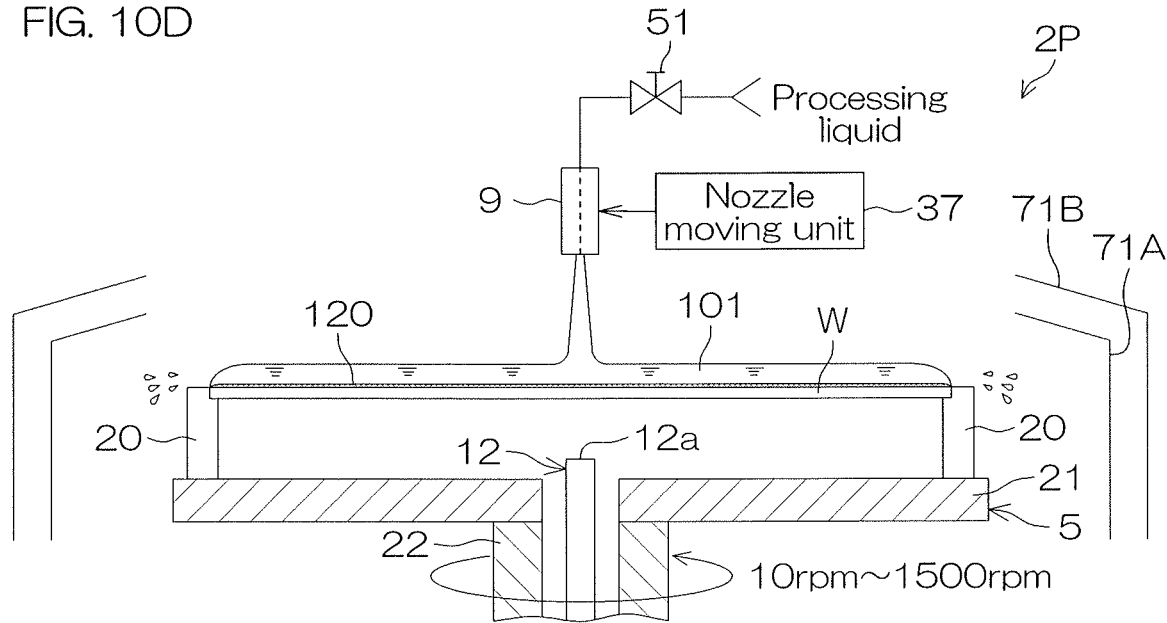
FIG. 10D is a schematic view for describing conditions of a processing liquid supplying step (Step S5) in the substrate processing by the substrate processing apparatus according to the second preferred embodiment.

As with the substrate processing by the processing unit 2 according to the first preferred embodiment, after the preprocessing liquid film heating step, steps subsequent to the processing liquid supplying step (Step S5) are executed sequentially. As shown in FIG. 10D, in the processing liquid supplying step, the processing liquid is supplied to the upper surface of the substrate W on which the preprocessing film 120 has been formed.

Figure 11A:
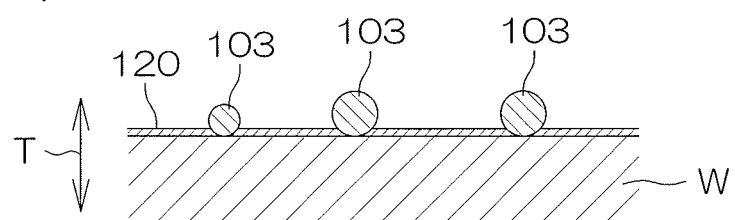
FIG. 11A is a schematic sectional view for describing conditions in the vicinity of a front surface of a substrate after the preprocessing liquid film heating step (Step S22) in the substrate processing by the substrate processing apparatus according to the second preferred embodiment.
Figure 11B:
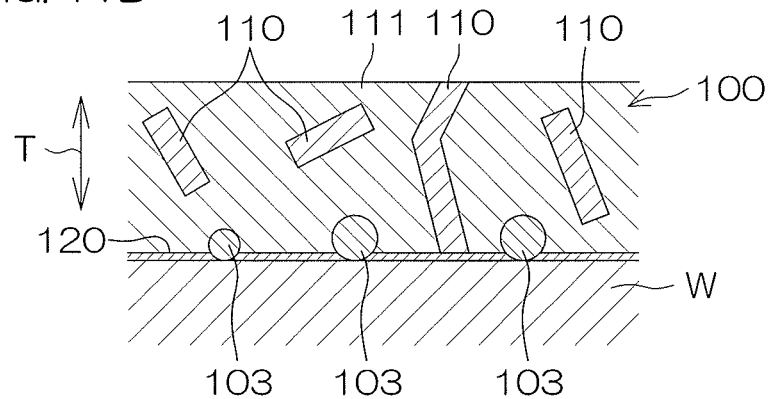
FIG. 11B is a schematic sectional view for describing conditions in the vicinity of the front surface of the substrate after a heating step (Step S7) in the substrate processing by the substrate processing apparatus according to the second preferred embodiment.
Figure 11C:
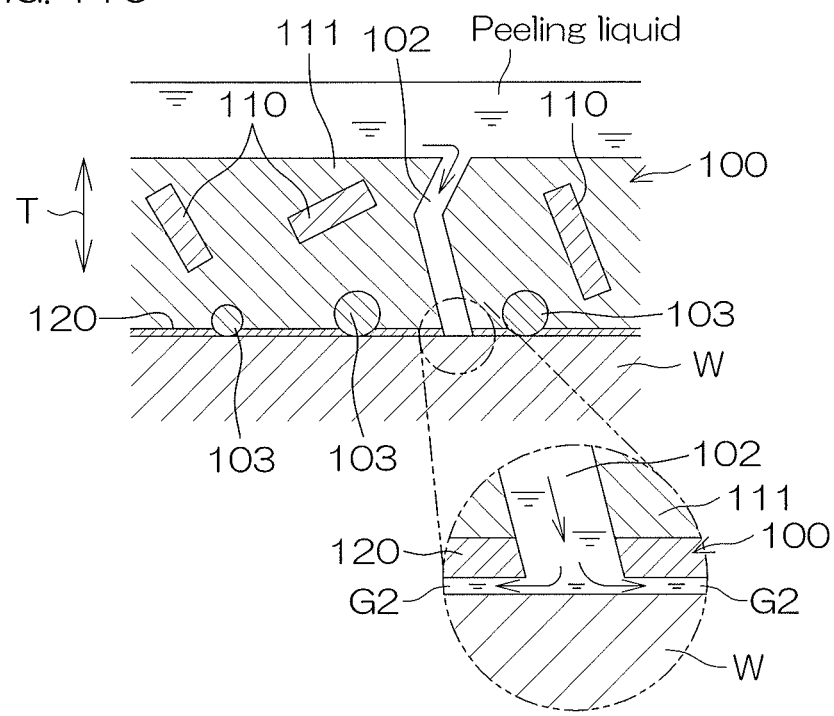
FIG. 11C is a schematic sectional view for describing conditions in the vicinity of the front surface of the substrate while execution of a peeling step (Step S9) is in progress in the substrate processing by the substrate processing apparatus according to the second preferred embodiment.
Figure 11D:
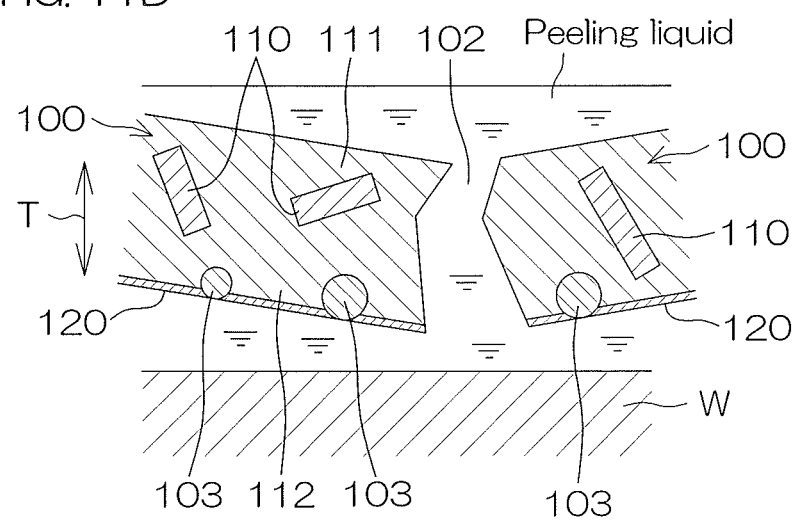
FIG. 11D is a schematic sectional view for describing conditions in the vicinity of the front surface of the substrate while execution of a peeling step (Step S9) is in progress in the substrate processing by the substrate processing apparatus according to the second preferred embodiment.

Next, with reference to FIG. 11A to FIG. 11D, a description will be given of conditions when a processing film 100 and the preprocessing film 120 are peeled from the substrate W. FIG. 11A shows conditions in the vicinity of the upper surface of the substrate W after the preprocessing liquid film heating step (Step S22). FIG. 11B shows conditions in the vicinity of the upper surface of the substrate W after the heating step (Step S7). FIG. 11C and FIG. 11D show conditions in the vicinity of the upper surface of the substrate W while execution of the peeling step (Step S9) is in progress.

As shown in FIG. 11A, in the preprocessing liquid film heating step, as described previously, the preprocessing liquid film 121 on the substrate W is heated with the heating medium via the substrate W. Thereby, as shown in FIG. 11A, the preprocessing film 120 is formed on the upper surface of the substrate W. In detail, the solvent is at least partially evaporated, so that the third component contained in the solute of the preprocessing liquid forms a third solid 112. It is preferable that the film thickness of the preprocessing film is thinner than that of a removal object 103 in a thickness direction T of the substrate W.

Then, as shown in FIG. 11B, after the processing liquid supplying step (Step S5) and the processing liquid film forming step (Step S6 and Step S7), the processing film 100 which holds the removal object 103 such as particles is formed on the preprocessing film 120. In detail, the solvent is at least partially evaporated, so that the first component which is contained in the solute of the processing liquid forms a first solid 110 and the second component which is contained in the solute of the processing liquid forms a second solid 111.

Then, with reference to FIG. 11C, in the peeling step, the processing film 100 is partially dissolved. When a peeling liquid is supplied to the upper surface of the substrate W, the first solid 110 which is formed by the first component higher in solubility in the peeling liquid than the second component is mainly dissolved. Thereby, a penetrating hole 102 is formed at a portion of the processing film 100 at which the first solid 110 is locally present (the penetrating hole forming step). The penetrating hole 102 is likely to be formed at a portion at which the first solid 110 extends in the thickness direction T of the substrate W.

The second solid 111 is also dissolved by the peeling liquid. However, since the second component is lower in solubility in the peeling liquid than the first component, the second solid 111 in the vicinity of the front surface thereof is only slightly dissolved by the peeling liquid.

While mainly dissolving the first solid 110, the peeling liquid reaches the vicinity of the upper surface of the substrate W via the penetrating hole 102. A portion of the preprocessing film 120 in the vicinity of the upper surface of the substrate W is dissolved by the peeling liquid which has reached the vicinity of the upper surface of the substrate W. Thereby, as shown in an enlarged view of FIG. 11C, while gradually dissolving the preprocessing film 120 in the vicinity of the upper surface of the substrate W, the peeling liquid enters into a gap G2 between the preprocessing film 120 and the upper surface of the substrate W (the peeling liquid entry step).

Then, for example, with a peripheral edge of the penetrating hole 102 given as a starting point, the processing film 100 and the preprocessing film 120 are split into film fragments. As shown in FIG. 11D, the film fragments of the processing film 100 and the preprocessing film 120 are peeled from the substrate W, in a state where the removal object 103 is held (the processing film splitting step, the preprocessing film splitting step, the peeling step). Then, the removal object 103 is pushed away outside the substrate W together with the processing film 100 in a state of being held by the processing film 100 and removed from the upper surface of the substrate W (a removing step).

According to the second preferred embodiment, the same effects as the first preferred embodiment can be obtained. However, in the second preferred embodiment, before supply of the processing liquid, the preprocessing liquid is supplied to an upper surface of a substrate W and the preprocessing liquid is solidified or cured. Therefore, in a state where the preprocessing film 120 has been formed on the upper surface of the substrate W, the processing liquid is supplied to the upper surface of the substrate W to form the processing film 100. Consequently, it is possible to easily form the preprocessing film 120 formed by the third component at a portion adjacent to the upper surface of the substrate W.

Further, the third component is higher in degree of solubility in the peeling liquid than the second component and lower in degree of solubility in the peeling liquid than the first component. Therefore, the preprocessing film 120 which has the third solid 112 formed by the third component is more easily dissolved in the peeling liquid than the second solid 111 formed by the second component and less likely to be dissolved in the peeling liquid than the first solid 110 formed by the first component.

Therefore, the peeling liquid is used to dissolve the first solid 110, thus making it possible to reliably form the penetrating hole 102. Then, it is possible to dissolve the third solid 112 positioned at a portion of the processing film 100 adjacent to the upper surface of the substrate W by the peeling liquid which has entered in the vicinity of the upper surface of the substrate W via the penetrating hole 102. Since the third solid 112 is more easily dissolved in the peeling liquid than the second solid 111, the processing film 100 is more easily peelable by the peeling liquid than an arrangement in which the second solid 111 is in contact with the upper surface of the substrate W.

On the other hand, the second solid 111 can be kept in a solid state in the peeling liquid. Therefore, the peeling liquid can be made to act on an interface between the second solid 111 and the substrate W, in a state where the removal object 103 is held by the second solid 111. As a result, while the processing film 100 (the second solid 111) is smoothly peeled from the upper surface of the substrate W, it is possible efficiently remove the removal object 103 from the upper surface of the substrate W together with the processing film 100 (the second solid 111).

Where a film thickness of the preprocessing film 120 is smaller than a dimension of the removal object 103 (a diameter thereof, in a case where the removal object 103 is a sphere), the third solid 112 exposed from an upper end of the preprocessing film 120 is easily increased in surface area. Therefore, it is possible to increase a portion at which the second solid 111 lower in solubility in the peeling liquid than the third solid 112 is in contact with the removal object 103. Therefore, it is possible to suppress the removal object 103 from falling off from the processing film 100 peeled from the upper surface of the substrate W.

The preprocessing film forming step (Step S21 and Step S22) may be omitted. In this case, the preprocessing liquid is supplied to the upper surface of the substrate W before supply of the processing liquid. In a state where the preprocessing liquid is present on the upper surface of the substrate W (in a state where the preprocessing liquid film 121 is formed), the processing liquid is supplied to the upper surface of the substrate W. Therefore, the preprocessing liquid is mixed with the processing liquid on the substrate W to form the processing film 100 having the first solid 110, the second solid 111 and the third solid 112, as shown in FIG. 7A. In this case, since the preprocessing liquid is earlier present on the substrate W, the third solid 112 is likely to be formed in the vicinity of the upper surface of the substrate W. It is, consequently, possible to easily form the processing film 100 which has the third solid 112 at a portion at least adjacent to the upper surface of the substrate W.

Therefore, as with the substrate processing which includes the preprocessing film forming step (Step S21 and Step S22), a portion of the processing film 100 adjacent to the upper surface of the substrate W is appropriately dissolved in the peeling liquid, thus making it possible to efficiently peel the processing film 100, in a state where the removal object 103 is held by the processing film 100 (the second solid 111 in particular).

Third Preferred Embodiment

Figure 12:
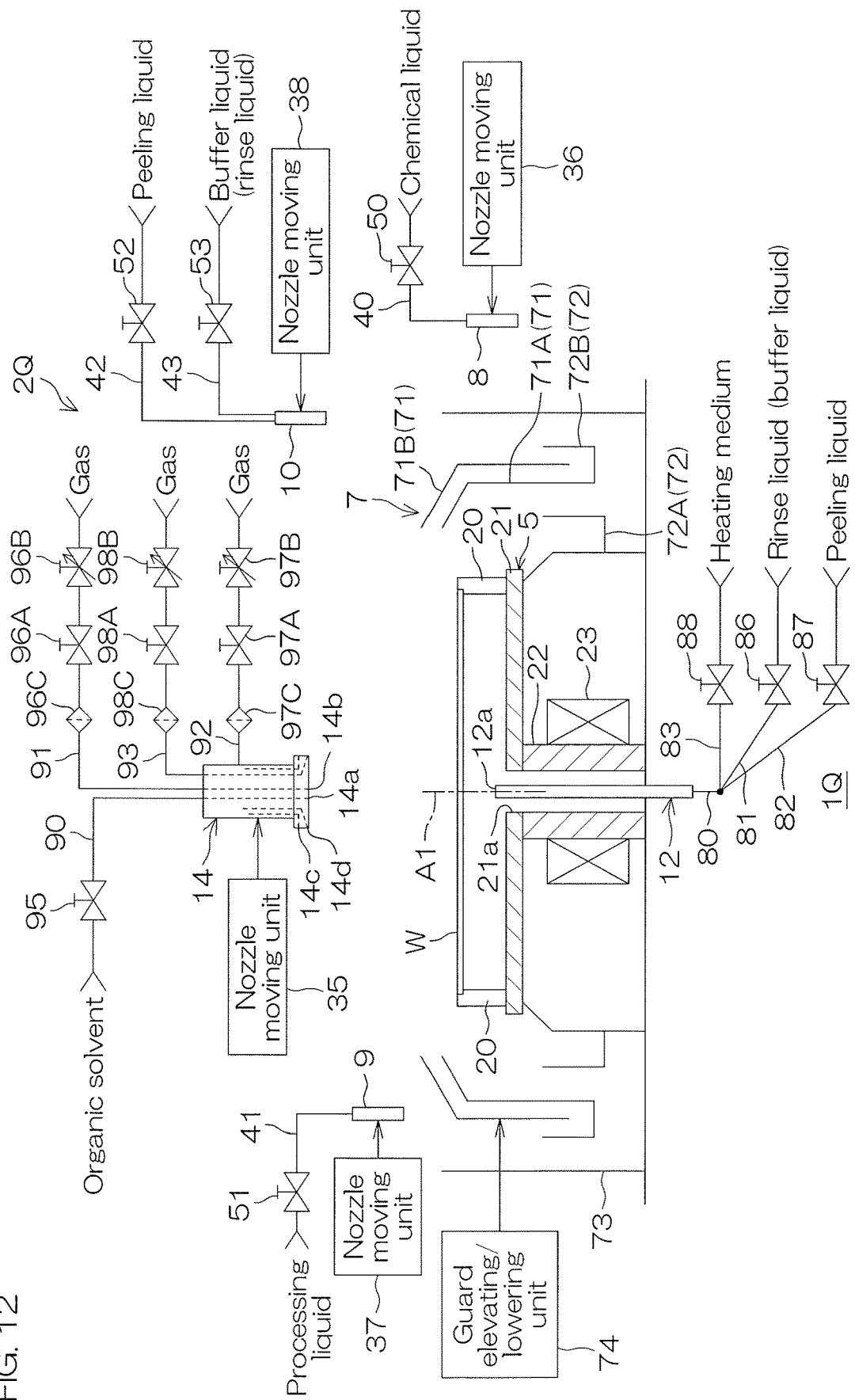
FIG. 12 is a schematic partial sectional view which shows a brief configuration of a processing unit included in a substrate processing apparatus according to a third preferred embodiment.

FIG. 12 is a schematic partial sectional view which shows a brief arrangement of a processing unit 2Q included in a substrate processing apparatus 1Q according to the third preferred embodiment. With reference to FIG. 12, the processing unit 2Q according to the third preferred embodiment is mainly different from the processing unit 2 (refer to FIG. 2) according to the first preferred embodiment in that the processing unit 2Q according to the third preferred embodiment includes a fifth moving nozzle 14 in place of the facing member 6 and the central nozzle 11.

The fifth moving nozzle 14 is one example of an organic solvent supplying unit which supplies an organic solvent to an upper surface of a substrate W. The fifth moving nozzle 14 is also one example of a gas supplying unit which supplies a gas such as nitrogen gas to the upper surface of the substrate W.

An organic solvent piping 90 which guides an organic solvent to the fifth moving nozzle 14 is connected to the fifth moving nozzle 14. When an organic solvent valve 95 interposed in the organic solvent piping 90 is opened, the organic solvent is continuously discharged from the fifth moving nozzle 15 to a central region on the upper surface of the substrate W.

A plurality of gas pipings (a first gas piping 91, a second gas piping 92 and a third gas piping 93) which guide a gas to the fifth moving nozzle 14 are connected to the fifth moving nozzle 14. Gas valves (a first gas valve 96A, a second gas valve 97A and a third gas valve 98A) for opening and closing a flow passage thereof are respectively interposed in the plurality of gas pipings (the first gas piping 91, the second gas piping 92 and the third gas piping 93).

The fifth moving nozzle 14 has a central discharge port 14a which discharges an organic solvent guided by the organic solvent piping 90 along a vertical direction. The fifth moving nozzle 14 has a linear flow discharge port 14b which linearly discharges a gas supplied from the first gas piping 91 along the vertical direction. The fifth moving nozzle 14 also has a horizontal flow discharge port 14c which radially discharges a gas supplied from the second gas piping 92 around the fifth moving nozzle 14 along a horizontal direction. Further, the fifth moving nozzle 14 has an inclined flow discharge port 14d which radially discharges a gas supplied from the third gas piping 93 around the fifth moving nozzle 14 along an obliquely downward direction.

A mass flow controller 96B which accurately adjusts a flow rate of a gas flowing inside the first gas piping 91 is interposed in the first gas piping 91. The mass flow controller 96B has a flow control valve. A variable flow valve 97B which adjusts a flow rate of a gas flowing inside the second gas piping 92 is also interposed in the second gas piping 92. Further, a variable flow valve 98B which adjusts a flow rate of a gas flowing inside the third gas piping 93 is interposed in the third gas piping 93. Still further, filters 96C, 97C, 98C for removing foreign objects are interposed respectively in the gas pipings (the first gas piping 91, the second gas piping 92 and the third gas piping 93).

The fifth moving nozzle 14 is moved in the horizontal direction and in the vertical direction by a fifth nozzle moving unit 35. The fifth moving nozzle 14 is able to move between a center position and a home position (retreat position).

When positioned at the center position, the fifth moving nozzle 14 faces a rotation center on an upper surface of a substrate W. When positioned at the home position, the fifth moving nozzle 14 does not face the upper surface of the substrate W and is positioned outside a processing cup 7 in a plan view. The fifth moving nozzle 14 moves in the vertical direction and is thereby capable of coming close to the upper surface of the substrate W and retreating upward from the upper surface of the substrate W.

The fifth nozzle moving unit 35 has the same arrangement as the first nozzle moving unit 36. That is, the fifth nozzle moving unit 35 includes, for example, a pivoting shaft (not shown) oriented along the vertical direction, an arm (not shown) which is coupled to the pivoting shaft and the fifth moving nozzle 14 and extends horizontally and a pivoting shaft driving unit (not shown) which elevates, lowers and pivots the pivoting shaft.

As the organic solvent discharged from the fifth moving nozzle 14, an organic solvent similar to the organic solvent discharged from the third tube 33 (refer to FIG. 2) according to the first preferred embodiment can be cited. As the gas discharged from the fifth moving nozzle 14, a gas similar to the gas discharged from the second tube 32 (refer to FIG. 2) according to the first preferred embodiment can be cited.

The gas valves (the first gas valve 96A, the second gas valve 97A and the third gas valve 98A), the mass flow controller 96B, the variable flow valves 97B, 98B and the fifth nozzle moving unit 35 are controlled by a controller 3 (refer to FIG. 3).

The substrate processing apparatus 1Q according to the third preferred embodiment is used, thus making it possible to execute the same substrate processing as that executed by the substrate processing apparatus 1 according to the first preferred embodiment. However, a buffer liquid supplied from a third moving nozzle 10 is also a rinse liquid. Therefore, in a first rinsing step (Step S3) and a second rinsing step (Step S4), a rinse liquid is supplied from the third moving nozzle 10 to the upper surface of the substrate W.

The substrate processing apparatus 1Q according to the third preferred embodiment also includes a preprocessing liquid supplying unit, thus making it possible to execute the same substrate processing as that executed by the substrate processing apparatus 1P according to the second preferred embodiment.

The present invention shall not be restricted to the embodiments so far described but may be executed by still other modes.

For example, in the substrate processing apparatus 1, 1P or 1Q, there may be executed substrate processing in which the chemical liquid supplying step (Step S2), the first rinsing step (Step S3) and the first organic solvent supplying step (Step S4) are omitted.

Further, with regard to the substrate processing in each of the above-described preferred embodiments, in the processing film forming step (Step S6 and Step S7), the heating medium is used to heat a substrate W, thereby evaporating the solvent of the processing liquid. Still further, in the preprocessing film forming step (Step S21 and Step S22) as well, the heating medium is used to heat the substrate W, thereby evaporating the solvent of the preprocessing liquid. However, the substrate W may be heated not only by supply of the heating medium but also, for example, by a heater, etc., (not shown) housed inside the spin base 21 or the facing member 6. In this case, the heater functions as a substrate heating unit and an evaporating unit (an evaporation promoting unit).

Further, a substrate W is not necessarily heated in forming the processing film 100 and the preprocessing film 120. That is, in a case where the solvent is satisfactorily volatilized in the film thinning step (Step S6) and in the preprocessing liquid film thinning step (Step S21), the subsequent heating step (Step S7) or the preprocessing liquid film heating step (Step S22) may not be executed. In particular, in a case where the solvent may be allowed to remain in the interior of the processing film 100 and the preprocessing film 120, the solvent can be easily evaporated up to a desired extent without heating the substrate W.

Further, in each of the above-described substrate processing, the buffering step (Step S8) may be omitted.

Further, in each of the above-described preferred embodiments, the contained amount of the second component in the processing liquid is higher than the contained amount of the first component in the processing liquid. However, the contained amount of the second component in the processing liquid may be lower than the contained amount of the first component in the processing liquid. In this case, a portion of the processing film 100 which is dissolved by the peeling liquid can be increased as compared with a configuration in which the contained amount of the second component in the processing liquid is larger than the contained amount of the first component in the processing liquid. Therefore, the processing film 100 can be split into relatively small film fragments. Since the processing film 100 is split into relatively small film fragments, the film fragments are likely to be lifted by being subjected to a force from a flow of the peeling liquid and easily removed outside a substrate W by the flow of the peeling liquid. Consequently, it is possible to efficiently remove the processing film 100 from the substrate W.

Further, in each of the above-described preferred embodiments, each of the components (the first component, the second component and the third component) of the solute contained in the processing liquid is a synthetic resin. However, these components of the solute are not necessarily a synthetic resin and may be such that they are dissolved by the solvent contained in the processing liquid and higher in solubility in the peeling liquid in ascending order of the second component, the third component and the first component. If so, each of the components of the solute may be, for example, a metal or a salt. The solute may also contain four or more components which are mutually different in solubility in the peeling liquid.

Further, with regard to the processing liquid and the peeling liquid described in each of the above-described preferred embodiments, even those which will be described hereinafter provide the same effects as each of the above-described preferred embodiments.

Hereinafter, expressions of "$C_{x-y}$," "$C_x-C_y$" and "$C_x$" indicate the number of carbons in a molecule or a substituent. For example, $C_{1-6}$ alkyl indicates an alkyl chain (methyl, ethyl, propyl, butyl, pentyl, hexyl, etc.) which has a carbon of one or more to six or less.

Hereinafter, where a polymer has plural types of repeating units, these repeating units undergo copolymerization. Unless otherwise specified, the copolymerization may be any one of alternating copolymerization, random copolymerization, block copolymerization, graft copolymerization and a mixture of them. Where a polymer and a resin are expressed by a structural formula, n, m, etc., which are written together in parentheses indicate a repeating number.

<Processing Liquid>

The processing liquid contains (A) second component which is an insoluble or sparingly soluble solute, (B) first component which is a soluble solute, and (C) solvent. The processing liquid is dropped on a substrate and dried, by which (C) solvent is removed, (A) second component is filmed and remains as a film together with (B) first component on the substrate, and the film is thereafter removed from the substrate by a peeling liquid. (A) second component is preferably insoluble or sparingly soluble in the peeling liquid. Further, (B) first component is preferably soluble in the peeling liquid. The above-described "solute" is not restricted to a state of being dissolved in (C) solvent but may include a suspended state. As one preferable mode, a solute, a component and an additive contained in the processing liquid are dissolved in (C) solvent. A processing liquid which assumes this mode is considered to be embedded excellently or high in film uniformity.

Here, "as a film together with" preferably means to develop a state of being present together in one film and does not mean that they have their own layer separately. One mode of "film formation" is "solidification." The film obtained from the processing liquid may have such hardness that can hold particles and does not require complete removal of (C) solvent (for example, by gasification). The processing liquid gradually contracts in association with volatilization of (C) solvent and forms a film. The description of "remains as the film on the substrate" means that, in relation to an entirety, an extremely small quantity is permitted to be removed (for example: evaporation or volatilization). It is permissible that as compared with an original quantity, for example, 0 to 10 mass % (preferably 0 to 5 mass %, more preferably 0 to 3 mass %, further preferably 0 to 1 mass % and even further preferably 0 to 0.5 mass %) is removed.

It is considered that the film holds particles on the substrate and is removed by being peeled by a peeling liquid, which is, however, free of any intention of restricting the scope of claims or not constrained by any theory. It is also considered that since (B) first component remains on the film, there occurs a portion which serves as the beginning of peeling the film.

<Second Component>

(A) second component contains at least any one of novolac, polyhydroxystyrene, polystyrene, a polyacrylic acid derivative, a polymaleic acid derivative, polycarbonate, a polyvinyl alcohol derivative, a polmethacrylic acid derivative and a copolymer of a combination thereof. (A) second component may preferably contain at least any one of novolac, polyhydroxystyrene, a polyacrylic acid derivative, polycarbonate, a polmethacrylic acid derivative and a copolymer of a combination thereof. (A) second component may more preferably contain at least any one of novolac, polyhydroxystyrene, polycarbonate and a copolymer of a combination thereof. Novolac may be phenol novolac.

As a matter of course, as (A) second component, the processing liquid may contain one or two or more of combinations of the above-described preferable examples. For example, (A) second component may contain both novolac and polyhydroxystyrene.

(A) second component is dried and formed into a film, and the film is not substantially dissolved by a peeling liquid which will be described later and peeled, with particles held, which is one preferable mode. Such a mode is permissible that (A) second component is only partially dissolved by the peeling liquid.

It is preferable that (A) second component does not contain fluorine and/or silicon and it is more preferable that it contains neither of them.

It is preferable that the copolymerization is random copolymerization or block copolymerization.

As specific examples of (A) second component, the compounds shown individually in Chemical Formula 7 to Chemical Formula 13 given below can be cited, which is, however, free of any intention of restricting the scope of claims.

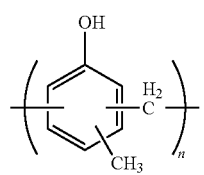
[Chemical Formula 7]

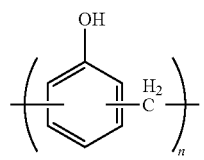
[Chemical Formula 8]

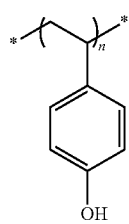
[Chemical Formula 9]

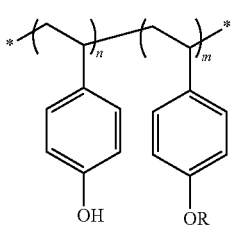
[Chemical Formula 10]

(Here, R indicates a substituent of $C_1$ to $C_4$ alkyl, etc.)

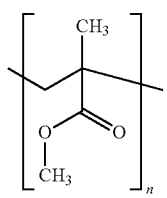
[Chemical Formula 11]

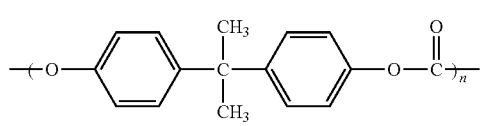
[Chemical Formula 12]

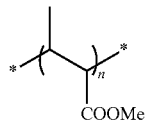
[Chemical Formula 13]

(A) second component is preferably 150 to 500,000 in weight average molecular weight (Mw), more preferably 300 to 300,000, further preferably 500 to 100,000 and even further preferably 1,000 to 50,000.

(A) second component can be obtained by synthesis and can also be purchased. In the case of purchase, for example, each of the following companies can be cited as a supplier. The supplier is also able to synthesize (A) polymer. Novolac: Showa Kasei Kogyo Co., Ltd., Asahi Yukizai Corp., Gunei Chemical Industry Co., Ltd., Sumitomo Bakelite Co., Ltd. Polyhydroxystyrene: Nippon Soda Co., Ltd., Maruzen Petrochemical Co., Ltd., Toho Chemical Industry Co., Ltd. Polyacrylic acid derivative: Nippon Shokubai Co., Ltd. Polycarbonate: Sigma-Aldrich Polmethacrylic acid derivative: Sigma-Aldrich As compared with an entire mass of the processing liquid, (A) second component is 0.1 to 50 mass %, preferably 0.5 to 30 mass %, more preferably 1 to 20 mass % and further preferably 1 to 10 mass %. That is, an entire mass of the processing liquid is given as 100 mass %, which is used as a reference to give (A) second component that is 0.1 to 50 mass %. That is, "as compared with" can also be referred to as "which is used as a reference." Unless otherwise specified, this is also applicable to the following.

Solubility can be evaluated by a known method. For example, under conditions of 20° C. to 35° C. (more preferably 25±2° C.), the above-described (A) or (B) which will be described later is added in a quantity of 100 ppm to ammonia water of 5.0 mass % in a flask which is then capped, and a resultant is subjected to 3-hour shaking by using a shaker. Then, the solubility can be determined by whether (A) or (B) is dissolved. Shaking may be agitation. Dissolution can also be judged visually. If (A) or (B) is not dissolved, the solubility is to be less than 100 ppm. If dissolved, the solubility is to be 100 ppm or more. The solubility of less than 100 ppm is to be insoluble or sparingly soluble, and the solubility of 100 ppm or more is being soluble. In a broad sense, being soluble includes being slightly soluble. Being insoluble is lowest in solubility, followed by being sparingly soluble and soluble. In a narrow sense, being slightly soluble is lower in solubility than being soluble and higher in solubility than being sparingly soluble.

The previously described ammonia water of 5.0 mass % may be changed to a peeling liquid which is used in a process to be conducted later. A liquid used for evaluating the solubility is not required to be the same as the peeling liquid and may be any liquid in which components different in solubility are present together. (B) first component present in the processing film formed by the processing liquid is started to be dissolved by the peeling liquid, which can serve as the beginning of peeling the processing film from a substrate. Thus, partial dissolution of (B) first component by the peeling liquid can serve as the beginning of peeling the processing film. Therefore, for example, the peeling liquid may be lower in alkalinity than a liquid used for evaluating the solubility.

<First Component>

(B) first component is (B') crack promoting component. (B') crack promoting component contains hydrocarbon and also has a hydroxy group (—OH) and/or a carbonyl group (—C(=O)—). In a case where (B') crack promoting component is a polymer, one type of constituent unit contains hydrocarbon for each unit and also has a hydroxy group and/or a carbonyl group. As the carbonyl group, carboxylic acid (—COOH), aldehyde, ketone, ester, amid and enone, etc., can be cited, and carboxylic acid is preferable.

It is considered that when the processing liquid is dried to form a processing film on a substrate and the peeling liquid peels the processing film, (B) first component produces a portion which serves as the beginning of peeling the processing film, which is, however, free of any intention of restricting the scope of claims or not constrained by any theory. It is, thus, preferable that (B) first component is higher insolubility in the peeling liquid than (A) second component. As a mode in which (B') crack promoting component contains ketone as a carbonyl group, cyclic hydrocarbon can be cited. As specific examples, 1,2-cyclohexanedione and 1,3-cyclohexanedione can be cited.

As a more specific mode, (B) first component is expressed at least by any one of (B-1), (B-2) and (B-3) given below. (B-1) contains 1 to 6 (preferably 1 to 4) of constituent units expressed by Chemical Formula 14 given below and is a compound in which each of the constituent units is bonded by a linking group $L_1$.

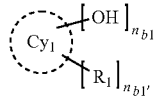

[Chemical Formula 14]

Here, $L_1$ is selected at least from a single bond and any one of $C_{1\sim6}$ alkylene. The $C_{1\sim6}$ alkylene couples the constituent units as a linker and is not restricted to a group with valency of 2. A group with valency of 2 to 4 is preferable. The $C_{1\sim6}$ alkylene may be either linear or branched. $L_1$ is preferably a single bond, methylene, ethylene or propylene.

$Cy_1$ is a hydrocarbon ring of $C_{5\sim30}$, preferably phenyl, cyclohexane or naphthyl and more preferably phenyl. As a preferable mode, the linker $L_1$ couples a plurality of $Cy_1$.

$R_1$ is each independently $C_{1\sim5}$ alkyl and preferably methyl, ethyl, propyl or butyl. The $C_{1\sim5}$ alkyl may be either linear or branched.

$n_{b1}$ is 1, 2 or 3 and preferably 1 or 2 and more preferably 1. $n_{b1'}$ is 0, 1, 2, 3 or 4 and preferably 0, 1 or 2.

As preferable examples of (B-1), 2,2-bis(4-hydroxyphenyl) propane, 2,2'-methylenebis(4-methylphenol), 2,6-bis[(2-hydroxy-5-methylphenyl)methyl]-4-methylphenol, 1,3-cyclohexanediol, 4,4'-dihydroxybiphenyl, 2,6-naphthalenediol, 2,5-di-tert-butylhydroquinone, and 1,1,2,2-tetrakis (4-hydroxyphenyl) ethane can be cited, which is, however, free of any intention of restricting the scope of claims. They may be obtained by polymerization or condensation.

2,6-bis[(2-hydroxy-5-methylphenyl) methyl]-4-methylphenol shown in Chemical Formula 15 will be described as one example. This compound has three constituent units expressed by Chemical Formula 14 at (B-1) and the constituent unit is coupled by $L_1$(methylene). $n_{b1}$ is equal to $n_{b1'}$ which is equal to 1, and $R_1$ is methyl.

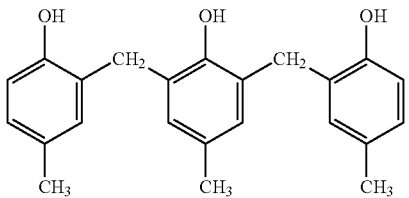

[Chemical Formula 15]

(B-2) is expressed by Chemical Formula 16 given below.

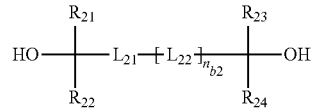

[Chemical Formula 16]

$R_{21}$, $R_{22}$, $R_{23}$ and $R_{24}$ are each independently hydrogen or $C_{1\sim5}$ alkyl, preferably hydrogen, methyl, ethyl, t-butyl or isopropyl, more preferably hydrogen, methyl or ethyl, and further preferably methyl or ethyl.

$L_{21}$ and $L_{22}$ are each independently $C_{1\sim20}$ alkylene, $C_{1\sim20}$ cycloalkylene, $C_{2\sim4}$ alkenylene, $C_{2\sim4}$ alkynylene or $C_{6\sim20}$ arylene. These groups may be substituted by $C_{1\sim5}$ alkyl or hydroxyl. Here, alkenylene indicates hydrocarbon with valency of 2 having one or more double bond, and alkynylene indicates hydrocarbon group with valency of 2 having one or more triple bond. $L_{21}$ and $L_{22}$ are preferably $C_{2\sim4}$ alkylene, acetylene ($C_2$ alkynylene) or phenylene, more preferably $C_{2\sim4}$ alkylene or acetylene and further preferably acetylene.

$n_{b2}$ is 0, 1 or 2, preferably 0 or 1 and more preferably 0.

As preferable examples of (B-2), 3,6-dimethyl-4-octene-3,6-diol, 2,5-dimethyl-3-hexene-2,5-diol can be cited, which is, however, free of any intention of restricting the scope of claims. In the other mode, as preferable examples of (B-2), 3-hexene-2,5-diol, 1,4-butenediol, 2,4-hexadiyne-1,6-diol, 1,4-butanediol, cis-1,4-dihydroxy 2-butene, and 1,4-benzenedimethanol can be cited.

(B-3) is a polymer which contains a constituent unit expressed by Chemical Formula 17 given below and has the weight average molecular weight (Mw) of 500 to 10,000. Mw is preferably 600 to 5,000 and more preferably 700 to 3,000.

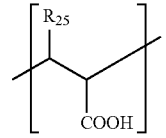

[Chemical Formula 17]

Here, $R_{25}$ is —H—$CH_3$ or —COOH, preferably —H or —COOH. It is also permissible that one (B-3) polymer each contains two or more types of constituent units expressed by Chemical Formula 14.

As preferable examples of (B-3) polymer, acrylic acid, maleic acid, acrylic acid and a polymer of a combination thereof can be cited, which is, however, free of any intention of restricting the scope of claims. Polyacrylic acid and a maleic acid/acrylic acid copolymer are more preferable examples.

In the case of copolymerization, random copolymerization or block copolymerization is preferable, and random copolymerization is more preferable.

The maleic acid/acrylic acid copolymer shown in Chemical Formula 18 will be described as an example. The copolymer is contained in (B-3) and has two types of constituent units expressed by Chemical Formula 14. In one constituent unit, $R_{25}$ is —H, and in the other constituent unit, $R_{25}$ is —COOH.

[Chemical Formula 18]

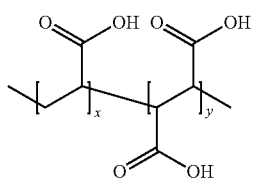

As a matter of course, the processing liquid may contain a combination of one or two or more of the above-described preferable examples as (B) first component. For example, (B) first component may contain both of 2,2-bis(4-hydroxyphenyl) propane and 3,6-dimethyl-4-octene-3,6-diol.

(B) first component may be 80 to 10,000 in molecular weight. The first component is preferably 90 to 50000 in molecular weight and more preferably 100 to 3000. In a case where (B) first component is a resin or a polymer, the molecular weight is expressed in terms of weight average molecular weight (Mw).

(B) first component is available by synthesis or purchase. A supplier includes Sigma-Aldrich, Tokyo Chemical Industry Co., Ltd., and Nippon Shokubai Co., Ltd.

(B) first component is contained preferably at 1 to 100 mass % in the processing liquid and more preferably at 1 to 50 mass %, as compared with the mass of (A) second component. (B) first component is contained further preferably at 1 to 30 mass % in the processing liquid, as compared with the mass of (A) second component.

<Solvent>

It is preferable that (C) solvent contains an organic solvent. (C) solvent may have volatility. Having volatility means that it is higher in volatility than water. For example, (C) solvent has preferably a boiling point of 50 to 250° C. at one atmosphere pressure. The solvent has more preferably 50 to 200° C. at one atmosphere pressure and has further preferably a boiling point of 60 to 170° C. The solvent has even further preferably a boiling point of 70 to 150° C. at one atmosphere pressure. It is permissible that (C) solvent contains a small quantity of pure water. Pure water is contained preferably at 30 mass % or less in (C) solvent, as compared with an entirety of (C) solvent. Pure water is contained more preferably at 20 mass % or less in the solvent and further preferably at 10 mass % or less. Pure water is contained even further preferably at 5 mass % or less in the solvent. That the solvent is free of pure water (0 mass %) is also one preferable mode. Pure water is preferably DIW.

As the organic solvent, alcohols such as isopropanol (IPA), etc.; ethylene glycol monoalkyl ethers such as ethylene glycol monomethyl ether, ethylene glycol monoethylether, etc.; ethylene glycol monoalkyl ether acetates such as ethylene glycol monomethyl ether acetate, ethylene glycol monoethyl ether acetate, etc.; propylene glycol monoalkyl ethers such as propylene glycol monomethyl ether (PGME), propylene glycol monoethyl ether (PGEE), etc.; propylene glycol monoalkyl ether acetates such as propylene glycol monomethyl ether acetate (PGMEA), propylene glycol-monoethyl ether acetate, etc.; lactic acid esters such as methyl lactate, ethyl lactate (EL), etc.; aromatic hydrocarbons such as toluene, xylene, etc.; ketones such as methyl ethyl ketone, 2-heptanone, cyclohexanone etc.; amides such as N,N-dimethylacetoamide, N-methylpyrrolidone, etc.; and lactones such as γ-butyrolactone, etc., can be cited. These organic solvents can be used solely or two or more of them can be used by being mixed.

As one preferable mode, the organic solvent contained by (C) solvent is selected from IPA, PGME, PGEE, EL, PGMEA and any combination of them. Where the organic solvent is a combination of two types of components, a volume ratio thereof is preferably 20:80 to 80:20 and more preferably 30:70 to 70:30.

As compared with an entire mass of the processing liquid, (C) solvent is 0.1 to 99.9 mass %. As compared with an entire mass of the processing liquid, (C) solvent is preferably 50 to 99.9 mass % and more preferably 75 to 99.5 mass %. As compared with an entire mass of the processing liquid, (C) solvent is further preferably 80 to 99 mass % and even further preferably 85 to 99 mass %.

<Other Additive>

The processing liquid of the present invention may further contain (D) other additives. As one mode of the present invention, (D) another additive contains surfactant, acid, base, antibacterial agent, bactericide, antiseptic, or antifungal agent (preferably surfactant). It may contain any one of these combinations.

As one mode of the present invention, as compared with a mass of (A) second component in the processing liquid, (D) other additive (a sum in the case of plural other additives) is 0 to 100 mass % (preferably 0 to 10 mass %, more preferably 0 to 5 mass %, further preferably 0 to 3 mass % and even further preferably 0 to 1 mass %). That the processing liquid contains no (D) other additive (0 mass %) is also one mode of the present invention.

<Peeling Liquid>

As described previously, the processing liquid is dropped on a substrate and dried to remove (C) solvent, so that (A) second component is formed into a film. Thereby, (A) second component remains as a processing film on the substrate together with (B) first component. Thereafter, the processing film (particle holding layer) is removed from the substrate by a removing liquid. The processing film is able to hold particles present on the substrate, and removed by the peeling liquid while holding the particles.

The peeling liquid may be alkaline, neutral or acid, and being alkaline is preferable. The peeling liquid is preferably 7 to 13 in pH. In detail, the peeling liquid is preferably 8 to 13 in pH, more preferably 10 to 13 in pH and further preferably 11 to 12.5 in pH. It is preferable that degassing is conducted on pH measurement in order to avoid influences resulting from dissolution of carbon dioxide in the air.

As specific examples of the peeling liquid, ammonia water, SC-1 cleaning solution, aqueous TMAH solution, aqueous choline solution and any combination of them can be cited (preferably ammonia water), which is, however, free of any intention of restricting the scope of claims. The solvent of the peeling liquid is substantially pure water. A percentage of pure water in relation to the solvent of the peeling liquid is 50 to 100 mass % (preferably 70 to 100 mass %, more preferably 90 to 100 mass %, further preferably 95 to 100 mass % and even further preferably 99 to 100 mass %). Concentrations of the solute of the peeling liquid are 0.1 to 10 mass % (preferably 0.2 to 8 mass %, more preferably 0.3 to 6 mass %). The alkaline component is added to the processing liquid, by which pure water (the concentration of the solute is 0.0 mass % and preferably 0.00 mass %) can be used in the peeling liquid.

Conditions of forming the processing film and conditions of peeling the processing film from a substrate can also be described as follows.

The processing liquid is made up of (A) second component, (B') crack promoting component (first component) and (C) solvent. The processing liquid of the present invention is dropped on a substrate and dried, so that (A) second component is formed into a film. (A) second component is formed into a film to form the processing film. Thereafter, the peeling liquid is supplied to the processing film, so that the crack promoting component is dissolved into the peeling liquid. The crack promoting component is dissolved into the peeling liquid to produce a mark (void hole) resulting from dissolution of the crack promoting component into the processing film. The mark promotes actions of peeling a particle layer from the substrate. A crack is widened, with the mark given as a starting point. The crack is widened, thus making it possible to remove the split processing film from the substrate, in a state where particles are held.

It is considered that when the peeling liquid removes (for example, peels) the processing film, (B) first component remaining on the film produces a portion which serves as the beginning of peeling the processing film. It is, therefore, preferable that (B) first component is higher in solubility in the peeling liquid than (A) second component. The processing film is preferably not completely dissolved by the peeling liquid but removed from the substrate, with particles held. It is considered that the processing film is removed in a state of being finely split, for example, by "the portion which serves as the beginning of peeling the processing film."

The present invention will be described by referring to the following various examples. It is noted that the processing liquid and the peeling liquid shall not be restricted only to these examples.

Provision of Patterned Substrate

A KrF resist composition (AZ DX-6270P, Merck Performance Materials Ltd., which will be hereinafter referred to as MPM) is dropped on an 8-inch Si substrate and spin-coated on the substrate at 1500 rpm. The substrate is soft-baked at 120° C. for 90 seconds. Then, the substrate is exposed at 20 mJ/cm$^2$ by using a KrF Stepper (FPA-3000 EX5, Canon) and subjected to PEB (post exposure bake) at 130° C. for 90 seconds and developed by using a developing fluid (AZ MIF-300, MPM). Thereby, a resist pattern, having a pitch 360 nm and a line space with a duty ratio of 1:1, is obtained. The same resist pattern is used as an etching mask to etch the substrate by a drying etching apparatus (NE-5000N, ULVAC). Thereafter, the substrate is cleaned by a stripper (AZ 400T, MPM) to peel the resist pattern and a resist residue. Thereby, a patterned substrate, with a pattern having a pitch, 360 nm; duty ratio, 1:1; and line height, 150 nm, is fabricated.

Provision of Bare Substrate.

An 8-inch Si substrate is used.

Preparation of Evaluation Substrate

Particles are attached to the pattern substrate and the bare substrate described above.

As experimental particles, ultra-high purity colloidal silica (PL-10H, Fuso Chemical Co., Ltd., average primary particle diameter: 90 nm) is used. A silica microparticle composition is dropped in a quantity of 50 mL and rotated at 500 rpm for 5 seconds to effect coating. Thereafter, the composition is rotated at 1000 rpm for 30 seconds to spin-dry a solvent of the silica microparticle composition. Thereby, an evaluation substrate is obtained.

Evaluation of Solubility

Each component to be used subsequently (for example, 2,2-bis(4-hydroxyphenyl) propane), 4 mg, is placed into a 50 mL-sample bottle, and 5.0 mass % ammonia water is added thereto to give a total quantity of 40 g. The bottle is capped, and shaken and agitated for 3 hours. Thereby, a solution with component concentration of 100 ppm is obtained. Similar procedures except that an added quantity of each component is changed to 40 mg are conducted to obtain a solution of 1,000 ppm.

The solubility of each of the components is visually confirmed. Evaluation criteria are as follows.

X: At component concentrations of 100 ppm and 1,000 ppm, a dissolved residue of the component concerned is confirmed. In this case, the component is judged to be insoluble or sparingly soluble.

Y: At a component concentration of 100 ppm, no dissolved residue is confirmed and at 1,000 ppm, a dissolved residue is confirmed. In this case, the component is judged to be slightly soluble.

Z: At component concentrations of 100 ppm and 1,000 ppm, no dissolved residue is confirmed. In this case, the component is judged to be soluble.

Evaluation results are filled in Table 1 to Table 4.

Preparation Example 1 of Cleaning Liquid 1

As (A) second component, novolac (Mw approximately 300) is used, and as (B) first component, 2,2-bis(4-hydroxyphenyl) propane is used.

2,2-bis(4-hydroxyphenyl) propane is weighed so as to give 5 mass % in relation to novolac (Mw approximately 300). They are taken so as to give a total quantity of 5 g and added to 95 g IPA ((C) solvent). The resultant is agitated for one hour by using a stirrer to obtain a solution having a solid component concentration of 5 mass %.

The thus obtained solution is filtered by Optimizer UPE (Entegris Japan, Inc. UPE, bore diameter, 10 nm). Thereby, a cleaning liquid 1 is obtained. The results are filled in Table 1.

In Table 1 to Table 4 given below, the number in the parentheses on (B) column means a concentration (mass %) of (B) first component in comparison with (A) second component.

TABLE 1

| | (A) | | (B) | | | Solid component | Removal evaluation | |
| | Component | Solubility | Component | Solubility | (C) | concentration | Patterned substrate | Bare substrate |
|---|---|---|---|---|---|---|---|---|
| Cleaning liquid 1 | A1 | X | B1 (5%) | Y | IPA | 5% | A | A |

TABLE 1-continued

|  | (A) | | (B) | | (C) | Solid component concentration | Removal evaluation | |
|---|---|---|---|---|---|---|---|---|
|  | Component | Solubility | Component | Solubility |  |  | Patterned substrate | Bare substrate |
| Cleaning liquid 2 | A2 | X | B1 (5%) | Y | IPA | 5% | AA | A |
| Cleaning liquid 3 | A3 | X | B1 (5%) | Y | IPA | 5% | AA | AA |
| Cleaning liquid 4 | A4 | X | B1 (5%) | Y | IPA | 5% | AA | AA |
| Cleaning liquid 5 | A5 | X | B1 (5%) | Y | IPA | 5% | A | AA |
| Cleaning liquid 6 | A6 | X | B1 (1%) | Y | IPA | 5% | A | A |
| Cleaning liquid 7 | A7 | X | B1 (5%) | Y | PGME | 5% | AA | AA |
| Cleaning liquid 8 | A8 | X | B1 (5%) | Y | PGME | 5% | AA | AA |
| Cleaning liquid 9 | A9 | X | B1 (5%) | Y | PGME | 5% | AA | AA |
| Cleaning liquid 10 | A10 | X | B1 (5%) | Y | PGME | 5% | AA | AA |
| Cleaning liquid 11 | A11 | X | B1 (5%) | Y | PGME | 5% | AA | AA |

TABLE 2

|  | (A) | | (B) | | (C) | Solid component concentration | Removal evaluation | |
|---|---|---|---|---|---|---|---|---|
|  | Component | Solubility | Component | Solubility |  |  | Patterned substrate | Bare substrate |
| Cleaning liquid 12 | A12 | X | B1 (0.10%) | Y | IPA:PGME = 1:1 | 5% | A | A |
| Cleaning liquid 13 | A12 | X | B1 (1%) | Y | IPA:PGME = 1:1 | 5% | AA | AA |
| Cleaning liquid 14 | A12 | X | B1 (5%) | Y | IPA:PGME = 1:1 | 5% | AA | AA |
| Cleaning liquid 15 | A12 | X | B1 (10%) | Y | IPA:PGME = 1:1 | 5% | AA | AA |
| Cleaning liquid 16 | A12 | X | B1 (50%) | Y | IPA:PGME = 1:1 | 5% | AA | AA |
| Cleaning liquid 17 | A12 | X | B1 (100%) | Y | IPA:PGME = 1:1 | 5% | A | A |
| Cleaning liquid 18 | A12 | X | B1 (5%) | Y | IPA:PGEE = 1:1 | 0.10% | A | A |
| Cleaning liquid 19 | A12 | X | B1 (5%) | Y | IPA:PGEE = 1:1 | 1% | AA | A |
| Cleaning liquid 20 | A12 | X | B1 (5%) | Y | IPA:PGEE = 1:1 | 10% | AA | AA |
| Cleaning liquid 21 | A12 | X | B1 (5%) | Y | IPA:PGEE = 1:1 | 30% | AA | A |
| Cleaning liquid 22 | A12 | X | B1 (5%) | Y | IPA:PGEE = 1:1 | 50% | AA | A |

TABLE 3

|  | (A) | | (B) | | (C) | Solid component concentration | Removal evaluation | |
|---|---|---|---|---|---|---|---|---|
|  | Component | Solubility | Component | Solubility |  |  | Patterned substrate | Bare substrate |
| Cleaning liquid 23 | A12 | X | B2 (5%) | Z | PGEE | 5% | A | AA |
| Cleaning liquid 24 | A12 | X | B3 (5%) | Z | PGEE | 5% | A | AA |

TABLE 3-continued

| | (A) | | (B) | | | Solid component | Removal evaluation | |
|---|---|---|---|---|---|---|---|---|
| | Component | Solubility | Component | Solubility | (C) | concentration | Patterned substrate | Bare substrate |
| Cleaning liquid 25 | A12 | X | B4 (5%) | Y | PGEE | 5% | AA | AA |
| Cleaning liquid 26 | A12 | X | B5 (5%) | Z | PGEE | 5% | AA | AA |
| Cleaning liquid 27 | A12 | X | B6 (5%) | Y | PGEE | 5% | AA | AA |
| Cleaning liquid 28 | A12 | X | B7 (5%) | Y | EL | 5% | AA | AA |
| Cleaning liquid 29 | A12 | X | B8 (5%) | Z | EL | 5% | AA | AA |
| Cleaning liquid 30 | A12 | X | B9 (5%) | Z | EL | 5% | AA | AA |
| Cleaning liquid 31 | A12 | X | B10 (5%) | Z | EL | 5% | AA | AA |
| Cleaning liquid 32 | A12 | X | B11 (5%) | Z | IPA:DIW = 1:2 | 5% | AA | A |
| Cleaning liquid 33 | A12 | X | B12 (5%) | Z | IPA:DIW = 1:2 | 5% | AA | A |

TABLE 4

| | (A) | | (B) | | | Solid component | Removal evaluation | |
|---|---|---|---|---|---|---|---|---|
| | Component | Solubility | Component | Solubility | (C) | concentration | Patterned substrate | Bare substrate |
| Comparison cleaning liquid 1 | A12 | X | — | — | IPA | 5% | B | D |
| Comparison cleaning liquid 2 | — | — | B4 | Y | IPA | 5% | C | C |
| Comparison cleaning liquid 3 | A12 | X | B13 (5%) | X | IPA | 5% | D | D |
| Comparison cleaning liquid 4 | A13 | Z | B11 (5%) | Z | IPA:DIW = 1:2 | 5% | B | B |
| Comparison cleaning liquid 5 | A14 | Z | B11 (5%) | Z | IPA:DIW = 1:2 | 5% | C | C |
| Comparison cleaning liquid 6 | A15 | Z | B3 (5%) | Z | IPA:DIW = 1:2 | 5% | C | C |
| Comparison cleaning liquid 7 | A16 | Z | B3 (5%) | Z | IPA:DIW = 1:2 | 5% | C | C |

In the above tables, the following abbreviation is made.

Novolac (Mw approximately 300) is abbreviated as A1,
Novolac (Mw approximately 500), as A2,
Novolac (Mw approximately 1,000), as A3,
Novolac (Mw approximately 10,000), as A4,
Novolac (Mw approximately 100,000), as A5,
Novolac (Mw approximately 500,000), as A6,
Phenol novolac (Mw approximately 5,000), as A7,
Polyhydroxystyrene (Mw approximately 5,000), as A8,
Polyacrylic acid butyl having a structure shown in Chemical Formula 19 given below (Mw approximately 60,000, Sigma-Aldrich), as A9,

[Chemical Formula 19]

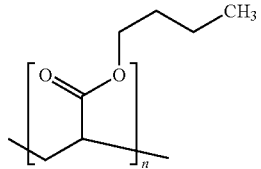

Polycarbonate (Mw approximately 5,000), as A10,
4,4'-dihydroxytetraphenylmethane (Mw352), as A11,
Novolac (Mw approximately 5,000), as A12,
Polyfluoroalkyl acid (TAR-015, Daikin Industries Ltd.), as A13, KF-351A (silicon-containing polyester modified polymer, Shin-Etsu Chemical Co., Ltd.), as A14,
Polyvinylimidazole (Mw approximately 5,000), as A15,
Polyallylamine (Mw approximately 5,000), as A16,
2,2-bis(4-hydroxyphenyl) propane, as B1,
1,1,2,2-tetrakis (4-hydroxyphenyl) ethane, as B2,
1,3-cyclohexanediol, as B3,
2,6-bis[(2-hydroxy-5-methylphenyl)methyl]-4-methylphenol, as B4,
2,2'-methylenebis(4-methylphenol), as B5,
4,4'-dihydroxybiphenyl, as B6,
2,6-naphthalenediol, as B7,
2,5-dimethyl-3-hexene-2,5-diol, as B8,
3,6-dimethyl-4-octene-3,6-diol, as B9,
2,5-di-tert-butylhydroquinone, as B10,
Polyacrylic acid (Mw approximately 1,000), as B11, Maleic acid/acrylic acid copolymer (Mw approximately 3,000) having a structure shown in Chemical Formula 20 given below, as B12,

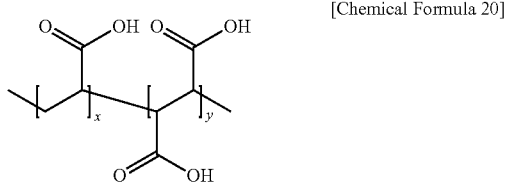

[Chemical Formula 20]

Novolac (Mw approximately 15,000), as B13.

Comparison Preparation Example 1 of Comparison Cleaning Liquid 1

Preparation is done in the same manner as the preparation example 1 except that A12 is taken in a quantity of 5 g and added to 95 g IPA ((C) solvent) to obtain a comparison cleaning liquid 1. The results are filled in Table 4.

Comparison Preparation Example 2 of Comparison Cleaning Liquid 2

Preparation is done in the same manner as the preparation example 1 except that B4 is taken in a quantity of 5 g and added to 95 g IPA((C) solvent) to obtain a comparison cleaning liquid 2. The results are filled in Table 4.

Preparation Examples 2 to 33 of Cleaning Liquids 2 to 33 and Comparison Preparation Examples 3 to 7 of Comparison Cleaning Liquids 3 to 7

Cleaning liquids 2 to 33 and comparison cleaning liquids 3 to 7 are prepared in the same manner as the preparation example 1, except that (A) second component, (B) first component, (C) solvent and concentrations are changed to those described in Table 1 to Table 4. The results are filled in Table 1 to Table 4.

Evaluation of Residual Particle Amounts in Cleaning Liquids 1 to 33 and Comparison Cleaning Liquids 1 to 7

An evaluation substrate is used which is prepared as described in the preparation of the above-described evaluation substrate.

Each processing liquid is dropped on each evaluation substrate in a quantity of 10 cc by using a Coater-Developer RF3 (SOKUDO Ltd.) and rotated at 1,500 rpm for 60 seconds, thereby effecting coating and drying. While the substrate is rotated at 100 rpm, 5.0 mass % ammonia water is dropped for 10 seconds to cover an entirety of the substrate with 5.0 mass % ammonia water. This state is kept for 20 seconds. The substrate is rotated at 1,500 rpm to peel and remove a film, and the substrate is dried.

Residual particle amounts of these substrates are compared. A bright field defect inspection apparatus (U Vision 4, AMAT Ltd.) is used in evaluating the pattern substrate, and a dark field defect inspection apparatus (LS-9110, Hitachi High-Technologies Corporation) is used in evaluating the bare substrate.

Coating situations and film removing situations are confirmed to count remaining numbers of particles. An evaluation is made by referring to the following criteria to fill the evaluation results in Table 1 to Table 4.
AA: ≤10 particles
A: >10 particles, ≤100 particles
B: >100 particles, ≤1,000 particles
C: >1000 particles
D: No film is uniformly coated or removed.

The comparison cleaning liquids 1 to 7 are free of a plurality of components different in degree of solubility. As compared with the comparison cleaning liquids 1 to 7, substrates cleaned with the cleaning liquids 1 to 33 are confirmed to be smaller in residual particle amount.

In the present Specification, unless restrictedly mentioned otherwise, the singular form includes the plural form and signifies "one of," "the," and "at least one of." Unless mentioned otherwise, an element of a concept is capable of being expressed in a plurality of types and when an amount (for example, mass % or mole %) thereof is indicated, the amount signifies the sum of the plurality of types.

"And/or" includes all combinations of the elements and includes use of each singular element.

In the present Specification, when a numerical range is indicated using "to", "~" or "-." unless restrictedly mentioned otherwise, both endpoints are included and the units are the same. For example, 5 to 25 mole % signifies not less than 5 mole % and not more than 25 mole %.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A substrate processing method comprising: a processing liquid supplying step of supplying a processing liquid which has a solute and a solvent to a front surface of a substrate; a processing film forming step of solidifying or curing the processing liquid supplied to the front surface of the substrate to form on the front surface of the substrate a processing film which holds a removal object present on the front surface of the substrate; and a peeling step of supplying a peeling liquid to the front surface of the substrate to peel the processing film from the front surface of the substrate together with the removal object, wherein the peeling step includes a penetrating hole forming step of dissolving partially the processing film in the peeling liquid to form a penetrating hole on the processing film, wherein the solute of the processing liquid has a first component and a second component which is lower in solubility in the peeling liquid than the first component, the processing film forming step includes a step of forming the processing film which has a first solid formed by the first component and a second solid formed by the second component, and the penetrating hole forming step includes a step of dissolving the first solid by the peeling liquid to form the penetrating hole on the processing film.

2. The substrate processing method according to claim 1, wherein the peeling step includes a peeling liquid entry step of entering the peeling liquid between the processing film and the front surface of the substrate via the penetrating hole.

3. The substrate processing method according to claim 1, wherein the contained amount of the second component in the processing liquid is larger than the contained amount of the first component in the processing liquid.

4. The substrate processing method according to claim 1, wherein the contained amount of the second component in the processing liquid is smaller than the contained amount of the first component in the processing liquid.

5. The substrate processing method according to claim 1, wherein the solute further includes a third component higher in degree of solubility in the peeling liquid than the second component and lower in degree of solubility in the peeling liquid than the first component, and
the processing film forming step includes a step of forming the processing film which has a third solid formed by the third component at least at a portion adjacent to the front surface of the substrate.

6. The substrate processing method according to claim 1, further comprising: a preprocessing liquid supplying step of supplying to the front surface of the substrate a preprocessing liquid which contains a solute having a third component higher in degree of solubility in the peeling liquid than the second component and lower in degree of solubility in the peeling liquid than the first component before supply of the processing liquid to the front surface of the substrate,
wherein the processing film forming step includes a step of forming the processing film which has a third solid formed by the third component at least at a portion adjacent to the front surface of the substrate.

7. The substrate processing method according to claim 1, further comprising: a preprocessing liquid supplying step of supplying to the front surface of the substrate a preprocessing liquid which contains a solute having a third component higher in degree of solubility in the peeling liquid than the second component and lower in degree of solubility in the peeling liquid than the first component before supply of the processing liquid to the front surface of the substrate; and a preprocessing film forming step of solidifying or curing the preprocessing liquid before supply of the processing liquid to the front surface of the substrate to form a preprocessing film formed by the third component on the front surface of the substrate, wherein the peeling step includes a step of supplying the peeling liquid to the front surface of the substrate to peel the processing film and the preprocessing film from the front surface of the substrate together with the removal object.

8. The substrate processing method according to claim 1, wherein the second component contains at least any one of novolac, polyhydroxystyrene, polystyrene, a polyacrylic acid derivative, a polymaleic acid derivative, polycarbonate, a polyvinyl alcohol derivative, a polmethacrylic acid derivative and a copolymer of a combination thereof.

9. The substrate processing method according to claim 1, wherein the first component is a crack promoting component, and
the crack promoting component contains hydrocarbon and a hydroxy group and/or a carbonyl group.

10. The substrate processing method according to claim 1, wherein the first component is expressed by at least any one of (B-1), (B-2) and (B-3) given below;
(B-1) is a compound which contains 1 to 6 of constituent units expressed by Chemical Formula 1 and in which each of the constituent units is bonded by a linking group $L_1$,

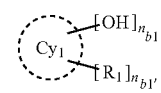

[Chemical Formula 1]

here, $L_1$ is selected at least from a single bond and any one of $C_{1\sim6}$ alkylene, $Cy_1$ is a hydrocarbon ring of $C_{5\sim30}$, $R_1$ is each independently $C_{1\sim5}$ alkyl, $n_{b1}$ is 1, 2 or 3, and $n_{b1'}$ is 0, 1, 2, 3 or 4;
(B-2) is a compound expressed by Chemical Formula 2,

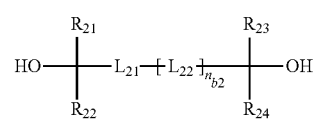

[Chemical Formula 2]

here, $R_{21}$, $R_{22}$, $R_{23}$ and $R_{24}$ are each independently hydrogen or $C_{1\sim5}$ alkyl, $L_{21}$ and $L_{22}$ are each independently $C_{1\sim20}$ alkylene, $C_{1\sim20}$ cycloalkylene, $C_{2\sim4}$ alkenylene, $C_{2\sim4}$ alkynylene or $C_{6\sim20}$ arylene, these groups may be substituted by $C_{1\sim5}$ alkyl or hydroxyl, and $n_{b2}$ is 0, 1 or 2; and
(B-3) is a polymer which contains a constituent unit expressed by Chemical Formula 3 and has the weight average molecular weight (Mw) of 500 to 10,000,

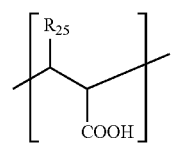

[Chemical Formula 3]

$R_{25}$ is —H—$CH_3$ or —COOH.

11. The substrate processing method according to claim 1, wherein the solubility of the second component in 5.0 mass % ammonia water is less than 100 ppm and the solubility of the first component in 5.0 mass % ammonia water is 100 ppm or more.

12. The substrate processing method according to claim 1, wherein the mass of the second component is 0.1 to 50 mass %, as compared with an entire mass of the processing liquid.

13. The substrate processing method according to claim 1, wherein the weight average molecular weight (Mw) of the second component is 150 to 500,000.

14. The substrate processing method according to claim 1, wherein the first component and the second component are a synthetic resin.

15. The substrate processing method according to claim 1, wherein the processing liquid supplying step includes a liquid film forming step of forming a liquid film of the processing liquid on the front surface of the substrate held horizontally, and the method further comprises a film thinning step of rotating the substrate around a vertical axis passing through a central portion of the substrate to eliminate the processing liquid from the front surface of the substrate and to thin the liquid film.

16. The substrate processing method according to claim 1, wherein the processing film forming step includes a step of forming the processing film in which the solvent remains in the interior of the processing film.

17. The substrate processing method according to claim 1, wherein the processing film forming step includes a solvent evaporating step of evaporating the solvent from the processing liquid supplied to the front surface of the substrate.

* * * * *

UNITED STATES PATENT AND TRADEMARK OFFICE
CERTIFICATE OF CORRECTION

PATENT NO. : 10,792,712 B2  
APPLICATION NO. : 16/426115  
DATED : October 6, 2020  
INVENTOR(S) : Yoshida et al.

Page 1 of 1

It is certified that error appears in the above-identified patent and that said Letters Patent is hereby corrected as shown below:

On the Title Page

(73) Assignee should read as:  
SCREEN Holdings Co., Ltd. (JP) and  
Merck Patent GmbH (DE)

Signed and Sealed this  
Nineteenth Day of January, 2021

Andrei Iancu  
*Director of the United States Patent and Trademark Office*